United States Patent
Terzioglu et al.

(10) Patent No.: US 7,177,225 B2
(45) Date of Patent: *Feb. 13, 2007

(54) BLOCK REDUNDANCY IMPLEMENTATION IN HEIRARCHICAL RAM'S

(75) Inventors: Esin Terzioglu, Aliso Viejo, CA (US); Gil I. Winograd, Aliso Viejo, CA (US); Cyrus Afghahi, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/729,405

(22) Filed: Dec. 5, 2003

(65) Prior Publication Data

US 2004/0120202 A1 Jun. 24, 2004

Related U.S. Application Data

(63) Continuation of application No. 10/176,843, filed on Jun. 21, 2002, now Pat. No. 6,714,467, which is a continuation-in-part of application No. 10/100,757, filed on Mar. 19, 2002, now Pat. No. 6,646,954, which is a continuation-in-part of application No. 09/775,701, filed on Feb. 2, 2001, now Pat. No. 6,411,557.

(51) Int. Cl.
*G11C 11/00* (2006.01)

(52) U.S. Cl. ............. 365/230.06; 365/200; 365/239; 365/240; 365/230.03

(58) Field of Classification Search ........... 365/230.06, 365/200, 239, 240, 230.03
See application file for complete search history.

(56) References Cited

U.S. PATENT DOCUMENTS

| | | | | |
|---|---|---|---|---|
| 5,124,948 A | * | 6/1992 | Takizawa et al. | 365/200 |
| 5,243,570 A | * | 9/1993 | Saruwatari | 365/201 |
| 5,349,558 A | * | 9/1994 | Cleveland et al. | 365/200 |
| 5,475,640 A | * | 12/1995 | Kersh et al. | 365/200 |
| 5,642,316 A | * | 6/1997 | Tran et al. | 365/200 |
| 5,669,306 A | * | 9/1997 | Puschnerat | 365/200 |
| 5,787,046 A | * | 7/1998 | Furuyama et al. | 365/230.3 |
| 5,796,662 A | * | 8/1998 | Kalter et al. | 365/200 |
| 5,822,268 A | | 10/1998 | Kirihata | 365/230.03 |
| 5,841,712 A | * | 11/1998 | Wendell et al. | 365/200 |
| 5,889,725 A | * | 3/1999 | Aikawa et al. | 365/230.6 |

(Continued)

FOREIGN PATENT DOCUMENTS

JP 402021490 A * 1/1990

*Primary Examiner*—Viet Q. Nguyen
(74) *Attorney, Agent, or Firm*—McAndrews, Held & Malloy Ltd.

(57) ABSTRACT

The present invention relates to a system and method for providing redundancy in a hierarchically memory, by replacing small blocks in such memory. The present invention provides such redundancy (i.e., replaces such small blocks) by either shifting predecoded lines or using a modified shifting predecoder circuit in the local predecoder block. In one embodiment, the hierarchal memory structure includes at least one redundant predecoder adapted to be shifted in for at least one active predecoder of a plurality of predecoders adapted to be shifted out.

30 Claims, 40 Drawing Sheets

U.S. PATENT DOCUMENTS

| | | | |
|---|---|---|---|
| 5,953,267 A * | 9/1999 | Oh | 365/200 |
| 5,959,907 A * | 9/1999 | Kim et al. | 365/200 |
| 6,100,748 A * | 8/2000 | Oh | 357/526 |
| 6,397,313 B1 * | 5/2002 | Kasa et al. | 711/168 |
| 6,411,557 B2 | 6/2002 | Terzioglu et al. | 365/200 |
| 6,424,554 B1 | 7/2002 | Kawasumi | 365/63 |
| 6,462,993 B2 | 10/2002 | Shinozaki et al. | 365/200 |
| 6,532,181 B2 | 3/2003 | Saito et al. | 365/200 |
| 6,611,445 B2 * | 8/2003 | Kanazawa et al. | 365/49 |
| 6,665,220 B2 * | 12/2003 | Vlasenko | 365/200 |
| 6,714,467 B2 * | 3/2004 | Terzioglu et al. | 365/200 |
| 6,731,560 B2 * | 5/2004 | Yoon et al. | 365/222 |
| 6,741,509 B2 * | 5/2004 | Kato et al. | 365/200 |
| 6,765,832 B1 * | 7/2004 | Ohtani | 365/200 |

* cited by examiner

300A

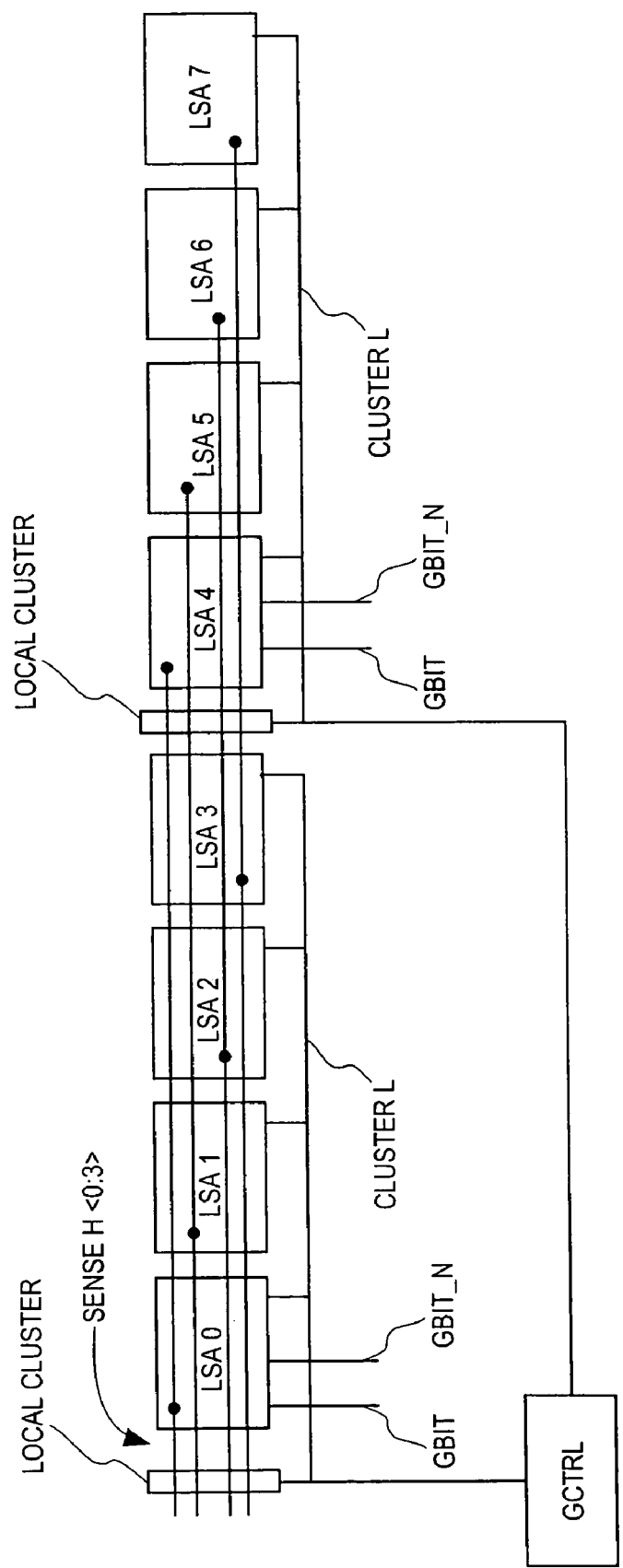

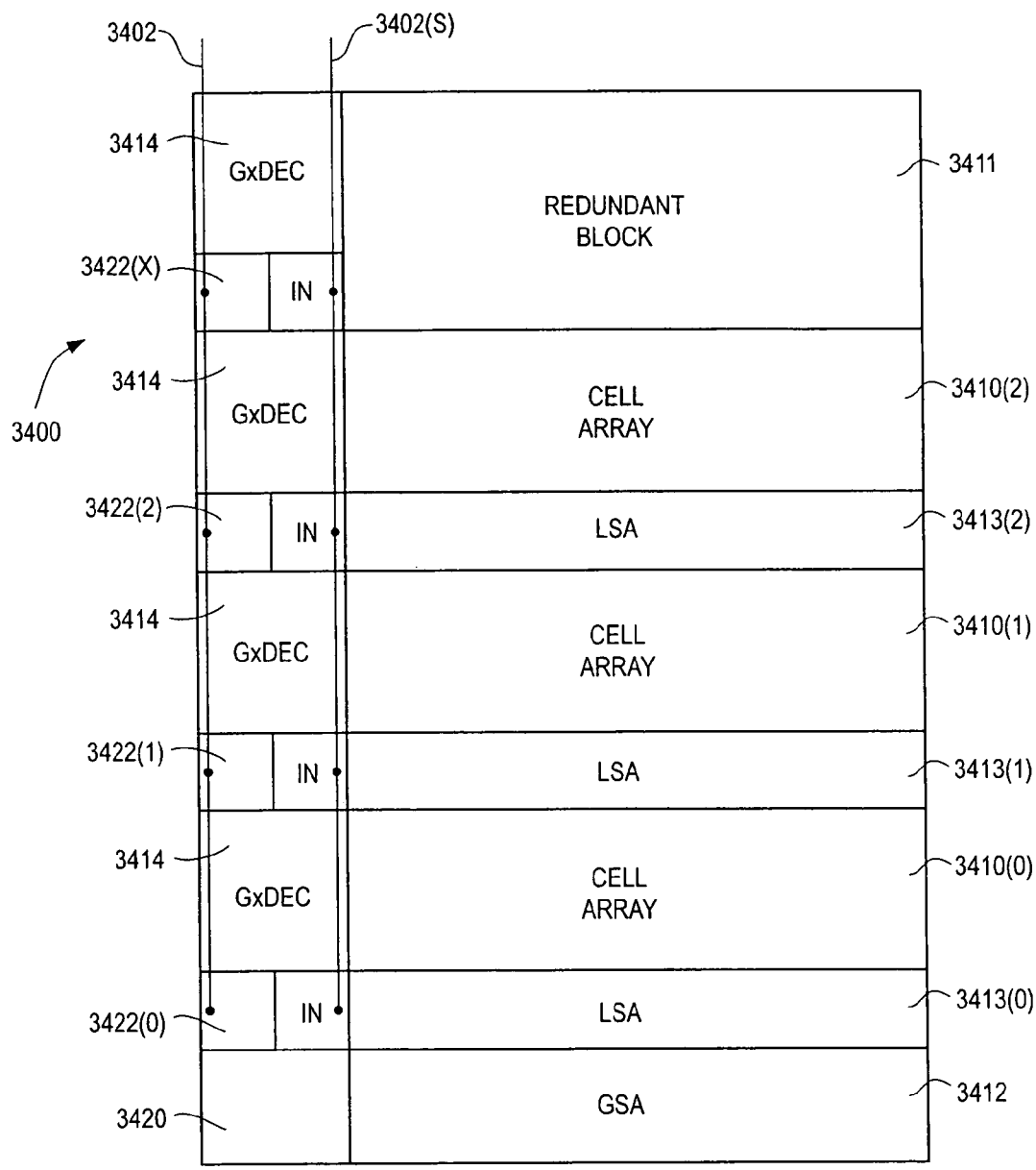

BLOCK REDUNDANCY IMPLEMENTATION IN HEIRARCHICAL RAM'S

CROSS REFERENCE TO RELATED APPLICATIONS

This application is a continuation of U.S. application Ser. No. 10/176,843 filed Jun. 21, 2002, now U.S. Pat. No. 6,714,467 which is a continuation-in-part of, and claims benefit of and priority from, U.S. application Ser. No. 10/100,757 filed Mar. 19, 2002, titled "Synchronous Controlled, Self-timed Local SRAM Block", now U.S. Pat. No. 6,646,954 issued Nov. 11, 2003, which is a continuation-in-part of U.S. application Ser. No. 09/775,701, filed Feb. 2, 2001, now U.S. Pat. No. 6,411,557, issued Jun. 25, 2002, the complete subject matter of each of which is incorporated herein by reference in their entirety.

FEDERALLY SPONSORED RESEARCH OR DEVELOPMENT

[Not Applicable]

BACKGROUND OF THE INVENTION

One embodiment of the present invention relates to a programmable device for increasing memory cell and memory architecture design yield. More specifically, one embodiment of the present invention relates to block redundancy adapted to increase design yield in memory architecture.

Memory architectures typically balance power and device area against speed. High-performance memory architectures place a severe strain on the power and area budgets of the associated systems, particularly where such components are embedded within a VLSI system, such as a digital signal processing system for example. Therefore, it is highly desirable to provide memory architectures that are fast, yet power- and area-efficient.

Highly integrated, high performance components, such as memory cells for example, require complex fabrication and manufacturing processes. These processes may experience unavoidable parameter variations which may impose physical defects upon the units being produced, or may exploit design vulnerabilities to the extent of rendering the affected units unusable, or substandard.

In memory architectures, redundancy may be important, as a fabrication flaw or operational failure in the memory architecture may result in the failure of that system. Likewise, process invariant features may be needed to insure that the internal operations of the architecture conform to precise timing and parameter specifications. Lacking redundancy and process invariant features, the actual manufacturing yield for particular memory architecture may be unacceptably low.

Low-yield memory architectures are particularly unacceptable when embedded within more complex systems, which inherently have more fabrication and manufacturing vulnerabilities. A higher manufacturing yield of the memory cells may translate into a lower per-unit cost, while a robust design may translate into reliable products having lower operational costs. Thus, it is highly desirable to design components having redundancy and process invariant features wherever possible.

The aforementioned redundancy aspects of the present invention may can render the hierarchical memory structure less susceptible to incapacitation by defects during fabrication or operation, advantageously providing a memory product that is at once more manufacturable, cost-efficient, and operationally more robust.

Further limitations and disadvantages of conventional and traditional approaches will become apparent to one of skill in the art, through comparison of such systems with the present invention as set forth in the remainder of the present application with reference to the drawings.

SUMMARY OF THE INVENTION

The present invention relates to a system and method for providing redundancy in a hierarchically partitioned memory, by replacing small blocks in such memory for example. One embodiment provides such redundancy (i.e., replaces such small blocks) by either shifting predecoded lines or using a modified shifting predecoder circuit in the local predecoder block. Such block redundancy scheme, in accordance with the present invention, does not incur excessive access time or area overhead penalties, making it attractive where the memory subblock size is small.

One embodiment of the present invention provides a hierarchal memory structure, comprising at least one active predecoder adapted to be shifted out and at least one redundant predecoder adapted to be shifted in.

One embodiment of the present invention relates to a hierarchical memory structure comprising a synchronously controlled global element, a self-timed local element, and one or more predecoders. In one embodiment, the local element is adapted to interface with the synchronously controlled global element. In such embodiment, at least one predecoder is adapted to fire for current predecoding and at least one predecoder is adapted to fire for previous predecoding. It is further contemplated that a redundant block is adapted to communicate with at least one predecoder.

Another embodiment of the present invention provides a predecoder block used with a hierarchical memory structure, comprising a plurality of active predecoder adapted to fire for current predecoding and at least one redundant predecoder adapted to fire for previous predecoding. The structure further includes a plurality of higher address predecoded lines and a plurality of lower address predecoded lines, wherein one higher address predecoded line is coupled to all the lower address predecoded lines. At least one shift pointer is included, adapted to shift in the redundant predecoder.

Yet another embodiment of the present invention provides a predecoder block used with a hierarchical memory structure. The memory structure comprises at least one current predecoder adapted to fire for current address mapping, at least one redundant predecoder adapted to fire for previous address mapping; and shift circuitry adapted to shift the active predecoder out and the redundant predecoder in.

Yet another embodiment relates to a method of providing redundancy in a memory structure. In this embodiment, the method comprises shifting out a first predecoder block; and shifting in a second predecoder block. It is further contemplated that shifting predecoded lines and shifting circuitry may be coupled to the first and second predecoder blocks.

Other aspects, advantages and novel features of the present invention, as well as details of an illustrated embodiment thereof, will be more fully understood from the following description and drawing, wherein like numerals refer to like parts.

BRIEF DESCRIPTION OF SEVERAL VIEWS OF THE DRAWINGS

FIG. 22C illustrates one example of 32:1 muxing (including 8:1 global muxing and 4:1 local muxing) in accordance with one embodiment of the present invention;

FIGS. 33A, 33B & 33C illustrate block diagrams of a redundant local predecoder block similar to that illustrated in FIG. 32 in relationship to a memory architecture in accordance with one embodiment of the present invention.

DETAILED DESCRIPTION OF THE INVENTION

As will be understood by one skilled in the art, most VLSI systems, including communications systems and DSP devices, contain VLSI memory subsystems. Modern applications of VLSI memory subsystems almost invariably demand high efficiency, high performance implementations that magnify the design tradeoffs between layout efficiency, speed, power consumption, scalability, design tolerances, and the like. The present invention ameliorates these tradeoffs using a novel synchronous, self-timed hierarchical architecture. The memory module of the present invention also may employ one or more novel components, which further add to the memory module's efficiency and robustness.

It should be appreciated that it is useful to describe the various aspects and embodiments of the invention herein in the context of an SRAM memory structure, using CMOS SRAM memory cells. However, it should be further appreciated by those skilled in the art the present invention is not limited to CMOS-based processes and that these aspects and embodiments may be used in memory products other than a SRAM memory structure, including without limitation, DRAM, ROM, PLA, and the like, whether embedded within a VLSI system, or stand alone memory devices.

Exemplary SRAM Module

Figure 1:
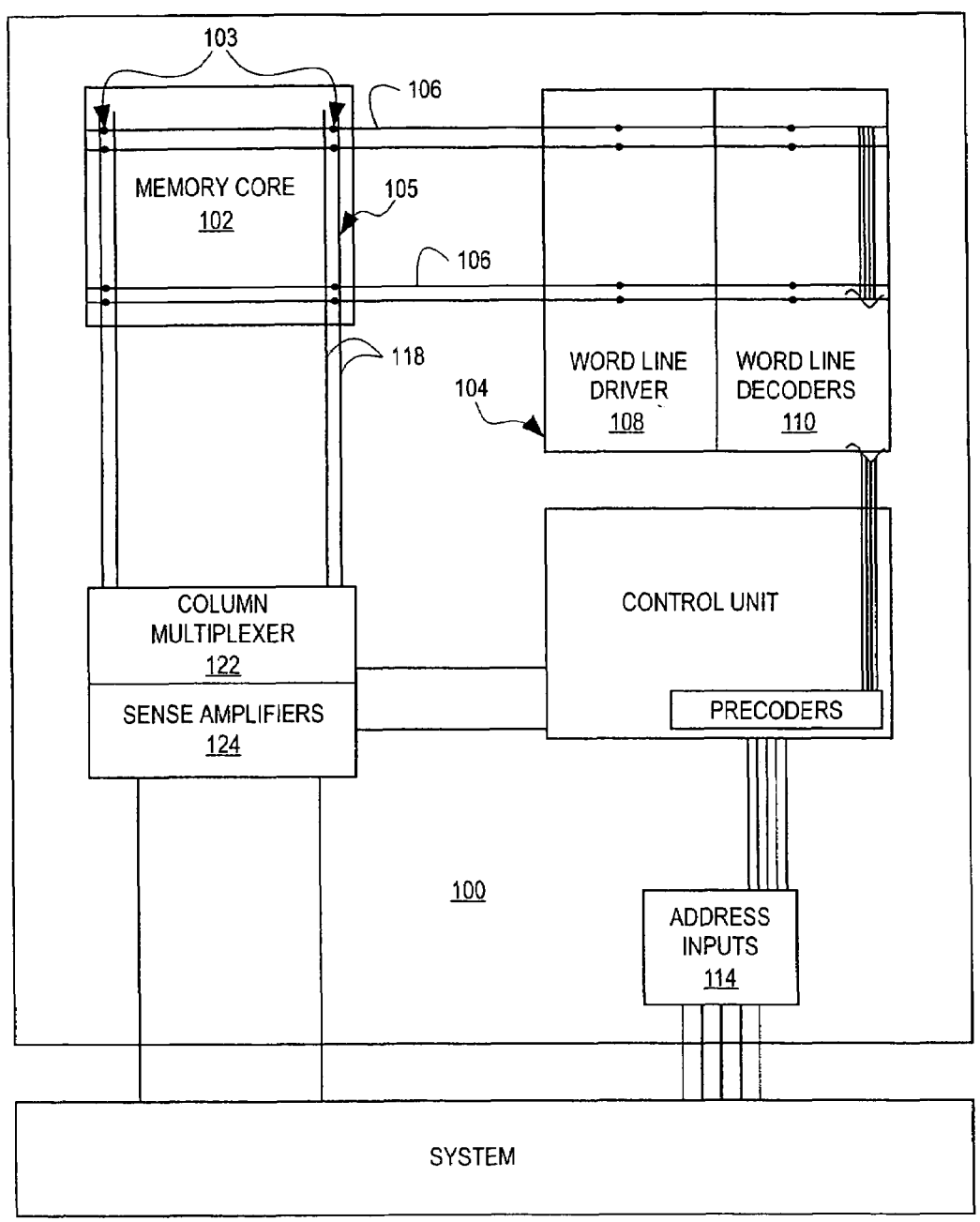
FIG. 1 illustrates a block diagram of an exemplary SRAM module.

FIG. 1 illustrates a functional block diagram of one example of a SRAM memory structure 100 providing the basic features of SRAM subsystems. Module 100 includes memory core 102, word line controller 104, and memory address inputs 114. In this exemplary embodiment, memory core 102 is composed of a two-dimensional array of K-bits of memory cells 103, arranged to have C columns and R rows of bit storage locations, where K=[C×R]. The most common configuration of memory core 102 uses single word lines 106 to connect cells 103 onto paired differential bitlines 118. In general, core 102 is arranged as an array of $2^P$ entries based on a set of P memory address in. Thus, the p-bit address is decoded by row address decoder 110 and column address decoder 122. Access to a given memory cell 103 within such a single-core memory 102 is accomplished by activating the column 105 by selecting bitline in the column corresponding to cell 103.

The particular row to be accessed is chosen by selective activation of row address or wordline decoder 110, which usually corresponds uniquely with a given row, or word line, spanning all cells 103 in that particular row. Also, word line driver 108 can drive a selected word line 106 such that selected memory cell 103 can be written into or read out on a particular pair of bitlines 118, according to the bit address supplied to memory address inputs 114.

Bitline controller 116 may include precharge cells (not shown), column multiplexers or decoders 122, sense amplifiers 124, and input/output buffers (not shown). Because different READ/WRITE schemes are typically used for memory cells, it is desirable that bitlines be placed in a well-defined state before being accessed. Precharge cells may be used to set up the state of bitlines 118, through a PRECHARGE cycle according to a predefined precharging scheme. In a static precharging scheme, precharge cells may be left continuously on except when accessing a particular block.

In addition to establishing a defined state on bitlines 118, precharging cells can also be used to effect equalization of differential voltages on bitlines 118 prior to a READ operation. Sense amplifiers 124 enable the size of memory cell 103 to be reduced by sensing the differential voltage on bitlines 118, which is indicative of its state, translating that differential voltage into a logic-lever signal.

In the exemplary embodiment, a READ operation is performed by enabling row decoder 110, which selects a particular row. The charge on one of the bitlines 118 from each pair of bitlines on each column will discharge through the enabled memory cell 103, representing the state of the active cells 103 on that column 105. Column decoder 122 enables only one of the columns, connecting bitlines 118 to an output. Sense amplifiers 124 provide the driving capability to source current to the output including input/output buffers. When sense amplifier 124 is enabled, the unbalanced bitlines 118 will cause the balanced sense amplifier to trip toward the state of the bitlines, and data will be output.

In general, a WRITE operation is performed by applying data to an input including I/O buffers (not shown). Prior to the WRITE operation, bitlines 118 may be precharged to a predetermined value by precharge cells. The application of input data to the inputs tend to discharge the precharge voltage on one of the bitlines 118, leaving one bitline logic HIGH and one bitline logic LOW. Column decoder 122 selects a particular column 105, connecting bitlines 118 to the input, thereby discharging one of the bitlines 118. The row decoder 110 selects a particular row, and the information on bitlines 118 will be written into cell 103 at the intersection of column 105 and row 106.

At the beginning of a typical internal timing cycle, precharging is disabled. The precharging is not enabled again until the entire operation is completed. Column decoder 122 and row decoder 110 are then activated, followed by the activation of sense amplifier 124. At the conclusion of a READ or a WRITE operation, sense amplifier 124 is deactivated. This is followed by disabling decoders 110, 122, at which time precharge cells 120 become active again during a subsequent PRECHARGE cycle.

Power Reduction and Speed Improvement

In reference to FIG. 1, the content of memory cell 103 of memory block 100 is detected in sense amplifier 124, using a differential line between the paired bitlines 118. It should be appreciated that this architecture is not scalable. Also, increasing the memory block 100 may exceed the practical limitations of the sense amplifiers 124 to receive an adequate signal in a timely fashion at the bitlines 118. Increasing the length of bitlines 118 increases the associated bitline capacitance and, thus, increases the time needed for a voltage to develop thereon. More power must be supplied to lines 104, 106 to overcome the additional capacitance.

In addition, it takes longer to precharge long bitlines under the architectures of the existing art, thereby reducing the effective device speed. Similarly, writing to longer bitlines 118, as found in the existing art, requires more extensive current. This increases the power demands of the circuit, as well as reducing the effective device speed.

In general, reduced power consumption in memory devices such as structure 100 in FIG. 1 can be accomplished by, for example, reducing total switched capacitance, and minimizing voltage swings. The advantages of the power reduction aspects of certain embodiments of the present invention can further be appreciated with the context of switched capacitance reduction and voltage swing limitation.

Switched Capacitance Reduction

As the bit density of memory structures increases, it has been observed that single-core memory structures may have unacceptably large switching capacitances associated with each memory access. Access to any bit location within such a single-core memory necessitates enabling the entire row, or word line 106, in which the datum is stored, and switching all bitlines 118 in the structure. Therefore, it is desirable to design high-performance memory structures to reduce the total switched capacitance during any given access.

Two well-known approaches for reducing total switched capacitance during a memory structure access include dividing a single-core memory structure into a banked memory structure, and employing divided word line structures. In the former approach, it is necessary to activate only the particular memory bank associated with the memory cell of interest. In the latter approach, localizing word line activation to the greatest practicable extent reduces total switched capacitance.

Divided or Banked Memory Core

Figure 2:
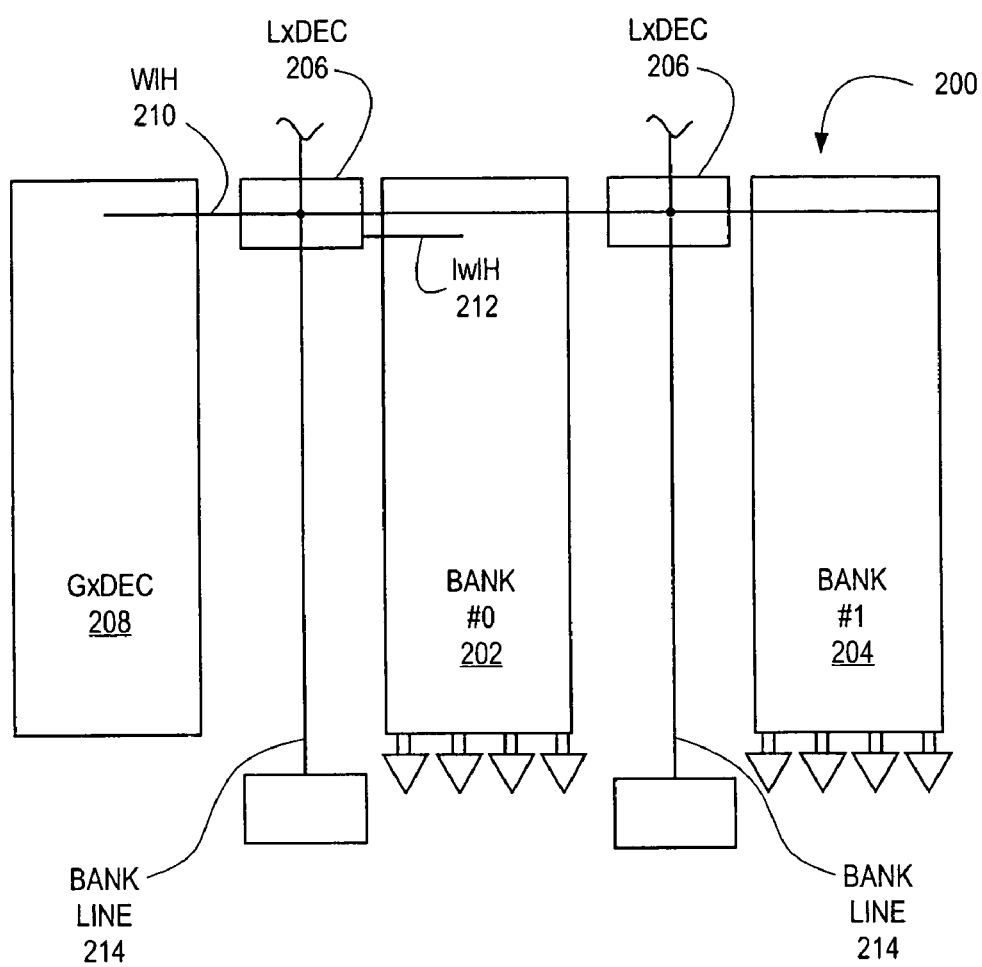
FIG. 2 illustrates a block diagram of a SRAM memory core divided into banks.

One approach to reducing switching capacitances is to divide the memory core into separately switchable banks of memory cells. One example of a memory core 200 divided into banks is illustrated in FIG. 2. In the illustrated embodiment, the memory core includes two banks of memory cells, bank #0 and bank #1, generally designated 202 and 204 respectively. The memory core 200 includes two local decoders 206 that are communicatively coupled to each other and a global decoder 208 via world line High 210. Each local decoder 206 includes a local word line High 210 that communicatively couples the decoder 206 to its associated bank. Additionally, two bank lines 214 are shown communicatively coupled or interfaced to the local decoders 206. It should be appreciated that, in one embodiment, one bank line 214 is associated with each bank.

Typically, the total switched capacitance during a given memory access for banked memory cores is inversely proportional to the number of banks employed. By judiciously selecting the number and placement of the bank units within a given memory core design, as well as the type of decoding used, the total switching capacitance, and thus the overall power consumed by the memory core, can be greatly reduced. Banked design may also realize a higher product yield. The memory banks can be arranged such that a defective bank is rendered inoperable and inaccessible, while the remaining operational banks of the memory core 200 can be packed into a lower-capacity product.

However, banked designs may not be appropriate for certain applications. Divided memory cores demand additional decoding circuitry to permit selective access to individual banks. In other words, such divided memory cores may demand an additional local decoder 206, local bank line 214 and local word line High 210 for example. Delay may occur as a result. Also, many banked designs employ memory segments that are merely scaled-down versions of traditional monolithic core memory designs, with each segment having dedicated control, precharging, decoding, sensing, and driving circuitry. These circuits tend to consume much more power in both standby and operational modes than their associated memory cells. Such banked structures may be simple to design, but the additional complexity and power consumption can reduce overall memory component performance.

By their very nature, banked designs are not suitable for scaling-up to accommodate large design requirements. Also, traditional banked designs may not be readily adaptable to applications requiring a memory core configuration that is substantially different from the underlying bank architecture (e.g., a memory structure needing relatively few rows of long word lengths). Traditional bank designs are generally not readily adaptable to a memory structure needing relatively few rows of very long word lengths.

Rather than resort to a top-down division of the basic memory structure using banked memory designs, one or more embodiments of the present invention provide a hierarchical memory structure that is synthesized using a bottom-up approach. Hierarchically coupling basic memory modules with localized decision-making features that synergistically cooperate to dramatically reduce the overall power needs, and improve the operating speed, of the structure. At a minimum, such a basic hierarchical module can include localized bitline sensing.

Divided Word Line

Often, the bit-width of a memory component is sized to accommodate a particular word length. As the word length for a particular design increases, so do the associated word line delays, switched capacitance, power consumption, and the like. To accommodate very long word lines, it may be desirable to divide core-spanning global word lines into local word lines, each consisting of smaller groups of adjacent, word-oriented memory cells. Each local group employs local decoding and driving components to produce the local word lines when the global word line, to which it is coupled, is activated. In long word length applications, the additional overhead incurred by divided word lines can be offset by reduced word line delays.

Rather than resorting to the traditional top-down division of word lines, certain embodiments of the invention herein include providing a local word line to the aforementioned basic memory module, which further enhances the local decision making features of the module. As before, by using a bottom-up approach to hierarchically couple basic memory modules as previously described with the added localized decision-making features of local word lines according to the present invention, additional synergies maybe realized, which further reduce overall power consumption and signal propagation times.

Multiplexing

One alternative to a banked memory core design is to multiplex or mux the memory cells. In other words, bits from different words are not stored sequentially. For example, in 2:1 muxing, bits from two words are stored in an alternating pattern. For example, if the number 1 represents bits from a first word, while the number 2 represent bits from a second word. During a READ or WRITE operation the mux selects which column it is looking at (i.e., the left or right bit). It should be appreciated that muxing may save space. Banked designs without muxing require one sense amplifier for every two lines. In 2:1 muxing for example, one sense amplifier is used for every four lines (i.e., one sense amplifier ties two sets of bitlines together). Muxing enables sense amps to be shared between muxed cells, which may increase the layout pitch and area efficiency.

In general, muxing consumes more power than the banked memory core design. For example, to read a stored word, the mux accesses or enables an entire row in the cell array, reading all the data stored therein, only sensing the data needed and disregarding the remainder.

Using a bottom-up approach to hierarchically couple basic memory modules with muxing according to an embodiment of the present invention, additional synergies are realized, reducing power consumption and signal propagation times.

Voltage-Swing Reduction Techniques

Power reduction may also be achieved by reducing the voltage swings experienced throughout the structure. By limiting voltage swings, it is possible to reduce the amount of power dissipated as the voltage at a node or on a line decays during a particular event or operation, as well as to reduce the amount of power required to return the various decayed voltages to the desired state after the particular event or operation, or prior to the next access. Two techniques to this end include using pulsed word lines and sense amplifier voltage swing reduction.

Pulsed Word Lines

By providing a word line just long enough to correctly detect the differential voltage across a selected memory cell, it is possible to reduce the bitline voltage discharge corresponding to a READ operation of the selected cell. In some designs, by applying a pulsed signal to the associated word line over a chosen interval, a sense amplifier is activated only during that interval, thereby reducing the duration of the bitline voltage decay. These designs typically use someから of pulse generator that produces a fixed-duration pulse. If the duration of the pulse is targeted to satisfy worst-case timing scenarios, the additional margin will result in unnecessary bitline current draw during nominal operations.

Therefore, it may be desirable to employ a self-timed, self-limiting word line device that is responsive to the actual duration of a given READ operation on a selected cell, and that substantially limits word line activation during that duration. Furthermore, where a sense amplifier successfully completes a READ operation in less than a memory system clock cycle, it may also be desirable to have asynchronous pulse width activation, relative to the memory system clock. Certain aspects of the present invention may provide a pulsed word line signal, for example, using a cooperative interaction between local decoder and local controller.

Sense Amplifier Voltage Swing Reduction

In order to make large memory arrays, it is most desirable to keep the size of an individual memory cell to a minimum. As a result, individual memory cells generally are incapable of supplying a driving current to associated input/output bitlines. Sense amplifiers typically are used to detect the value of the data stored in a particular memory cell and to provide the current needed to drive the I/O lines.

In a sense amplifier design, there typically is a trade-off between power and speed, with faster response times usually dictating greater power requirements. Faster sense amplifiers can also tend to be physically larger, relative to low speed, low power devices. Furthermore, the analog nature of sense amplifiers can result in their consuming an appreciable fraction of the total power. Although one way to improve the responsiveness of a sense amplifier is to use a more sensitive sense amplifier, any gained benefits are offset by the concomitant circuit complexity which nevertheless suffers from increased noise sensitivity. It is desirable, then, to limit bitline voltage swings and to reduce the power consumed by the sense amplifier.

In one typical design, the sense amplifier detects the small differential signals across a memory cell, which is in an unbalanced state representative of data value stored in the cell, and amplifies the resulting signal to logic level. Prior to a READ operation, the bitlines associated with a particular memory column are precharged to a chosen value. When a specific memory cell is enabled, a particular row in which the memory cell is located and a sense amplifier associated with the particular column are selected. The charge on one of those bitlines associated with the memory cell is discharged through the enabled memory cell, in a manner corresponding to the value of the data stored in the memory cell. This produces an imbalance between the signals on the paired bitlines, causing a bitline voltage swing.

When enabled, the sense amplifier detects the unbalanced signal and, in response, the usually balanced sense amplifier state changes to a state representative of the value of the data. This state detection and response occurs within a finite period, during which a specific amount of power is dissipated. In one embodiment, latch-type sense amps only dissipate power during activation, until the sense amp resolves the data. Power is dissipated as voltage develops on the bitlines. The greater the voltage decay on the precharged bitlines, the more power dissipated during the READ operation.

It is contemplated that using sense amplifiers that automatically shut off once a sense operation is completed may reduce power. A self-latching sense amplifier for example turns off as soon as the sense amplifier indicates the sensed data state. Latch type sense amps require an activation signal which, in one embodiment is generated by a dummy column timing circuit. The sense amp drives a limited swing signal out of the global bitlines to save power.

Redundancy

Memory designers typically balance power and device area concerns against speed. High-performance memory components place a severe strain on the power and area budgets of associated systems, particularly where such components are embedded within a VLSI system such as a digital signal processing system. Therefore, it is highly desirable to provide memory subsystems that are fast, yet power- and area-efficient.

Highly integrated, high performance components require complex fabrication and manufacturing processes. These processes may experience unavoidable parameter variations which can impose unwanted physical defects upon the units being produced, or can exploit design vulnerabilities to the extent of rendering the affected units unusable or substandard.

In a memory structure, redundancy can be important, because a fabrication flaw, or operational failure, of even a single bit cell, for example, may result in the failure of the system relying upon that memory. Likewise, process invariant features may be needed to insure that the internal operations of the structure conform to precise timing and parametric specifications. Lacking redundancy and process invariant features, the actual manufacturings yield for a particular memory are particularly unacceptable when embedded within more complex systems, which inherently have more fabrication and manufacturing vulnerabilities. A higher manufacturing yield translates into lower per-unit costs, while a robust design translates into reliable products having lower operational costs. Thus, it is highly desirable to design components having redundancy and process invariant features wherever possible.

Redundancy devices and techniques constitute other certain preferred aspects of the invention herein that, alone or together, enhance the functionality of the hierarchical memory structure. The previously discussed redundancy aspects of the present invention can render the hierarchical memory structure less susceptible to incapacitation by defects during fabrication or operation, advantageously providing a memory product that is at once more manufacturable and cost-efficient, and operationally more robust.

Redundancy within a hierarchical memory module can be realized by adding one or more redundant rows, columns, or both, to the basic module structure. Moreover, a memory structure composed of hierarchical memory modules can employ one or more redundant modules for mapping to failed memory circuits. A redundant module may provide a one-for-one replacement of a failed module, or it can provide one or more memory cell circuits to one or more primary memory modules.

Memory Module with Hierarchical Functionality

The modular, hierarchical memory architecture according to one embodiment of the present invention provides a compact, robust, power-efficient, high-performance memory system having, advantageously, a flexible and extensively scalable architecture. The hierarchical memory structure is composed of fundamental memory modules or blocks which can be cooperatively coupled, and arranged in multiple hierarchical tiers, to devise a composite memory product having arbitrary column depth or row length. This bottom-up modular approach localizes timing considerations, decision-making, and power consumption to the particular unit(s) in which the desired data is stored.

Within a defined design hierarchy, the fundamental memory subsystems or blocks may be grouped to form a larger memory structure, that itself can be coupled with similar memory structures to form still larger memory structures. In turn, these larger structures can be arranged to create a complex structure, including a SRAM module, at the highest tier of the hierarchy. In hierarchical sensing, it is desired to provide two or more tiers of bit sensing, thereby decreasing the READ and WRITE time of the device, i.e., increasing effective device speed, while reducing overall device power requirements. In a hierarchical design, switching and memory cell power consumption during a READ/WRITE operation are localized to the immediate vicinity of the memory cells being evaluated or written, i.e., those memory cells in selected memory subsystems or blocks, with the exception of a limited number of global word line selectors, sense amplifiers, and support circuitry. The majority of subsystems or blocks that do not contain the memory cells being evaluated or written generally remain inactive.

Alternate embodiments of the present invention provide a hierarchical memory module using local bitline sensing, local word line decoding, or both, which intrinsically reduces overall power consumption and signal propagation, and increases overall speed, as well as increasing design flexibility and scalability. Aspects of the present invention contemplate apparatus and methods which further limit the overall power dissipation of the hierarchical memory structure, while minimizing the impact of a multi-tier hierarchy. Certain aspects of the present invention are directed to mitigate functional vulnerabilities that may develop from variations in operational parameters, or that related to the fabrication process.

Hierarchical Memory Modules

In prior art memory designs, such as the aforementioned banked designs, large logical memory blocks are divided into smaller, physical modules, each having the attendant overhead of an entire block of memory including predecoders, sense amplifiers, multiplexers, and the like. In the aggregate, such memory blocks would behave as an individual memory block. However, using the present invention, SRAM memory modules of comparable, or much larger, size can be provided by coupling hierarchical functional subsystems or blocks into larger physical memory modules of arbitrary number of words and word length. For example, existing designs that aggregate smaller memory modules into a single logical modules usually require the replication of the predecoders, sense amplifiers, and other overhead circuitry that would be associated with a single memory module.

According to the present invention, this replication is unnecessary, and undesirable. One embodiment of the present invention comprehends local bitline sensing, in which a limited number of memory cells are coupled with a single local sense amplifier, thereby forming a basic memory module. Similar memory modules are grouped and arranged to form blocks that, along with the appropriate circuitry, output the local sense amplifier signal to the global sense amplifier. Thus, the bitlines associated with the memory cells in the block are not directly coupled with a global sense amplifier, mitigating the signal propagation delay and power consumption typically associated with global bitline sensing. In this approach, the local bitline sense amplifier quickly and economically sense the state of a selected memory cell in a block and reports the state to the global sense amplifier.

In another embodiment of the invention herein, providing a memory block, a limited number of memory cells, among other units. Using local word line decoding mitigates the delays and power consumption of global word line decoding. Similar to the local bitline sensing approach, a single global word line decoder can be coupled with the respective local word line decoders of multiple blocks. When the global decoder is activated with an address, only the local word line decoder associated with the desired memory cell of a desired block responds, activating the memory cell. This aspect, too, is particularly power-conservative and fast, because the loading on the global line is limited to the associated local word line decoders, and the global word line signal need be present only as long as required to trigger the relevant local word line. In yet another embodiment of the present invention, a hierarchical memory block employing both local bitline sensing and local word line decoding is provided, which realizes the advantages of both approaches. Each of the above embodiments among others, is discussed below.

Syncrhonous Controlled Self-Timed SRAM

Figure 3A:
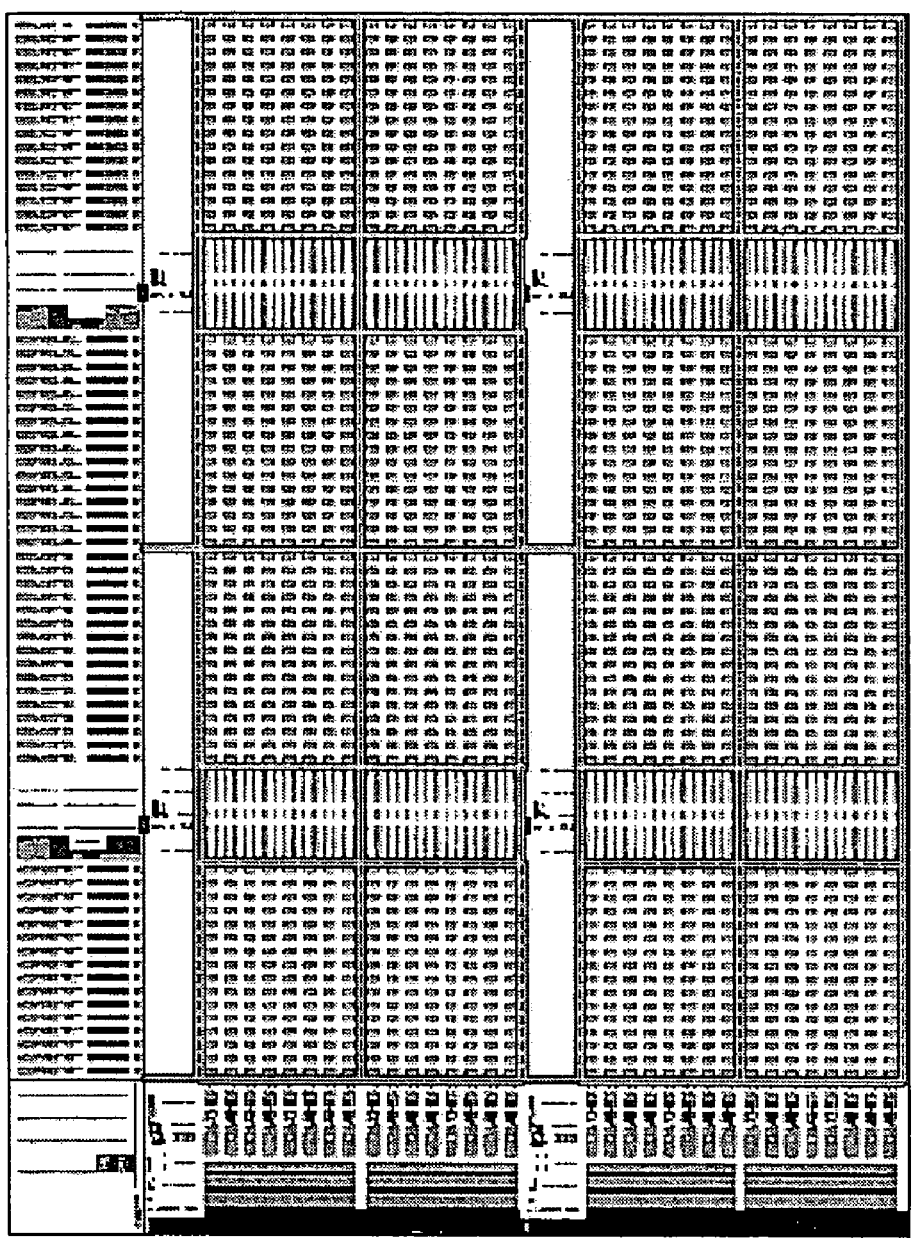
FIGS. 3A and 3B illustrate SRAM modules including a block structure or subsystem in accordance with one embodiment of the present invention.
Figure 3B:
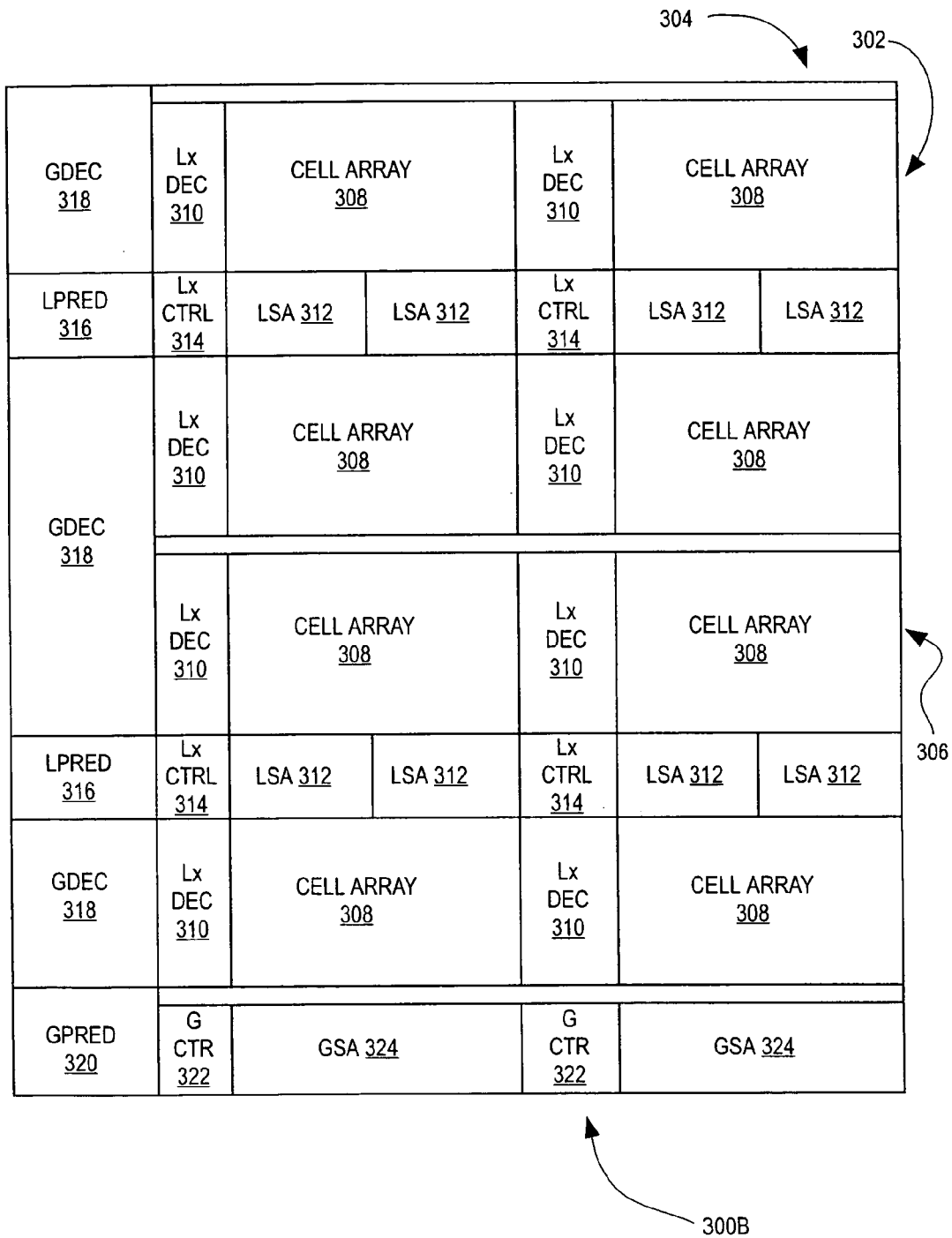

One embodiment of a 0.13 µm SRAM module, generally designated 300, is illustrated in FIGS. 3A and 3B. It should be appreciated that, while a 0.13 µm SRAM module is illustrated, other sized SRAM modules are contemplated. The illustrated SRAM embodiment comprises a hierarchical memory that breaks up a large memory into a two-dimensional array of blocks. In this embodiment, a row of blocks is designated a row block while a column of blocks is designated a column block. A pair of adjacent row blocks 302 and column blocks 304 is illustrated.

It should be appreciated that the terms row blocks and block columns are arbitrary designations that are assigned to distinguish the blocks extending in one direction from the blocks extending perpendicular thereto, and that these terms are independent of the orientation of the SRAM 300. It should also be appreciated that, while four blocks are depicted, any number of column and row blocks are contemplated. The number of blocks in a row block may generally range anywhere from 1 to 16, while the number of blocks in a column block may generally range anywhere from 1 to 16, although larger row and column blocks are contemplated.

In one embodiment, a block 306 comprises at least four entities: (1) one or more cell arrays 308; (2) one or more local decoders 310 (alternatively referred to as "LxDEC 710"); (3) one or more local sense amps 312 (alternatively referred to as "LSA 712"); and (4) one or more local controllers 314 (alternatively referred to as "LxCTRL 714"). In an alternative embodiment, the block 306 may include clusters as described below.

SRAM 300 illustrated in FIGS. 3A and 3B includes two local predecoders 316 (alternatively referred to as "LxPRED"), three global decoders 318 (alternatively referred to as "GxDEC"), a global predecoder 320 (alternatively referred to as "GxPRED"), two global controllers 322 (alternatively referred to as "GxCTR"), and two global sense amps 324 (alternatively referred to as "GSA 724") in addition to the illustrated block 306 comprising eight cell arrays 308, six local decoders 310, eight local sense amps 312, and two local controllers 314. It should be appreciated that one embodiment comprise one local sense amp (and in one embodiment one 4:1 mux) for every four columns of memory cell, each illustrated global controller comprises a plurality of global controllers, one global controller for each local controller, and each illustrated local controller comprises a plurality of local controllers, one for each row of memory cells.

Figure 4:
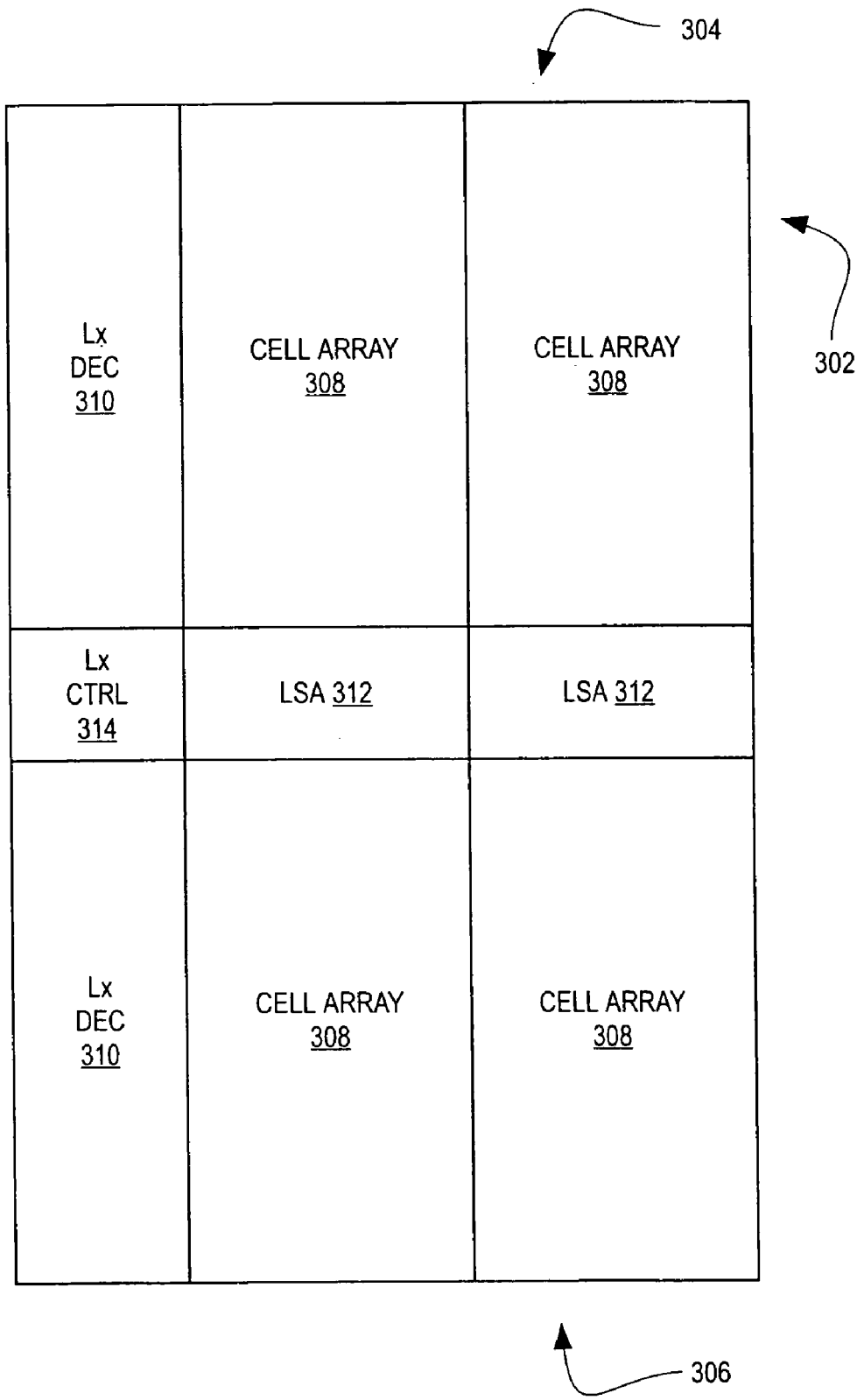
FIG. 4 illustrates a dimensional block array or subsystem used in a SRAM module in accordance with one embodiment of the present invention.

An alternative embodiment of block 306 comprising only four cell arrays 308, two local decoders 310, two local sense amps 312, and one local controller 314 is illustrated in FIG. 4. Typically, the blocks range in size from about 2 Kbits to about 150 K-bits.

In one embodiment, the blocks 306 may be broken down further into smaller entities. One embodiment includes an array of sense amps arranged in the middle of the cell arrays 308, dividing the cell arrays into top and bottom sub-blocks as discussed below.

Figure 5:
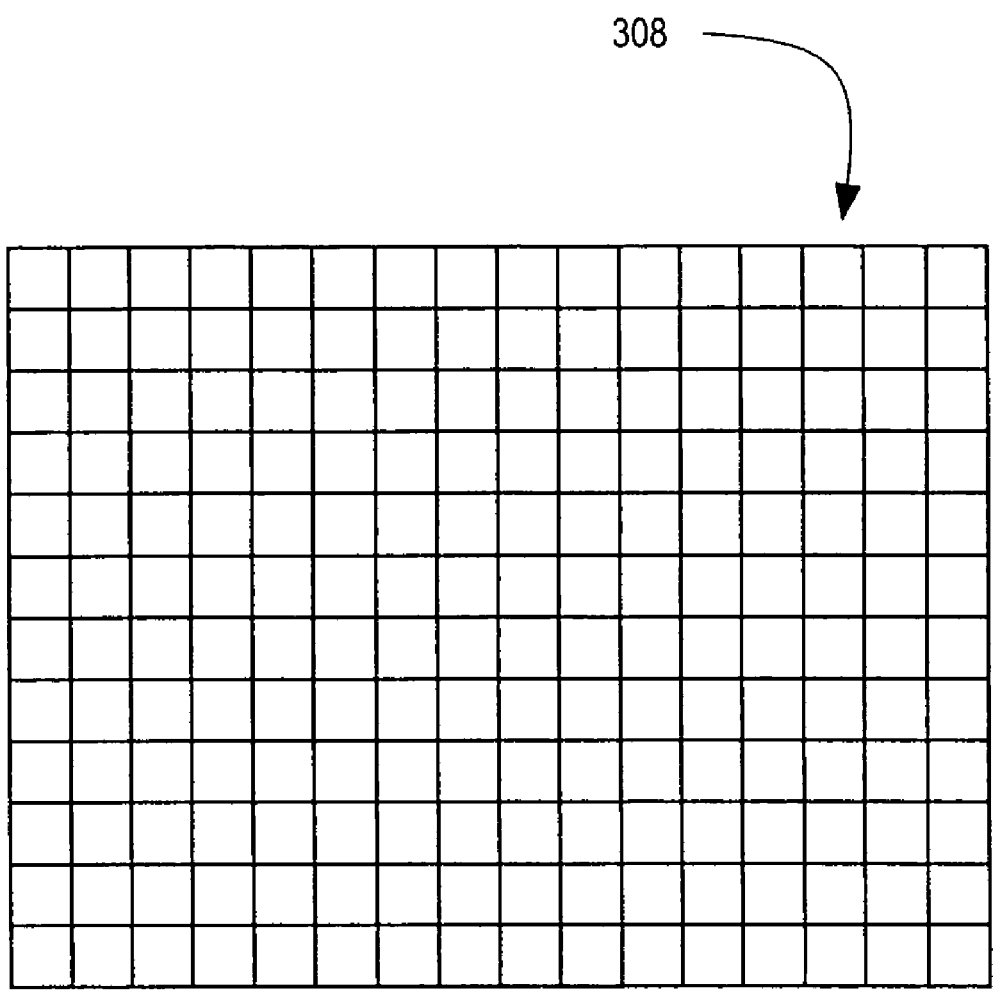
FIG. 5 illustrates a cell array comprising a plurality of memory cells in accordance with one embodiment of the present invention.
Figure 6A:
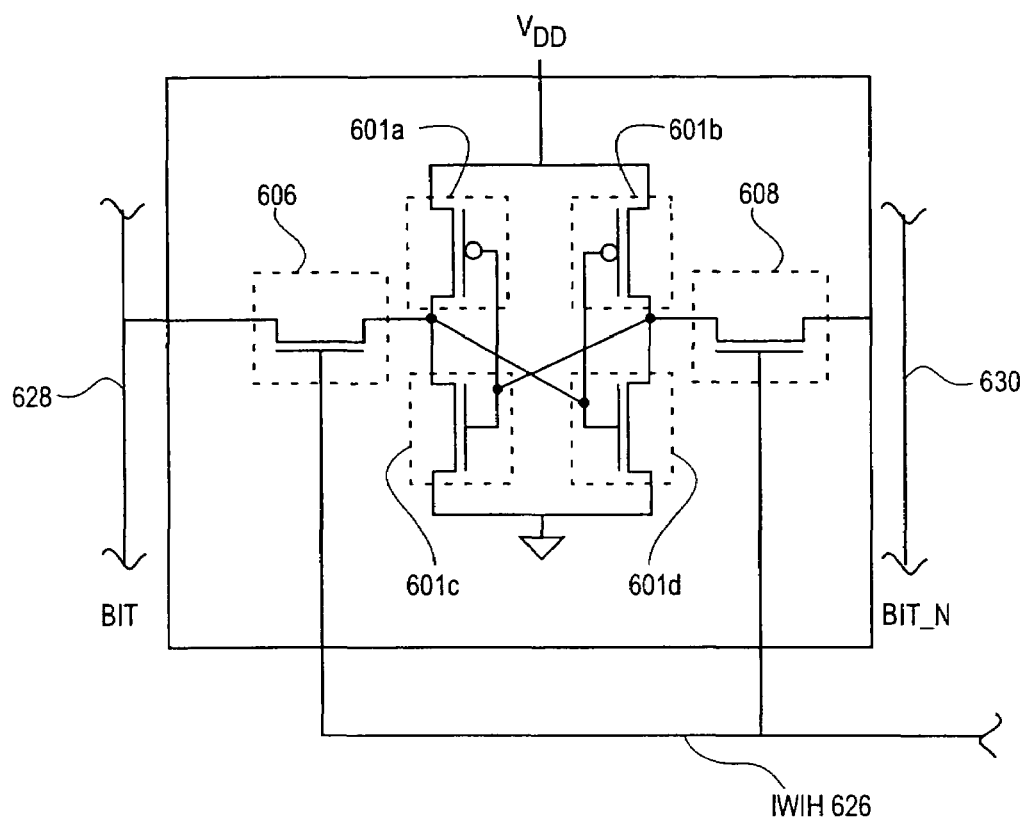
FIG. 6A illustrates a memory cell used in accordance with one embodiment of the present invention.

It is contemplated that, in one embodiment, the external signals that control each block 300 are all synchronous. That is, the pulse duration of the control signals are equal to the clock high period of the SRAM module. Further, the internal timing of each block 300 is self-timed. In other words the pulse duration of the signals are dependent on a bit-line decay time and are independent of the clock period. This scheme is globally robust to RC effects, locally fast and power-efficient as provided below Memory Cell In one embodiment the cell arrays 308 of the SRAM 300 comprises a plurality of memory cells as illustrated in FIG. 5, where the size of the array (measured in cell units) is determined by rows×cols. For example, a megabit memory cell array comprises a 1024×1024 memory cells. One embodiment of a memory cell used in the SRAM cell array comprises a six-transistor CMOS cell 600A (alternatively referred to as "6T cell") is illustrated in FIG. 6A. In the illustrated embodiment, 6T cell 600 includes transistors 601a, 601b, 601c and 601d.

Each 6T cell 600 interfaces to a local wordline 626 (alternatively referred to as lwlH), shared with all other 6T cells in the same row in a cell array. A pair of local bitlines, designated bit and bit_n and numbered 628 and 630 respectively, are shared with all other 6T cells 600 in the same column in the cell array. In one embodiment, the local wordline signal enters each 6T cell 600 directly on a poly line that forms the gate of cell access transistors 632 and 634 as illustrated. A jumper metal line also carries the same local wordline signal. The jumper metal line is shorted to the poly in strap cells that are inserted periodically between every 16 or 32 columns of 6T cells 600. The poly in the strap cells is highly resistive and, in one embodiment of the present invention, is shunted by a metal jumper to reduce resistance.

In general, the 6T cell 600 exists in one of three possible states: (1) the STABLE state in which the 6T cell 600 holds a signal value corresponding to a logic "1" or logic "0"; (2) a READ operation state; or (3) a WRITE operation state. In the STABLE state, 6T cell 600 is effectively disconnected from the memory core (e.g., core 102 in FIG. 1). In one example, the bit lines, i.e., bit and bit_n lines 628, 630 respectively, are precharged HIGH (logic "1") before any READ or WRITE operation takes place. Row select transistors 632, 634 are turned off during precharge. Local sense amplifier block (not shown but similar to LSA 712) is interfaced to bit line 628 and bit_n line 630, similar to LSA 712 in FIGS. 3A, 3B and 4, supply precharge power.

A READ operation is initiated by performing a PRECHARGE cycle, precharging bit line 628 and bit_n line 630 to logic HIGH, and activating LWLH 626 using row select transistors 632, 634. One of the bitlines discharges through 6T cell 600, and a differential voltage is setup between bit line 628 and bit_n line 630. This voltage is sensed and amplified to logic levels.

A WRITE operation to 6T cell 600 is carried out after another PRECHARGE cycle, by driving bitlines 628, 630 to the required state, corresponding to write data and activating lwlH 626. CMOS is a desirable technology because the supply current drawn by such an SRAM cell typically is limited to the leakage current of transistors 601a–d while in the STABLE state.

Figure 6B:
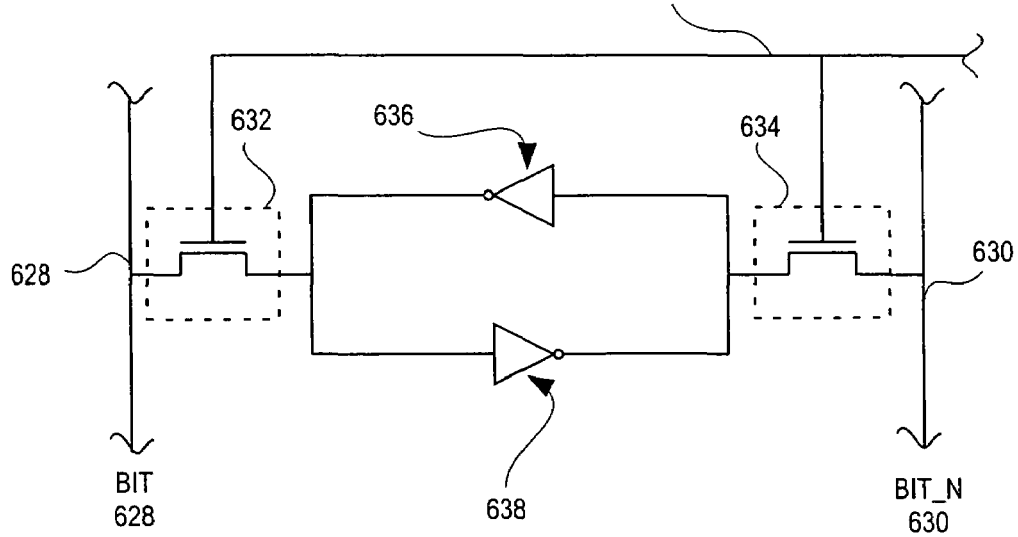
FIG. 6B illustrates back-to-back inventors representing the memory cell of FIG. 6A in accordance with one embodiment of the present invention.

FIG. 6B illustrates an alternative representation of the 6T cell illustrated in FIG. 6A. In this embodiment, transistors 601a, 601b, 601c and 601d are represented as back-to-back inventors 636 and 638 respectively as illustrated.

Local Decoder

Figure 7:
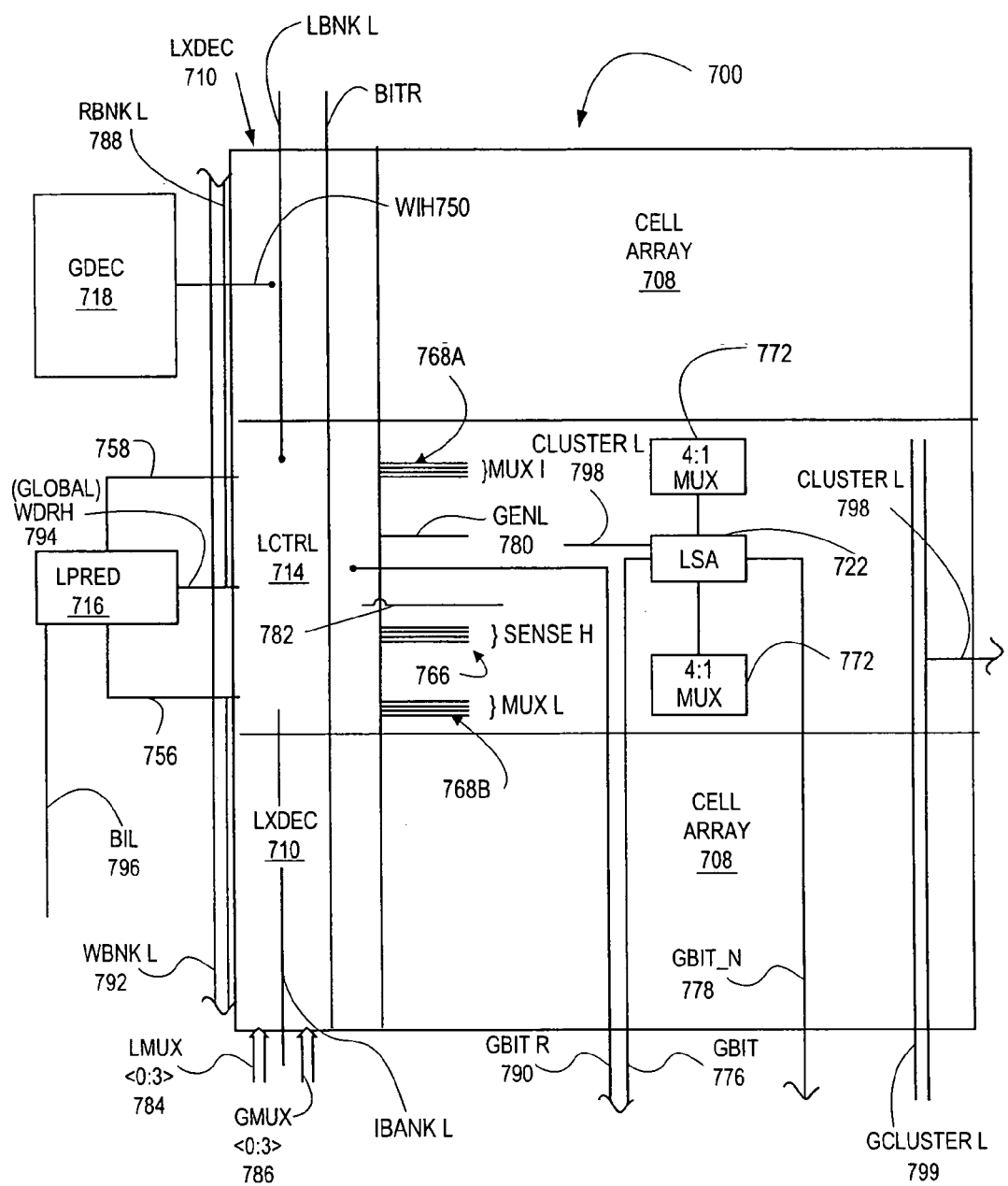
FIG. 7 illustrates a SRAM module similar to that illustrated FIGS. 3A and 3B in accordance with one embodiment of the present invention.

A block diagram of one embodiment of a SRAM module 700, similar to the SRAM module 300 of FIGS. 3A, 3B and 4, is illustrated in FIG. 7. This embodiment includes a one-dimensional array of local x-decoders or LxDEC 710 similar to the LxDEC 310. The LxDEC 710 array is physically arranged as a vertical array of local x-decoders located proximate the cell array 708. The LxDEC 710 interfaces with or is communicatively coupled to a global decoder or GxDEC 718.

In one embodiment, the LxDEC 710 is located to the left of the cell array 708. It should be appreciated that the terms "left," or "right," "up," or "down," "above," or "below" are arbitrary designations that are assigned to distinguish the units extending in one direction from the units extending in another direction and that these terms are independent of the orientation of the SRAM 700. In this embodiment, LxDEC 710 is in a one-to-one correspondence with a row of the cell array 708. The LxDEC 710 activates a corresponding local wordline or lwlH 726 not shown of a block. The LXDEC 710 is controlled by, for example, WlH, bnkL and BitR 742 signals on their respective lines.

Figure 8:
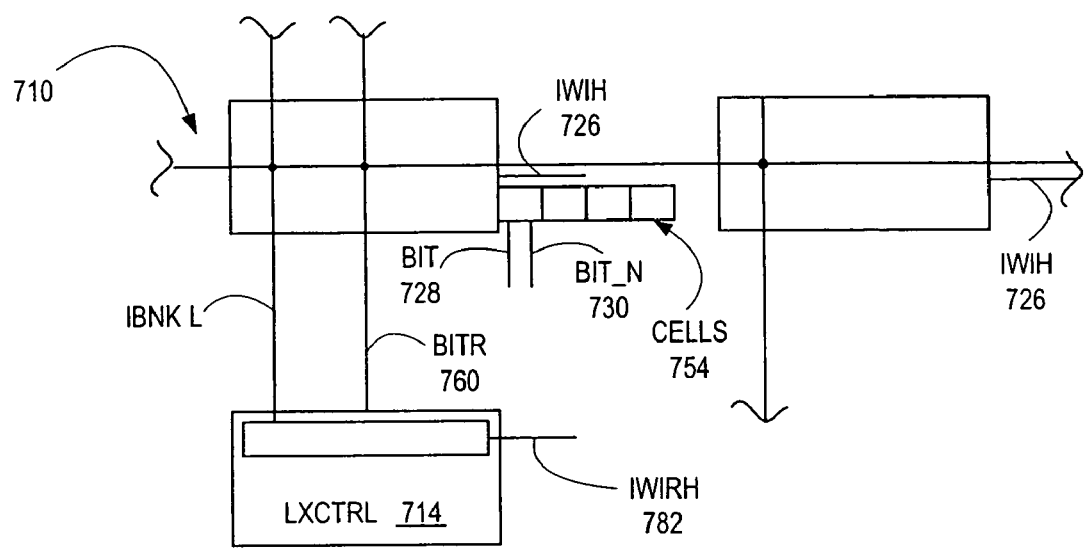
FIG. 8 illustrates a local decoder in accordance with one embodiment of the present invention.

Another embodiment of LxDEC 710 is illustrated in FIG. 8. In this embodiment, each LxDEC 710 in a block interfaces to a unique global wordline 750 (alternatively referred to as "WlH") corresponding to the memory row. The global WlH 750 is shared with other corresponding LxDEC's 710 in the same row block using lwlH 750. LxDEC 710 only activates the local wordline 726, if the corresponding global wordline 750 is activated. It should be appreciated that a plurality of cells 754 similar to the 6T cells discussed previously, are communicatively coupled to the lwlH 726 as illustrated.

In the embodiment illustrated in FIG. 8., every LxDEC 710 in the top or bottom of a sub-block shares the same bank line (alternatively referred to as "bnk Sol H"). It should be appreciated that there are separate bnkL_bot 756 and bnkL_top 758 lines for the bottom and top sub-blocks, respectively. LxDEC 710 will only activate lwlH 726 if this line is active. The bank lines are used to selectively activate different blocks within the same row block and synchronize the proper access timing. For example, during a READ operation, the bank line will activate as early as possible to begin the read operation. During a WRITE operation for example, bnkL is synchronized to the availability of the data on the local bitlines.

Every LxDEC 710 in the embodiment illustrated in FIG. 8 shares the same bitR line 760. This line is precharged to VDD in the memory idle state. When bitR 760 approaches VDD/2 (i.e., one half of VDD), it signals the end of a memory access and causes the LXDEC 710 to de-activate lwlH 726. The bitR signal line 760 is constructed as a replica to the bitlines (i.e, in this embodiment bit line 728 and bit_n line 730 are similar to bit line 628 and bit_n line 630 discussed previously) in the cell array, so the capacitive loading of the bitR 760 line is the same per unit length as in the cell array. In one embodiment, a replica local decoder, controlled by bnkL, fires the lwlRH. In this embodiment, the lwlRH is a synchronization signal that controls the local controller. The lwlRH may fire every time an associated subblock (corresponding to a wlRH) is accessed.

Figure 9:
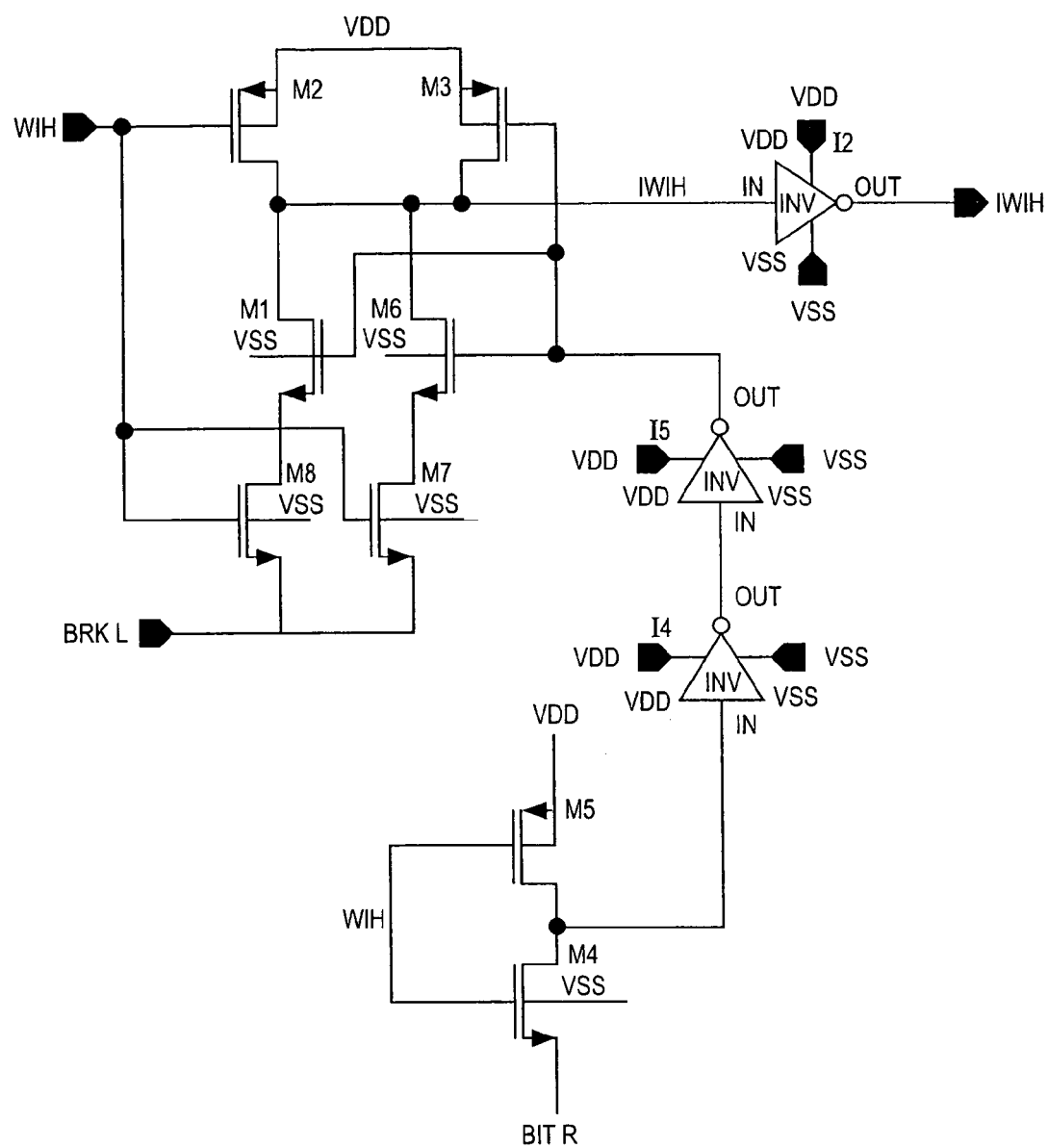
FIG. 9 illustrates a circuit diagram of a local decoder similar to that illustrated in FIG. 8 in accordance with one embodiment of the present invention.

In one embodiment, a global controller initiates or transmits a READ or WRITE signal. The associated local controller 714 initiates or transmits an appropriate signal based on the signal transmitted by the global controller (not shown). The local controller pulls down bitR line 760 from LxDEC 710 when the proper cell is READ from or WRITTEN to, saving power. When the difference between bit line 728 and bit_n line 730 is high enough to trigger the sense amp portion, the lWlH 726 is turned off to save power. A circuit diagram of one embodiment of a local x-decoder similar to LxDEC 710 is illustrated in FIG. 9.

Local Sense-Amps

Figure 10:
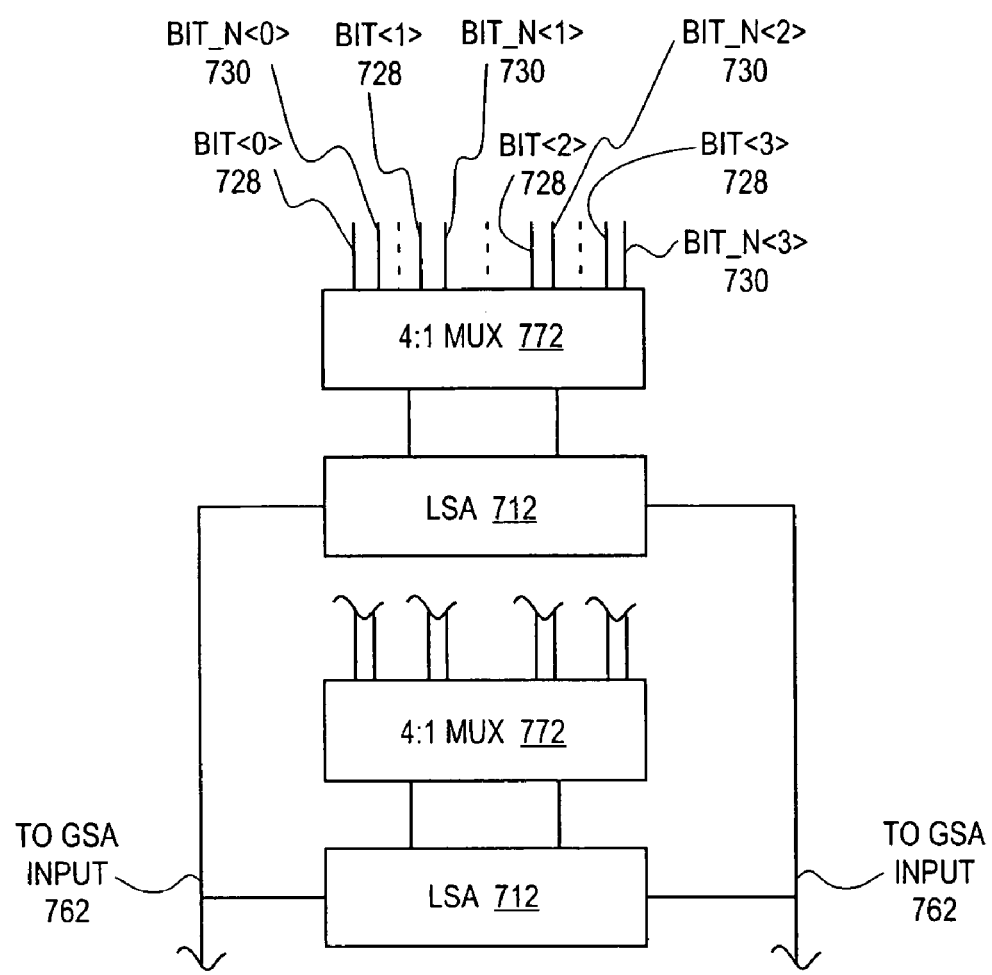
FIG. 10 illustrates a block diagram of the local sense amps and 4:1 muxing in accordance with one embodiment of the present invention.
Figure 11:
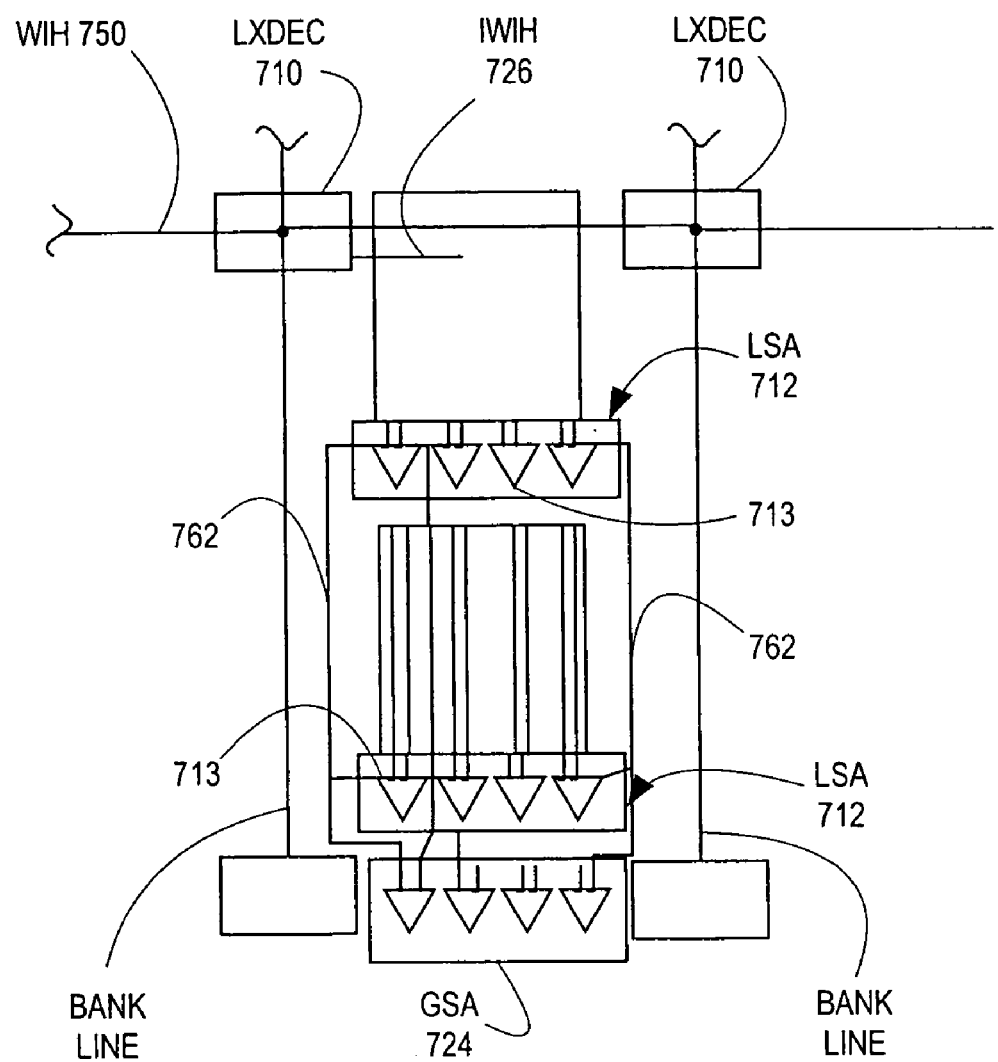
FIG. 11 illustrates a block diagram of the local sense amps and global sense amps in accordance with one embodiment of the present invention.
Figure 12A:
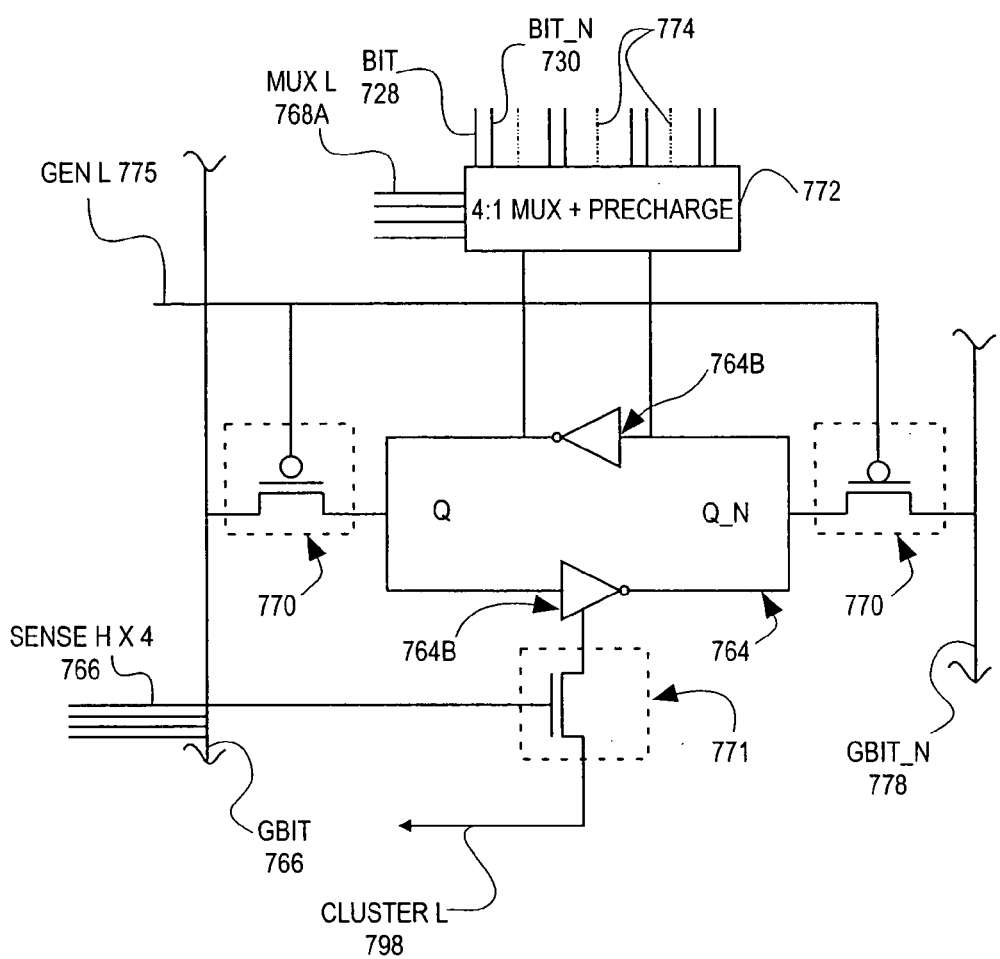
FIG. 12A illustrates a schematic representation of the local sense amps and global sense amps in accordance with one embodiment of the present invention.

One embodiment of the SRAM module includes a one-dimensional array of local sense-amps or LSA's 712 illustrated in FIGS. 10 and 11, where the outputs of the LSA 712 are coupled to the GSA 724 via line 762. In one embodiment, the outputs of the LSA's are coupled to the GSA via at least a pair of gbit and gbit_n lines. FIG. 12A illustrates one embodiment of LSA 712 comprising a central differential cross-coupled amplifier core 764, comprising two inverters 764A and 764B. The senseH lines 766, and clusterL 798, are coupled to the amplifier core through transistor 771.

The LSA's 764 are coupled to one or more 4:1 mux's 772 and eight pairs of muxL lines 768A, four muxLs 768A located above and four 768B (best viewed in FIG. 7) located below the amplifier core 764. In the illustrated embodiment, each of the bitline multiplexers 772 connects a corresponding bitline pair and the amplifier core 764. The gbit and gbit_n are connected to the amplifier core through a PMOS transistors (transistors 770 for example). When a bitline pair is disconnected from the amplifier core 764, the bitline multiplexer 772 actively equalizes and precharges the bitline pair to VDD.

Figure 12B:
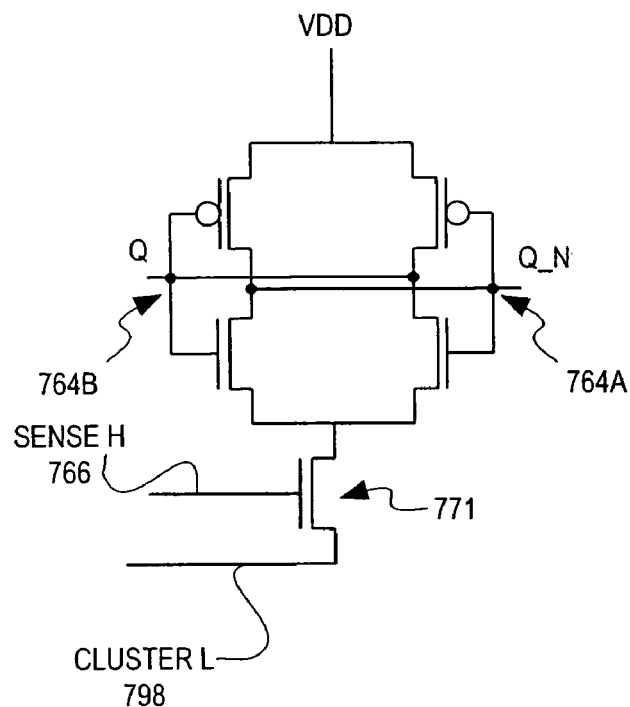
FIG. 12B illustrates a circuit diagram of an embodiment of a local sense amp (similar to the local sense amp of FIG. 12A) in accordance with one embodiment of the present invention.
Figure 12C:
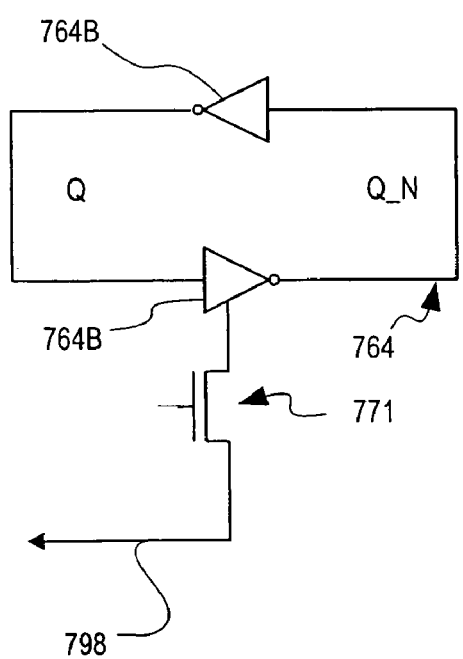
FIG. 12C illustrates a schematic representation of the amplifier core similar to the amplifier core illustrated in FIG. 12B.

FIG. 12B illustrates a circuit diagram of an amplifier core 764 having two inverters 764A and 764B, where each inverter 764A and 764B is coupled to a SenseH line 766 and cluster line 798 through a transistor NMOS 771. Only one sense H cluster lines are illustrated. In the illustrated embodiment, each of the inverters 764A and 764B are represented as coupled PMOS and NMOS transistor as is well known in the art. FIG. 12C illustrates a schematic representation of the amplifier core of FIG. 12B (similar to the amplifier core of FIG. 12A).

Figure 13:
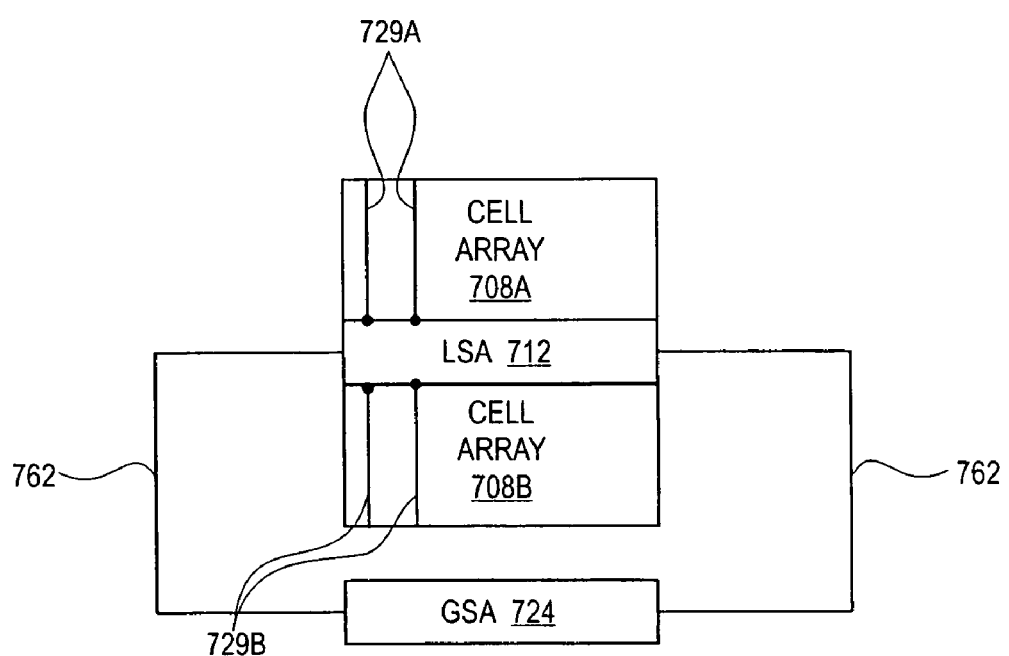
FIG. 13 illustrates a block diagram of another embodiment of the local sense amps and global sense amps in accordance with one embodiment of the present invention.

In one embodiment illustrated in FIG. 13, the sense-amp array comprises a horizontal array of sense-amps 713 located in the middle of the cell array 708, splitting the cell array into top 708A and bottom 708B sub-blocks as provided previously. In this embodiment, the width of a single LSA 712 is four times the width of the cell array, while the number of LSA 712 instances in the array is equal to the number of cols/4. That is, each LSA 712 (and in one embodiment one 4:1 mux) is in a one-to-one correspondence with four columns of the cell array and interfaces with the corresponding local bitline-pairs of the cell array 708 in the top and bottom sub-blocks 708A, 708B. This arrangement is designated 4:1 local multiplexing (alternatively referred to as "4:1 local muxing"). It should be appreciated that the bitline-pairs of the bottom sub-block 708B are split from the top sub-block 708A, thereby reducing the capacitive load of each bitline 729 by a factor of two, increasing the speed of the bitline by the same factor and decreasing power. One embodiment of the 4:1 mux plus precharge is illustrated in FIGS. 10 and 12 and discussed in greater detail below.

It is currently known to intersperse power rails 774 (shown in phantom) between pairs of bitlines to shield the bitline pairs from nearby pairs. This prevents signals on one pair of bitlines from affecting the neighboring bitline pairs. In this embodiment, when a pair of bitlines 729 (bit and bit_n, 728, 730) is accessed, all the neighboring bitlines are precharged to VDD by the 4:1 mux as illustrated in FIG. 12. Precharging the neighboring bitlines, eliminates the need for shields to isolate those bitlines. This means that it is not necessary to isolate pairs of bitlines from each other using with interspersed power rails 774. This allows for a larger bitline pitch in the same total width, and therefore less capacitance, less power, and higher speed.

The LSA 712 interfaces with a pair of global bitlines, designated gbit 776 and gbit_n 778 via a PMOS transistors 770 as illustrated in FIG. 12A. Two PMOS transistors are illustrated, but any number is contemplated. In one embodiment, the global bitlines run vertically in parallel with the local bitlines. The global bitlines are shared with the corresponding local sense-amps 712 in other blocks in the same column block. In one embodiment, the local bitlines and global bitlines are routed on different metal layers. Because there are four times fewer global bitlines than local bitlines, the global bitlines are physically wider and placed on a larger pitch. This significantly reduces the resistance and capacitance of the long global bitlines, increasing the speed and reliability of the SRAM module. The PMOS transistors 770 isolate global bitlines 776, 778 from the sense amp.

Figure 14:
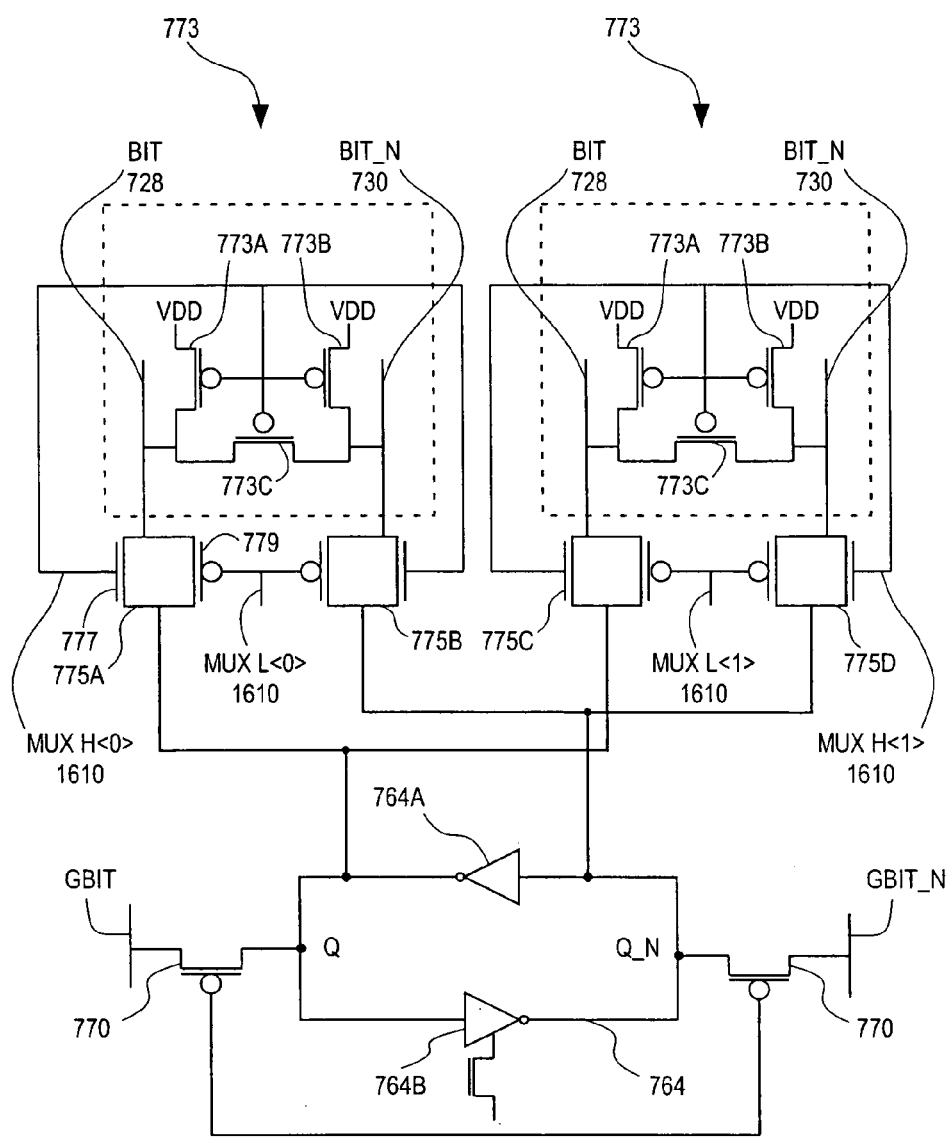
FIG. 14 illustrates a circuit diagram including a transmission gate of the 4:1 mux similar to that illustrated in FIGS. 10 and 12 in accordance with one embodiment of the present invention.

One embodiment of the bitline multiplexer or 4:1 mux 772 is illustrated in FIG. 14. In this embodiment, the 4:1 mux 772 comprises a precharge and equalizing portion or device 773 and two transmission gates per bit/bit_n pair. More specifically, 4:1 muxing may comprise 8 transmission gates and 4 precharge and equalizers, although only 4 transmission gates and 2 precharge and equalizers are illustrated.

In the illustrated embodiment, each precharge and equalizing portion 773 of the 4:1 mux comprises three PFet transistors 773A, 773B and 773C. In this embodiment, the precharge portion comprises PFet transistors 773A and 773B. The equalizing portion comprises PFet transistor 773D.

In the illustrated embodiment, each transmission gate comprises one NFet 777A and one PFet 777B transistor. While a specific number and arrangement of PMOS and NMOS transistors are discussed, different numbers and arrangements are contemplated. The precharge and equalizing portion 773 is adapted to precharge and equalize the bitlines 728, 739 as provided previously. The transmission gate 775 is adapted to pass both logic "1"'s and "0"'s as is well understood in the art. The NFet transistors, 777A and 777B for example, may pass signals during a WRITE operation, while the PFet transistors 779A and 779B may pass signals during a READ operation.

Figure 15:
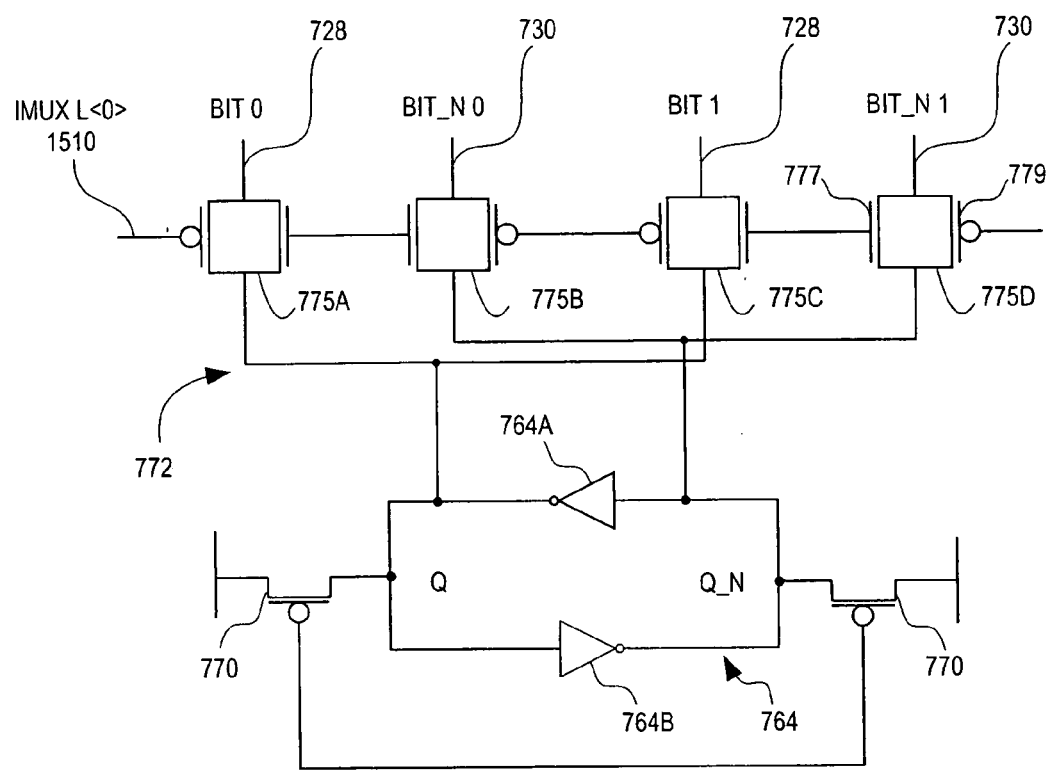
FIG. 15 illustrates transmission gates of the 2:1 mux coupled to the inverters of a local sense amp in accordance with one embodiment of the present invention.
Figure 16:
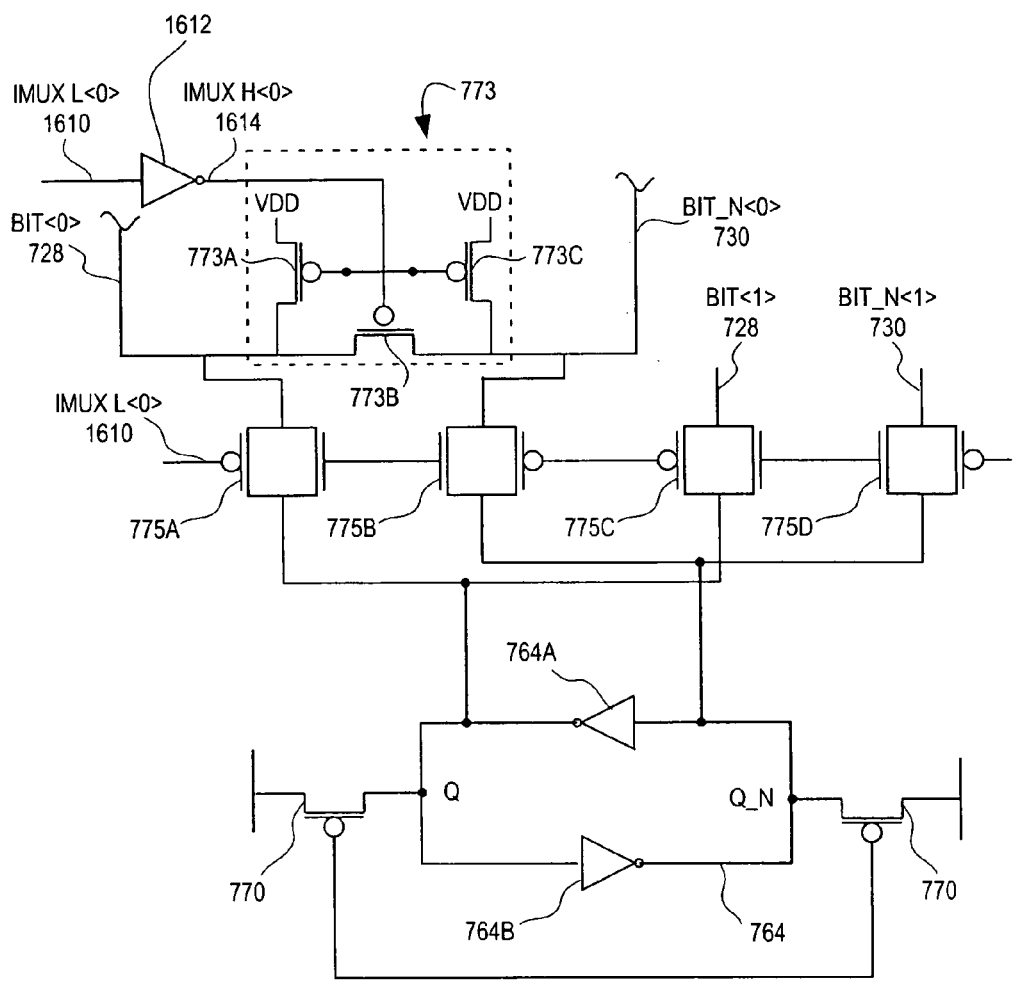
FIG. 16 illustrates the precharge and equalizing portions and transmission gates of the 2:1 mux coupled to the inverters of a local sense amp in accordance with one embodiment of the present invention.

FIGS. 15 and 16 illustrate embodiments of the 2:1 mux 772 coupled to the amplifier core 764 of the LSA. FIG. 15 also illustrates an alternate representation of the transmission gate. Here, four transmission gates 775A, 775B, 775C and 775D are illustrated coupled to the inverters 764A and 764B of the inverter core. In one embodiment of the present invention, eight transmission gates are contemplated for each LSA, two for each bitline pair.

FIG. 16 illustrates the precharge and equalizing portion 773 of the 2:1 coupled to the transmission gates 775A and 775B of mux 772, which in turn is coupled to the amplifier core. While only one precharge and equalizing portion 773 is illustrated, it is contemplated that a second precharge and equalizing portion 773 is coupled to the transmission gates 775C and 775D.

In one embodiment illustrated in FIG. 7, the LSA 712 is controlled by the following set of lines, or signals on those lines, that are shared across the entire LSA 712 array: (1) muxL_bot 768B; (2) muxL_top 768A; (3) senseH 766; (4) genL 780; and (5) lwlRH 782. In one embodiment of the SRAM module, the LSA 712 selects which of the local bitlines to use to initiate or access the cell array 708. The local bitlines comprise 8 pairs of lines, 4 pairs of mux lines 768B that interface to the bottom sub-block 708B (alternatively referred to as "muxL_bot 765B<0:3>") and 4 pairs of mux lines 768A that interface to the top sub-block 708A (alternatively referred to as "muxL_top 765A<0:3>"). The LSA 712 selects which of the 8 pairs of local bitlines to use for the current access. The LSA 712 maintains any local bitline not selected for access in a precharged and equalized state. In one embodiment, the LSA 712 keeps the non-selected bitlines precharged to VDD.

The LSA 712 also activates the amplifier portion of the sense-amp 713 using a sense enable line 766 or signal on the line (alternatively referred to as "senseH 766") connected to transistor 773. This activation signal is distributed into four separate signals, each signal tapping one out of every four local sense-amps. In one embodiment, the local controller 714 may activate all the senseH lines 766 simultaneously (designated "1:1 global multiplexing" or "1:1 global mux") because every sense-amp 713 is activated by senseH lines 766 for each access. Alternately, the local controller may activate the senseH lines 766 in pairs (designated "2:1 global multiplexing" or "2:1 global mux") because every other sense-amp 713 is activated by senseH 766 for each access. Additionally, the LSA 712 may activate the senseH 766 lines 766 individually (designated "4:1 global multiplexing" or "4:1 global mux"), because every fourth sense-amp is activated for each access. It should be appreciated that connecting or interfacing the senseH 766 to every fourth enabled transistor in 4:1 global multiplexing provides for more configurable arrangements for different memory sizes.

The LSA 712, in one embodiment, exposes the sense-amps 713 to the global bitlines. The LSA 712 activates or initiates the genL line 780, thus exposing the sense amps 713 to the gbit and gbit_n.

In one embodiment, the LSA 712 replicates the poly local wordline running through each row of each block. This replicated line is referred to as a dummy poly line 782 (alternatively referred to as "lwlRH 782"). In this embodiment, the lwlRH line 782 forms the gate of dummy transistors that terminate each column of the cell array 708. Each dummy transistor replicates the access transistor of the 6T SRAM cell. The capacitive load of this line is used to replicate the timing characteristics of an actual local wordline.

Figure 17:
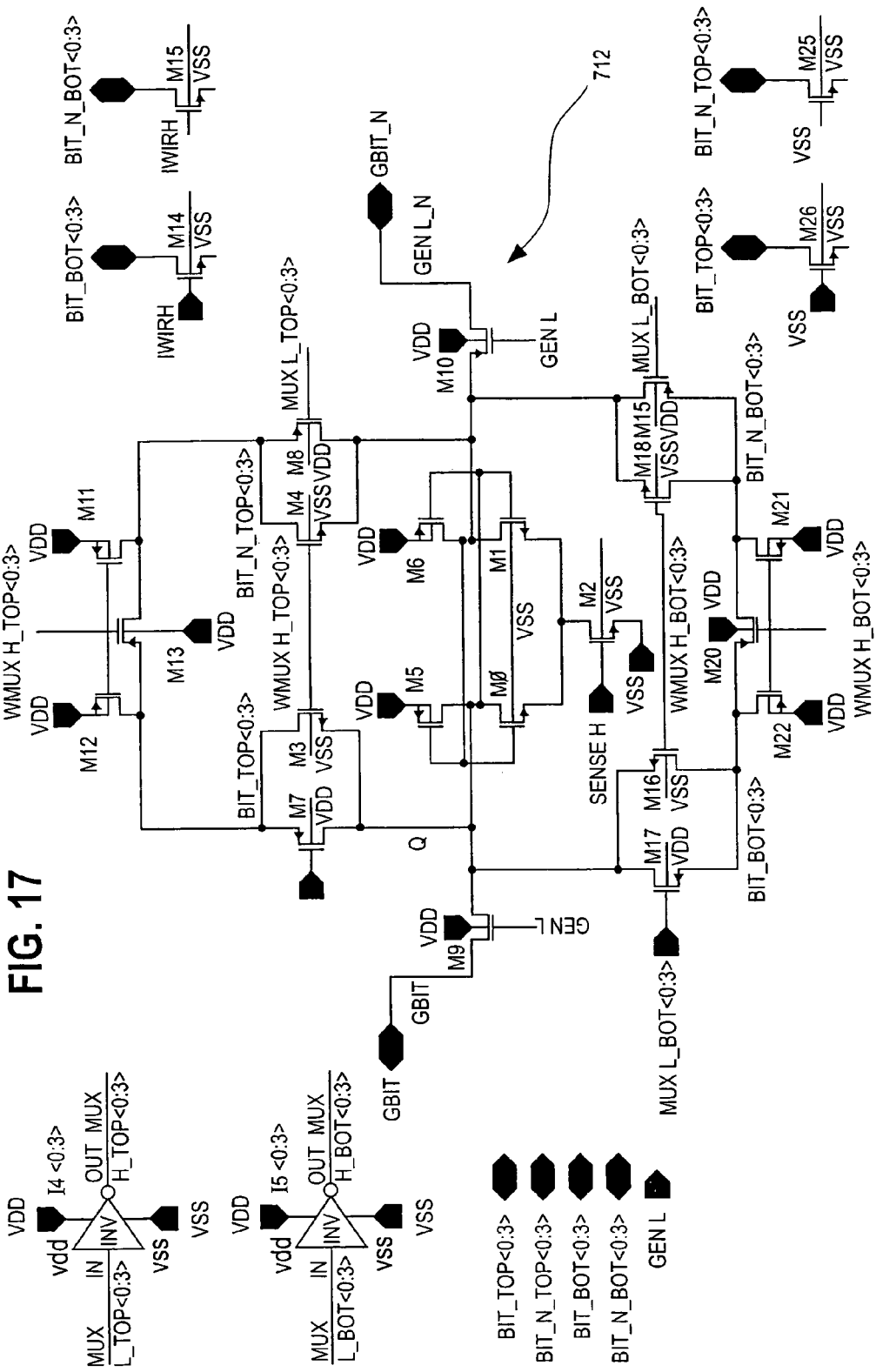
FIG. 17 illustrates a circuit diagram of the local sense amp in accordance with one embodiment of the present invention.

It is contemplated that, in one embodiment, the replica lWlRH line 782 also extends to the metal jumper line (not shown). The replica jumper line has the same width and neighbor metal spacing as any local wordline jumper in the cell array. This line is used strictly as a capacitive load by the local controller 714 and does not impact the function of the LSA 712 in any way. More specifically, the replica jump line is adapted to reduce the resistance of the lwlRH poly line similar to the metal shunt line as provided earlier. A circuit diagram of one embodiment of an LSA 712 is illustrated in FIG. 17.

Local Controller

Figure 18:
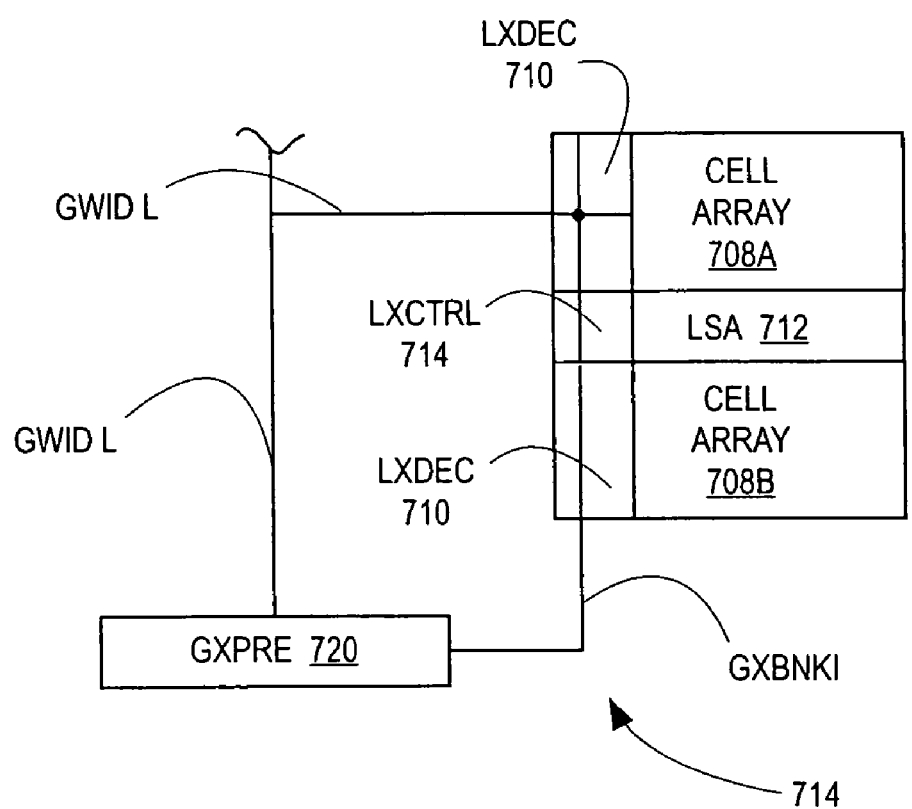
FIG. 18 illustrates a block diagram of a local controller in accordance with one embodiment of the present invention.

In one embodiment, each block has a single local controller or LxCTRL 714 as illustrated in FIGS. 7 and 18 that coordinates the activities of the local x-decoders 710 and sense-amps 713. In this embodiment, the LxCTRL 714 coordinates such activities by exercising certain lines including: (1) the bitR 760; (2) the bnkL_bot 756; (3) the bnkL_top 758; (4) the muxL_bot 765B; (5) the muxL_top 765A; (6) the senseH 766; (7) the genL 780; and (8) the lwlRH 782 control lines as illustrated in FIG. 7. Each of these lines is activated by a driver and control logic circuit in the LxCTRL circuit 714. In one embodiment, all these lines are normally inactivate when the SRAM module is in the idle state except for the genL line 780. The genL line 780 is active in the idle state. The LxCTRL 714 circuit is in turn activated by external Vertical and Horizontal signals. Vertical signals include: (1) lmuxL 784; (2) gmuxL 786; (3) rbankL 788; (4) gbitR 760; and (5) wbankL 792 signals. Horizontal signals include: (1) wlRH 794; (2) blkSelH_bot 756; and (3) blkSelH_top 758.

In one embodiment, all LxCTRL 714 circuits in the same column block share the Vertical signals. In this embodiment, the LxCTRL 714 in each block interfaces with four local mux lines 784 (alternatively referred to as "lmuxL<0:3>" or "lmuxl"). Only one of the four lmuxL lines 768 is active at any time. The LxCTRL 714 initiates or activates one lmuxL lines 768 to access a cell array 708, selecting one of the four cell array columns interfaced to each LSA 712 for access.

In one embodiment, similar to that discussed previously, the LSA 712 may activate the senseH 766 signals individually (i.e., 4:1 global multiplexing). In this embodiment, the LxCTRL 714 in each block interfaces with four global mux lines 786 (alternatively referred to as "gmuxL<0:3>" or "gmuxl"). It should be appreciated that only one of these four gmuxL lines 768 is active at any time, selecting or activating one out of every four global bitlines for access. In one embodiment the LSA 712 activates the senseH lines 766 in pairs (i.e., 2:1 global multiplexing). In this embodiment only two of the four gmuxL lines 768 are active at any time, selecting one out of every two global bitlines for access. For 1:1 global muxing, all four gmuxL lines 786 are always active, selecting all the global bitlines for access.

All LxCTRL circuits 714 in the same column block share the same read bank lines 788 or signals on the lines (alternatively designated "rbankL"). The rbankL line 788 is activated when a READ operation is requested (i.e., data is read from the block). At the end of the READ operation, the global bitlines selected by the gmuxL line 768s 786 contain limited swing differential signals. This limited swing differential signals represent the stored values in the cells selected by the lwlH line 726 and the lmuxL lines 784.

In one embodiment, a global bit replica line 790 or signal on the line is shared with all the LxCTRL circuits 714 in the same column block (alternatively designated "gbitR"). The gbitR line 760 is maintained externally at VDD when the SRAM memory is idle. The gbitR line 760 is made floating when a READ access is initiated. The LxCTRL 714 discharges this signal to VSS when a READ access request is concluded synchronous with the availability of READ data on gbit/gbit_n.

During a WRITE operation, the LxCTRL 714 activates write bank lines 792 or signals on the line (alternatively referred to as "wbnkL"). Limited swing differential signals are present on the global bitlines when the wbnkL line 792 is activated. The limited swing differential signals represent the data to be written.

It should be further appreciated that, in one embodiment, all the LxCTRL circuits 714 in the same row block column share the Horizontal signals. In one embodiment, all the LxCTRL 714 circuits share a replica of the global wordline wlH line 794 (alternatively referred to as "wlRH") that runs through each row of the memory. The physical layout of the wlRH line 794 replicates the global wordline in each row with respect to metal layer, width, and spacing. Thus the capacitive loading of the wlRH 794 and the global wlH signal are the same. On every memory access, the wlRH line 794 is activated simultaneously with a single global wlH for one row in the block.

Figure 19:
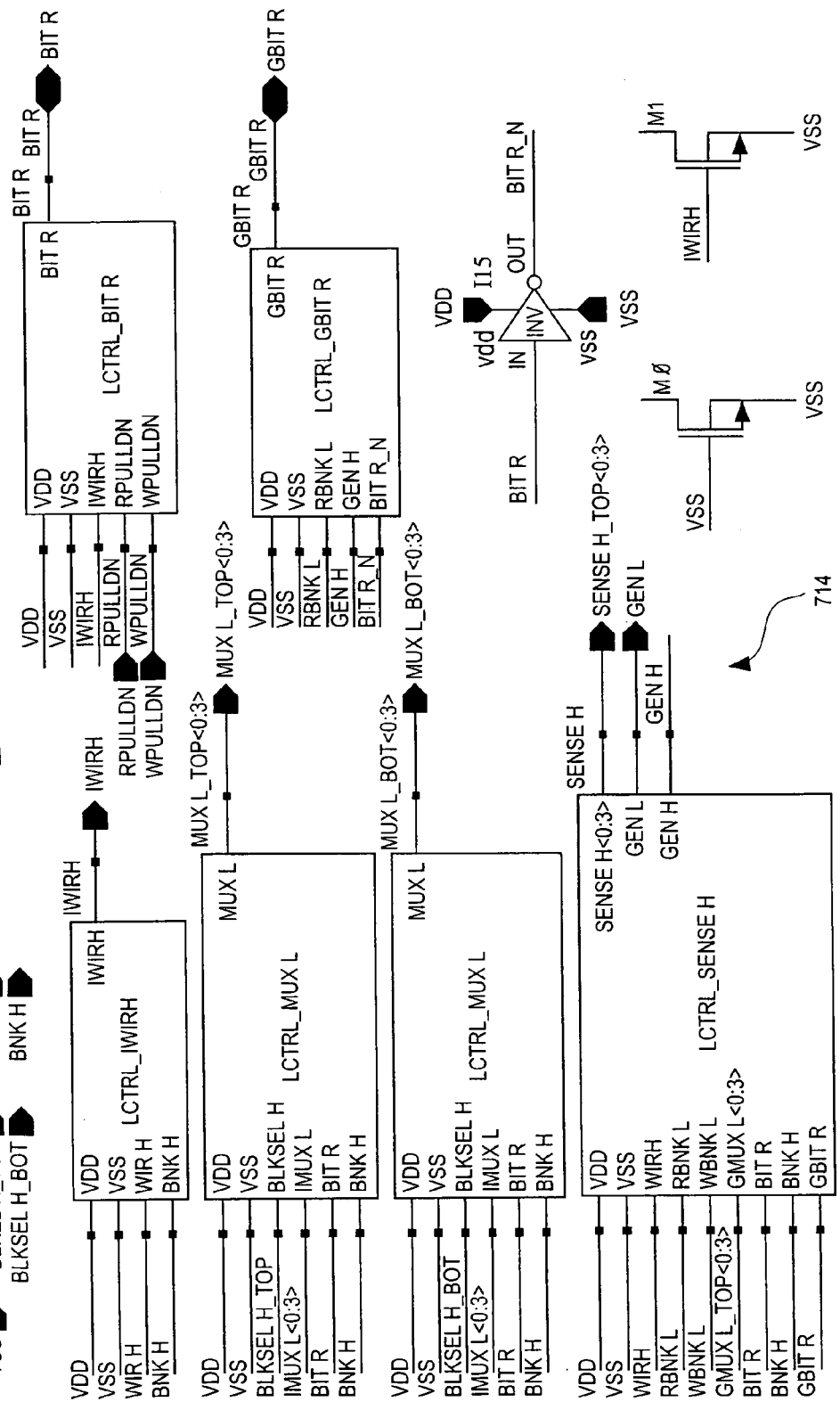
FIG. 19 illustrates a circuit diagram of the local controller in accordance one embodiment of the present invention.

The LxCTRL 714 indicates to the block whether the bottom or top sub-block 706B, 706A is being accessed using either the blkSelH_bot 756 or blkSelH_top 758 line or signals on the lines. Either one of these lines is active upon every memory access to the block, indicating whether the bottom sub-block 706B or top sub-block 706A transmission gates in the LSA 712 should be opened. A circuit diagram for one embodiment of the local controller is illustrated in FIG. 19.

Synchronous Control of the Self-Timed Local Block

One embodiment of the present invention includes one or more global elements or devices that are synchronously controlled while one or more local elements are asynchronously controlled (alternatively referred to as "self-timed"). It should be appreciated that the term synchronous control means that these devices are controlled or synchronous with a clock pulse provided by a clock or some other outside timing device. One advantage to having a synchronous control of elements or devices on the global level is those elements, which are affected by resistance, may be adjusted.

For example, slowing or changing the clock pulse, slows or changes the synchronous signal. Slowing or changing the synchronous signal slows or changes those devices or elements controlled by the synchronous signals, providing more time for such devices to act, enabling them to complete their designated function. In one embodiment, the global controller is synchronous. In another embodiment, the global controller, the global decoder and the global sense amps are synchronous.

Alternatively, the local devices or elements are asynchronous controlled or self-timed. The self-timed devices are those devices where there is little RC effects. Asynchronous controlled devices are generally faster, consume less power. In one embodiment, the local block, generally including the local controller, local decoder, local sense amps, the sense enable high and the cell arrays, are asynchronously controlled.

Read Cycle Timing

Cycle timing for a read operation in accordance with one embodiment of the present invention includes the global controller transmitting or providing a high signal and causing LwlH line to fire and one or more memory cells is selected. Upon receiving a signal on the LwlH line, one or more of the bit/bit_n line pairs are exposed and decay (alternatively referred to as the "integration time"). At or about the same time as the bit/bit_n begin to decay, bitR begins to decay (i.e. upon receiving a high signal on the lwlRH line). However, the bitR decays approximately 5 to 6 times faster than the bit/bit_n, stopping integration before the bit/bit-n decays completely (i.e., sensing a swing line voltage) and initiates amplifying the voltage.

BitR triggers one or more of the SenseH lines. Depending on the muxing, all four SenseH lines fire (1:1 muxing), two SenseH lines fire (2:1 muxing) or one SenseH line fires (4:1 muxing).

After the SenseH line signal fires, the sense amp resolves the data, the global enable Low or genL line is activated (i.e., a low signal is transmitted on genL). Activating the genL line exposes the local sense amp to the global bit and bit_n. The genL signal also starts the decay of the signal on the gbitR line. Again, the gbitR signal decays about 5 to 6 times faster than gbit signal, which turns off the pull down of the gbit. In one embodiment gbitR signal decays about 5 to 6 times faster than gbit signal so that signal on the gbit line only decays to about 10% of VDD before it is turned off.

The signal on gbitR shuts off the signal on the SenseH line and triggers the global sense amp. In other words the signal on the gbitR shuts off the local sense amp, stopping the pull down on the gbit and gbit_n lines. In one embodiment, the SenseH signal is totally asynchronous.

Figure 20:
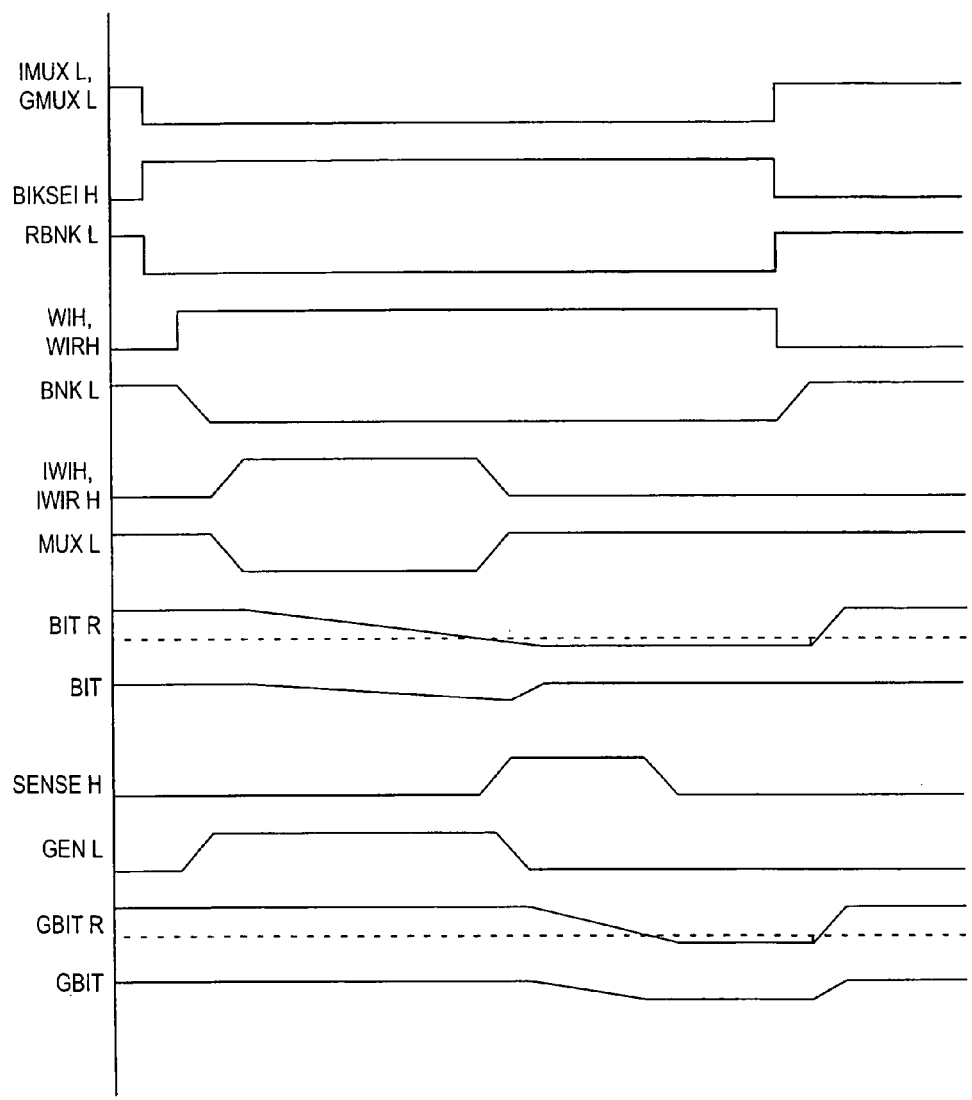
FIG. 20 illustrates the timing for a READ cycle using a SRAM memory module in accordance with one embodiment of the present invention.

The cycle timing for a READ operation using one embodiment of the present invention (similar to that of FIG. 7) is illustrated in FIG. 20. During the READ operation, one of the four lmuxL<0:3> lines 784 are activated, selecting one of the four cell array columns supported by each LSA 712. One, two, or four gmuxL<0:3> lines 786 are activated to select every fourth, every second, or every global bitline for access, depending on the global multiplexing option (i.e., 4:1, 2:1 or 1:1 muxing)

Either the blkSelH_bot 756 or blkSelH_top 758 is activated to indicate to the block that the bottom or top sub-block 706B, 706A respectively is being accessed. The rbankL line 788 line is activated to request a read operation from the block. The wlH line is activated for the memory row that is being accessed, while the wlRH line 794 is activated simultaneously for all the blocks in the row block containing the memory row.

The LxCTRL 714 deactivates the genL line 780 to isolate the local sense-amps from the global bitlines. The LxCTRL 714 activates the bnkL line to signal the LxDEC 710 to activate a local wordline. The LxCTRL 714 activates one of the four muxL<0:3> line corresponding to the activated muxL signal. This causes the LSA 712 to connect one of the four cell columns to the sense-amp amplifier core 762. The LxDEC 710 corresponding to the activated global wordline activates the local wordline. Simultaneously, the LxCTRL 714 activates the lwlRH line 794 782. All the cells in the row corresponding to the activated local wordline begin to discharge one bitline in each bitline pair corresponding to the stored value of the 6T cell.

After a predetermined period of time a sufficient differential voltage is developed across each bitline pair. In one example, a differential voltage of about 100 mV is sufficient. It should be appreciated that this predetermined period of time is dependant on process corner, junction temperature, power supply, and the height of the cell array.

Simultaneously, the lwlRH 782 signal causes the LxCTRL 714 to discharge the bitR line 760 with an NMOS transistor that draws a certain current at a fixed multiple of the cell current. The bitR 760 line therefore discharges at a rate that is proportional to the bitline discharge rate. It should be appreciated that the constant of proportionality is invariant (to a first order) with regards to process corner, junction temperature, power supply, and the height of the cell array 708.

When the bitR signal 760 crosses a predetermined threshold, the LxDEC 710 deactivates the local wordline and the 6T cells stop discharging through the bitlines. In this manner, a limited swing differential voltage is generated across the bitlines independent (to a first order) of the process corner, junction temperature, power supply, and the height of the cell array. In one example, a differential voltage of about 100 mV is sufficient. Simultaneously, the LxCTRL 714 deactivates the muxL line 768 so that the corresponding bitlines are disconnected from the amplifier core 762 and are equalized and precharged.

At the same time that the LxCTRL 714 deactivates the muxL line 768, the LxCTRL 714 activates the senseH lines 766 and, depending on the global multiplexing, the amplifier core 762 rapidly amplifies the differential signal across the sensing nodes. As soon as the amplifier core 762 has started to sense the differential signal, the LxCTRL 714 activates the genL line 780 so that the local sense-amps are connected to the global bitlines. The amplifier core 762, depending on the global multiplexing, continues to amplify the differential signals onto the global bitlines. The LxCTRL 714 discharges the gbitR 760 signal to signal the end of the READ operation. When the gbitR 760 signal crosses a predetermined threshold, the LxCTRL 714 deactivates the senseH 766 signals and the amplifier core 762 of the LSA array stop amplifying. This results in a limited-swing differential signal on the global bitlines representative of the data read from the cells.

When the wlRH line 794 is deactivated, the LxCTRL 714 precharges the bitR line 760 to prepare for the next access. When the rbankL line 788 is deactivated, the LxCTRL 714 deactivates the bnkL line to prepare for the next access.

Write Cycle Timing

Cycle timing for a write operation in accordance with one embodiment of the present invention includes the global controller and global sense amp receiving data or a signal transmitted on wbnkL, transmitting or providing a high signal on an LwlH line and selecting one or more memory cells. The write operation is complete when the local word line is high.

Data to be written into a memory cell is put onto the gbit line synchronously with wbnkL. In this embodiment, the wbnkL acts as the gbitR line in the write operation. In this embodiment, the wbnkL pulls down at the same time as gbit but about 5 to 6 times faster.

The low signal on the wbnkL line triggers a signal on the SenseH and a local sense amp. In other words, genL goes high, isolating the local sense amp. A signal on the wbnkL also triggers bnkL, so that lwlH goes high when wlH arrives. After the signal on the SenseH is transmitted, the lmux switch opens, so that data from the local sense amplifier onto the local bitlines. BitR is pulled down. In one embodiment, bitR is pulled down at the same rate as bit. In other words bitR and bit are pull down at the same rate storing a full BDT. LwlL goes high and overlaps the data on the bitlines. BitR turns off LwlH and closes the lmux switch and SenseH.

Figure 21:
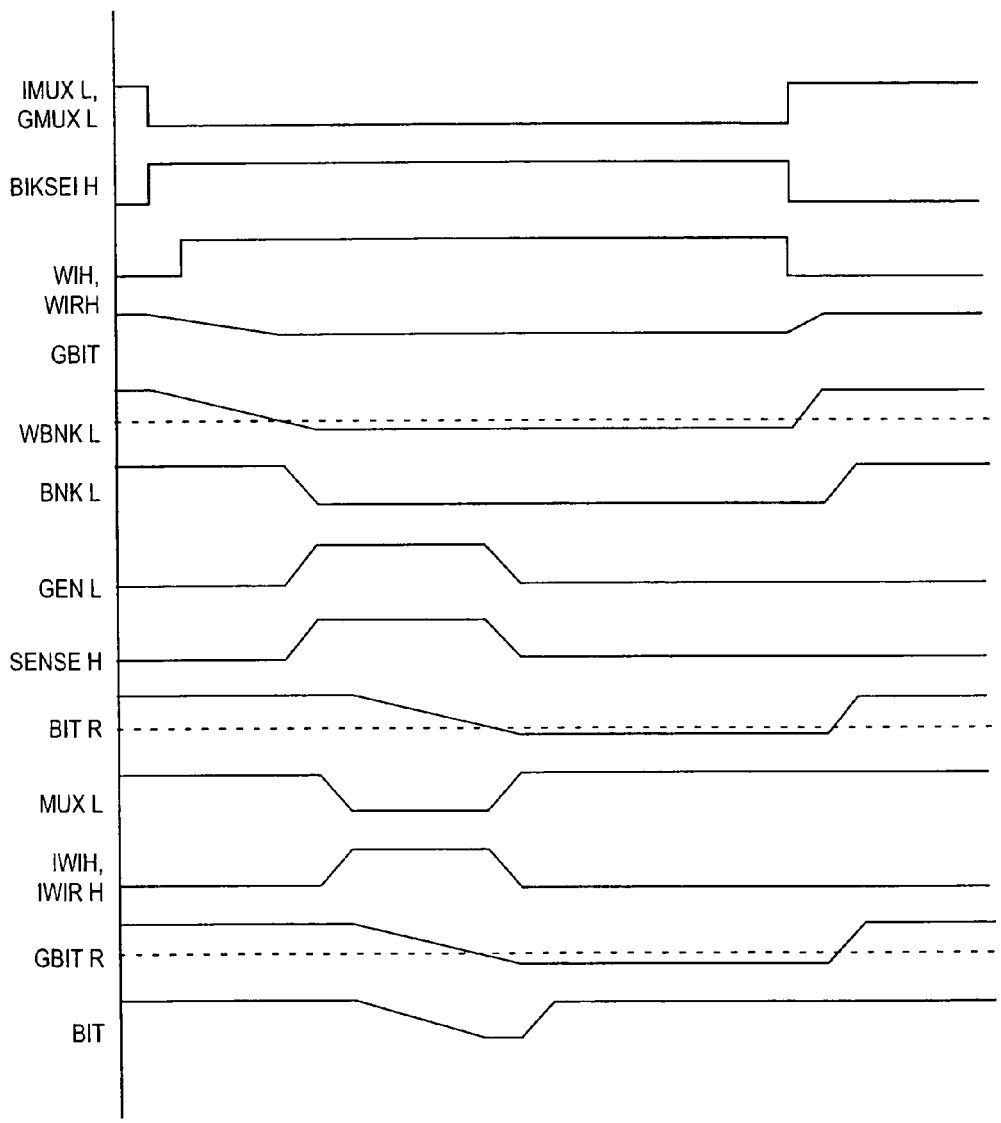
FIG. 21 illustrates the timing for a WRITE cycle using a SRAM memory module in accordance with one embodiment of the present invention.

The cycle timing for a WRITE operation using one embodiment of the present invention is illustrated in FIG. 21. One of four lmuxL<0:3> lines 784 is activated to select one of the four cell array columns supported by each LSA 712. One, two, or four gmuxL<0:3> lines 786 are activated to select every fourth, every second, or every global bitline for access (i.e., 4:1, 2:1 or 1:1 muxing) depending on the global multiplexing option. The blkSelH_bot 756 or blkSelH_top 758 line is activated to indicate to the block whether the bottom 706B or top sub-block 706A is being accessed. The global word line is activated for a particular memory row being accessed.

The wlRH line 794 is activated simultaneously for all the blocks in the row block containing the memory row. The GSA 724 presents limited swing or full swing differential data on the global bit lines. The wbnkL line 792 is activated to request a WRITE operation to the block. The LxCTRL 714 immediately activates the senseH lines 766 depending on the global multiplexing, and the amplifier core 762 rapidly amplifies the differential signal across the sensing nodes. Only the data from global bitlines selected by the global multiplexing are amplified.

The LxCTRL 714 activates the bnkL line to signal the LXDEC 710 to activate a local wordline. The LxCTRL 714 activates one of the four muxL<0:3> lines 768 corresponding to the activated lmuxL line 784. This causes the LSA 712 to connect one of the four cell columns to the sense-amp amplifier core 762. The amplifier core 762 discharges one bitline in every select pair to VSS depending on the original data on the global wordlines. The LXDEC 710 corresponding to the activated global wordline activates the local wordline. The data from the local bitlines are written into the cells.

Simultaneously with writing the data from the local bitlines into the cells, the LxCTRL 714 activates the lwlRH line 794. This signal causes the LxCTRL 714 to rapidly discharge the bitR line 760. When the signal on the bitR line 760 crosses a predetermined threshold, the LXDEC 710 deactivates the local wordline. The data is now fully written to the cells. Simultaneously, the LxCTRL 714 deactivates the senseH 766 and muxL lines 768 and reactivates the genL line 780. When the wlRH line 794 is deactivated, the LxCTRL 714 precharges the bitR line 760 to prepare for the next access. When the rbankL line 788 is deactivated, the LxCTRL 714 deactivates the bnkL line to prepare for the next access. In one embodiment, bnkL provides local bank signals to the local decoder. It is contemplated that the bnkL may comprise bnkL-top and bnkL-bot as provided previously.

Burn-in Mode

Returning to FIG. 7, one embodiment of the present invention includes a burn-in processor mode for the local blocks activated by a burn in line 796 (alternatively referred to as "BIL"). This process or mode stresses the SRAM module or block to detect defects. This is enabled by simultaneously activating all the lmuxL<0:3>784, blkSelH_bot 756, blkSelH_top 758, and rbankL lines 788, but not the wlRH line 794 (i.e., the wlRH line 794 remains inactive). In that case, BIL 796 will be asserted, allowing the local word lines to fire in the LxDEC 710 array. Also, all the LSA muxes will open, allowing all the bitlines to decay simultaneously. Finally, since wlRH 794 is not activated, bitR 760 will not decay and the cycle will continue indefinitely until the high clock period finishes.

Local Cluster

In one embodiment, a block may be divided into several clusters. Dividing the block into clusters increases the multiplexing depth of the SRAM module and thus the memory. Although the common local wordlines runs through all clusters in a single block, only sense amps in one cluster are activated. In one embodiment, the local cluster block is a thin, low-overhead block, with an output that sinks the tail current of all the local sense-amps 712 in the same cluster. In this embodiment, the block includes global clusterL 799 and local clusterL 798 interfaces or lines (best viewed in FIG. 7).

Prior to a READ or WRITE operation, a global clusterL line 799 (alternatively referred to as "gclusterL") is activated by the external interface for all clusters that are involved in the READ/WRITE operation. The local cluster includes a gclusterL line 799 or signal on the line that is buffered and driven to clusterL 798. The clusterL line 798 connects directly to the tail current of all the local sense-amps 712 in the cluster. If the cluster is active, the sense-amps will fire, but if the cluster is inactive the sense-amps will not fire.

Since the cluster driver is actually sinking the sense-amp tail current, the NMOS pull down must be very large. The number of tail currents that the cluster can support is limited by the size of the NMOS pull down and the width of the common line attached to the local sense-amp tail current.

It should be appreciated that the muxing architecture described above can be used on its own without the amplifier portion of the LSA 712 as illustrated in FIG. 2. In this embodiment, the local bitline transmission gates are used to directly connect the local bitlines to the global bitlines. The GSA's 724 performs all the functions of the local sense-amp. The area of the LSA 712 and LxCTRL 714 decrease as less functionality is required of these blocks. For small and medium scale memories, the access time may also decrease because one communication stage has been eliminated. That is the bitlines now communicate directly with the GSA 724 instead of the LSA 712. The reduced interface and timing includes the LxDEC 710 as provided previously but different LSA 712 and LxCTRL 714.

In this embodiment, the local bit lines are hierarchically portioned without the LSA. Since gbit has a lower capacitance than lbit (due to being spread apart and no diffusion load for example) such hierarchical memories are generally faster and lower power performance in comparison to simple flat memories.

In one embodiment, the cluster includes a one-dimensional array of LSA's 712 composed of four pairs of bitline multiplexers. Each bitline multiplexer may connect a corresponding bitline pair to the global bitline through a full transmission gate. When a bitline pair is disconnected from the global bitline, the bitline multiplexer actively equalizes and precharges the bitline pair to VDD. Because there are four times fewer global bitlines than local bitlines, the global bitlines are physically wider and placed on a larger pitch. Again, this significantly reduces the resistance and capacitance of the long global bitlines, increasing the speed and reliability of the memory.

The LSA 712 is controlled by the muxL and lwlH signals shared across the entire LSA 712 array. The muxL<0:3> line 768 selects which of the four pairs of local bitlines to use on the current access. Any local bitline not selected for access is always maintained in a precharged and equalized state by the LSA 712. In one example, the local bitlines are precharged to VDD.

The lWlRH line 794 line represents a dummy poly line that replicates the poly local wordline that runs through each row of the block. The lwlRH line 794 forms the gate of dummy transistors that terminate each column of the cell array. Each dummy transistor replicates the access transistor of the 6T SRAM cell.

In a global cluster mode, each block has a single local controller that coordinates the activities of the local x-decoders and multiplexers by exercising the bitR 760, bnkL, muxL 768, and lwlRH 782 control signals. Each of these signals is activated by a driver and control logic circuit in the LxCTRL circuit 714. All these signals are normally inactive when the memory is in the idle state. The LxCTRL circuit 714 is in turn activated by Vertical and Horizontal signals.

The Vertical signals are these signals shared by all LxCTRL 714 circuits in the same column block, including the lmuxL 784, rbnkL 788, rgbitR 760, gbitR 760 and wbnkL 792 lines or signals on the line. Only one of the four signals lmuxL<0:3> lines 784 is active at any time. The active line selects one of four cell array columns interfaced to each LSA 712 for access. The rbnkL line 788 is activated when a READ operation is requested from the block. At the end of the READ operation, all global bitlines that are not actively precharged by the GSA 724 containing limited swing differential signals representing the stored values in the cells selected by the wlH line and the lmuxL signals.

The rgbitR line 760 is externally maintained at VDD when the memory is idle and is made floating when a read access is initiated. The LxCTRL 714 block connects this line to bitR 760 and discharges this signal line to VSS when a READ access in concluded.

The wgbitR line 760 is externally maintained at VDD when the memory is idle and is discharged during a write access. The LxCTRL 714 block connects this line to bitR 760, and relies on the signal arriving at VSS to process a WRITE operation.

The wbnkL line 792 is activated when a WRITE operation is requested from the block. Full swing differential signals representing the data to be written are present on the global bitlines when this line is activated.

All LxCTRL 714 circuits in the same row block share Horizontal signals. The wlRH line 794 is a replica of the global wordline wlH that runs through each row of the memory. The physical layout of the line with respect to metal layer, width, and spacing, replicates the global wordline in each row, so as to make the capacitive loading the same. This line is activated simultaneously with a single global wordline for one row in the block on every memory access. The blkSelH line is active on every memory access to the block and indicates that the transmission gate should be opened.

Figure 22A:
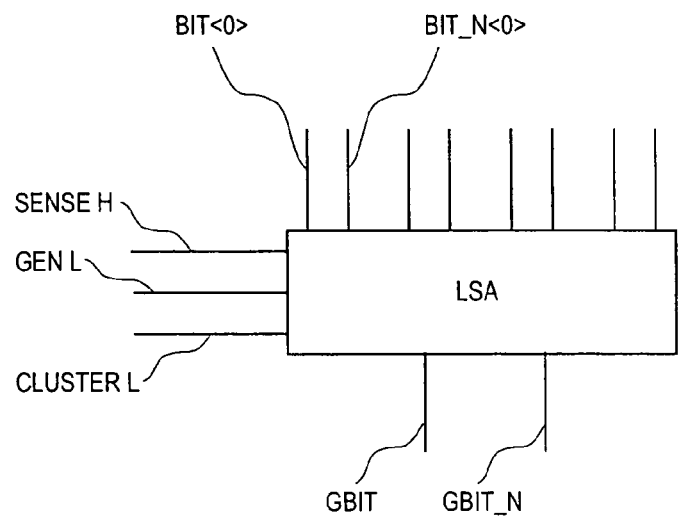
FIG. 22A illustrates a block diagram of local sense amp having 4:1 local muxing and precharging incorporated therein in accordance with one embodiment of the present invention.
Figure 22B:
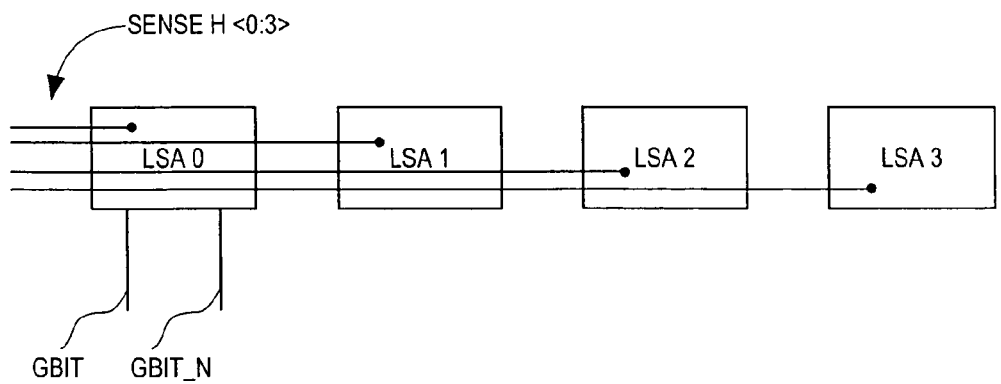
FIG. 22B illustrates one example of 16:1 muxing (including 4:1 global muxing and 4:1 local muxing) in accordance with one embodiment of the present invention.
Figure 23:
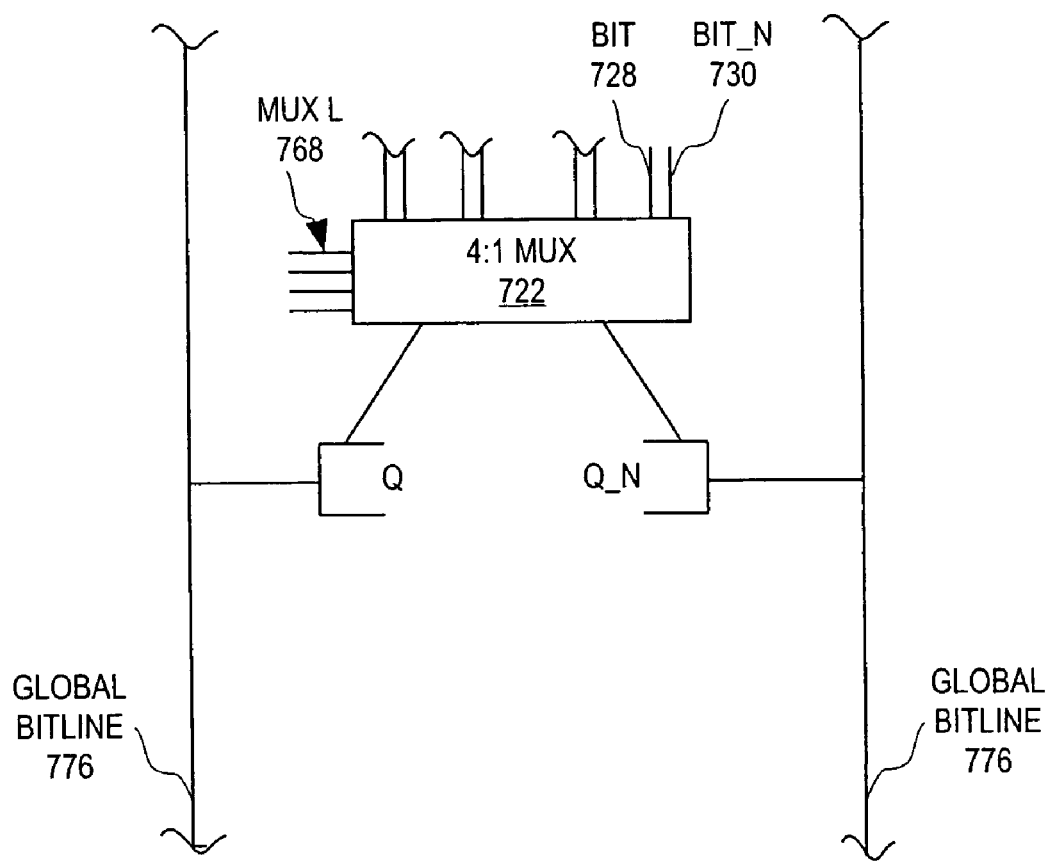
FIG. 23 illustrates a local sense amp used with a cluster circuit in accordance with one embodiment of the present invention.

FIGS. 22A, 22B and 22C illustrate different global and muxing arrangements. FIG. 22A illustrates one embodiment of a local sense amp including 4:1 muxing and precharge and equalizing. The LSA is represented here as a single device having four bit/bit_n pairs; one SenseH line, one GenL line, one clusterL line and one gbit/gbit_n pair coupled thereto. FIG. 22 illustrates one example of 4:1 muxing (alternatively referred to as 4:1 local muxing) built into the LSA. In one embodiment, each LSA is coupled to 4 bit/bit_n pairs. During a READ/WRITE operation, one bitline pair of the four possible bitline pairs coupled to each LSA is selected. However, embodiments are contemplated in which the clusters are used without dropping the LSA's (i.e., the clusters are used with the LSA's).

FIG. 22B illustrates one embodiment of the present invention including 16:1 muxing. Again, each LSA is coupled to 4 bitline pairs (the 4:1 local muxing provided previously). Here, four SenseH lines <0:3> are illustrated coupled to the LSA's where one SenseH line is coupled to one LSA. This is referred to as 16:1 muxing comprising 4:1 global muxing due to the SenseH lines and 4:1 local muxing. When one of the SenseH line fires, one of the four LSA's is activated, enabling one of the four bitline pairs coupled to the activated LSA to be selected. In other words, this combination enables at least one bitline pair to be selected from the 16 total bitline pairs available.

FIG. 22C illustrates one embodiment of the present invention including 32:1 muxing. Again, each LSA is coupled to 4 bitline pairs (the 4:1 local muxing provided previously). Here, four SenseH lines <0:3> are illustrated coupled to the LSA's where one SenseH line is coupled to two LSA. For example, one SenseH line is coupled to LSA 0 and 4, one SenseH line is coupled to LSA 1 and 4, etc. This embodiment includes two local cluster devices, where the first local cluster device is coupled to LSA's 1–3 via a first ClusterL line while the second local cluster device is coupled to LSA's 4–7 via a second ClusterL line. When ClusterL is low, the associated LSA's fire.

The cluster devices are also illustrated coupled to the SenseH lines <0:3> and the GCTRL. GCTRL activates one or more local cluster devices, which in turn fires the associated ClusterL line. If the associated SenseH line fires, then the LSA is active and one bitline pair is selected. For example, if the GCTRL activates the first cluster device, then the first ClusterL line fires (i.e., ClusterL is Low). If SenseH <0> also fires, then LSA 0 is active and one of the four bitline pairs coupled to LSA 0 is selected. In other words, this combination enables at least one bitline pair to be selected from the 32 total bitline pairs available.

While only 4:1, 16:1 and 32:1 muxing are illustrated, any muxing arrangement is contemplated (i.e., 8:1, 64:1, 128:1, etc.) Further, while only two cluster devices and two ClusterL lines are illustrated, any number or arrangement is contemplated. For example, the number of cluster devices and cluster lines may vary depending on the number of local blocks in the memory architecture or the muxing requirements. Flexible, partially and more choices for a given memory request.

Configurable Modular Predecoding

Figure 24:
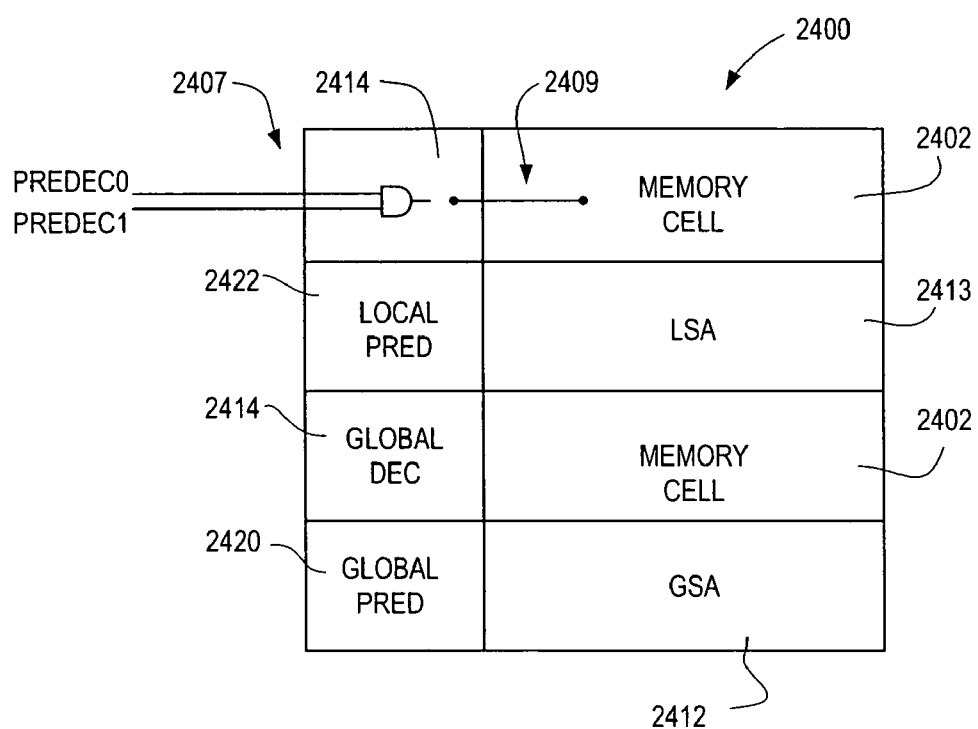
FIG. 24 illustrates a block diagram of one example of a memory module or architecture using predecoding blocks.

FIG. 24 illustrates a block diagram detailing one example of a memory module or architecture 2400 using predecoding. In this embodiment, the memory module or architecture comprises at least one global sense amplifier 2412, a local sense amplifier 2413, a global predecoder 2420 and a local predecoder 2422. It should be appreciated that, while one global sense amplifier, local sense amplifier, and global predecoder are illustrated, more than one, or different combinations, of the global sense amplifier, local sense amplifier, and global predecoder are contemplated.

One or more global x-decoders 2414 are depicted connected to the one or more memory cells 2402 via one or more global wordlines 2409. While only two global x-decoders 2414 are illustrated, with one global wordline 2409 coupled thereto, other arrangements are contemplated.

As illustrated, address predecoding may be performed in the global and local predecoders 2420 and 2422 respectively. In one embodiment, this may include generating signals used by local decoders to select rows and columns in the memory cell array, which may be communicated to the global x-decoders 2414 using one or more predecoder lines 2407 (two predecoder lines 2407 are illustrated, designated predec0 and predec1).

The predecoder block parameters are heavily dependent on the way the memory is partitioned. For example, the block parameters may vary depending on the number of rows in a subblock, number of subblocks, multiplexing depth, etc.

Figure 25:
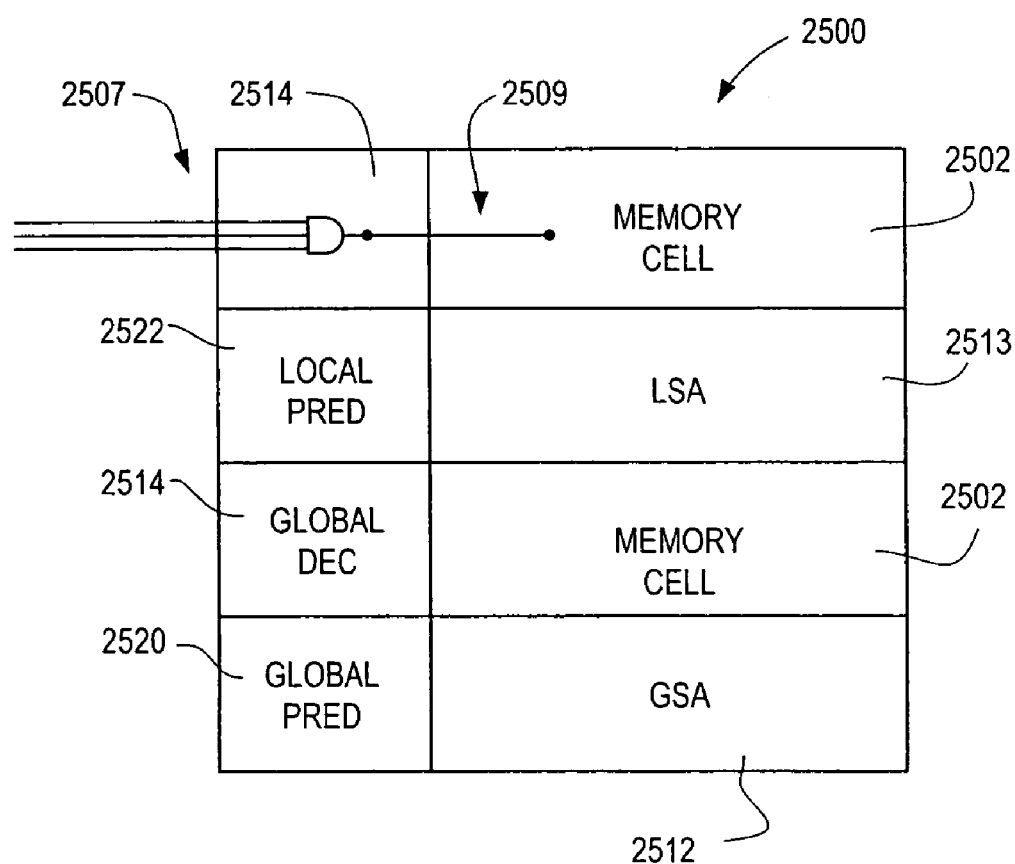
FIG. 25 illustrates a block diagram of another example of a memory module using predecoding blocks similar to that illustrated in FIG. 24

FIG. 25 illustrates a block diagram detailing one example of a memory module or architecture 2500 using predecoding similar to that illustrated in FIG. 24. In this embodiment, the memory module or architecture comprises at least one global sense amplifier 2512, a local sense amplifier 2513, a global predecoder 2520 and a local predecoder 2522. Again different arrangements of the modules are contemplated.

Again, two global x-decoders 2514 are depicted connected to the memory cell 2502 via one or more global wordlines 2509. While only two global x-decoders 2514 are illustrated, with one global wordline 2509 coupled thereto, other arrangements are contemplated. Further, the global and local predecoders 2520 and 2522 may perform address predecoding, which may be communicated to the one or more decoders 2514 using the illustrated predecoder lines 2507. In one embodiment, signals are generated on the predecoded lines 2507 and shipped up. The global x-decoders 2514 tap the predecoded lines 2507, generating signals on the global wordlines 2509.

Figure 26A:
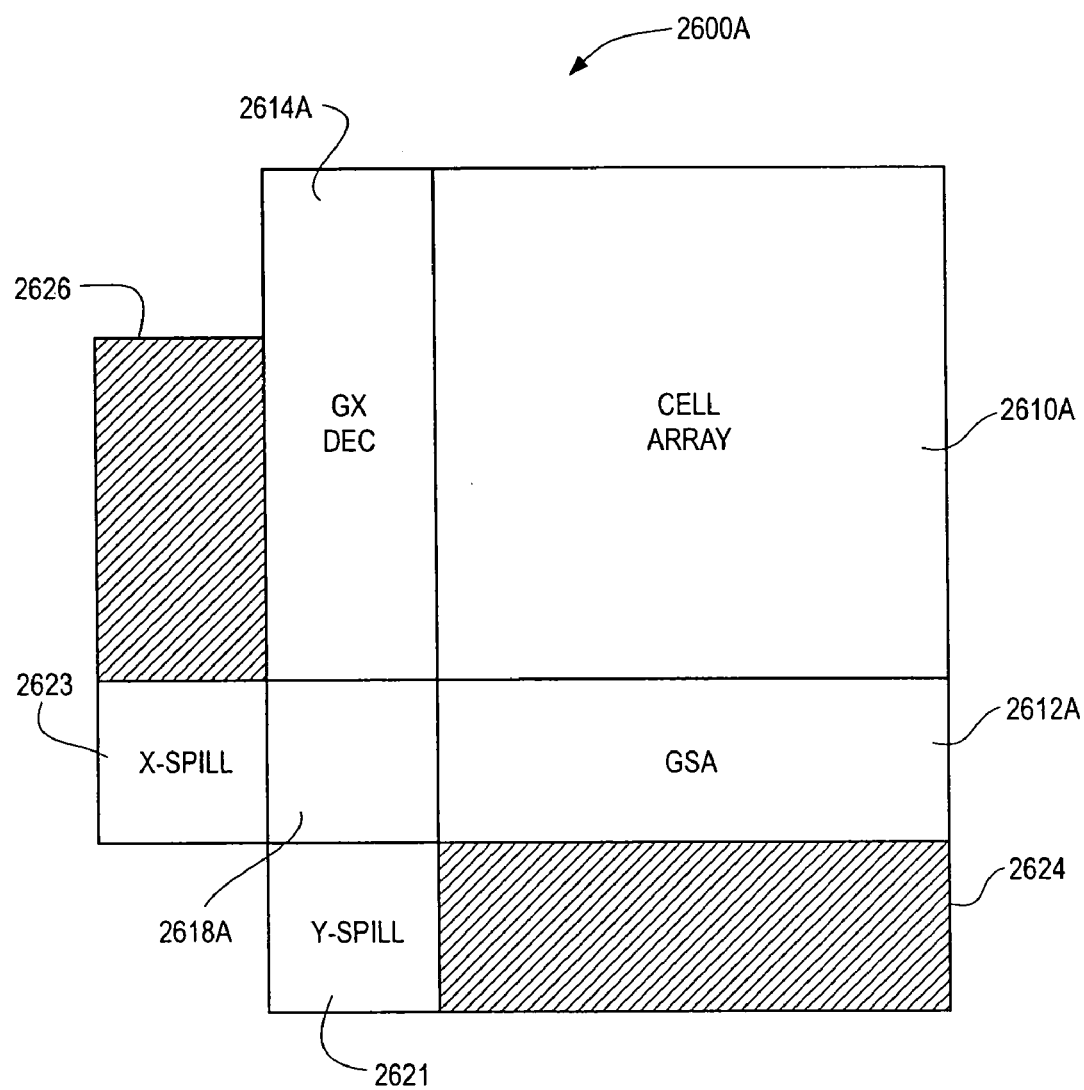
FIG. 26A illustrates a high-level overview of a memory module with predecoding and x- and y-Spill areas.

FIG. 26A illustrates a high-level overview of a known or prior art memory module 2600A having predecoding. In this embodiment, the memory module 2600A includes only cell array 2610A, a global decoder 2614A, a global sense amplifier 2612A and a predecoder area 2618A.

It is contemplated that thee size of the predecoder area 2618A varies widely depending on the exact memory partitioning. Many different possible partitioning options are contemplated. If all of the needed predecoders are to be included in the illustrated predecoder area 2618A, the predecoders could possibly spill over, forming spill areas that include predecoder circuitry placed outside the rectangle defined by the rest of the memory blocks. This may result in large area penalties.

More specifically, the hierarchical memory machine of FIG. 26A may include one or more predecoders (not shown) implemented in a single contiguous area (i.e., the predecoder area 2618A). In the illustrated example, the width and height of the predecoder area 2618A is the rectangular region defined by the global decoder 2614A and the global sense amplifier 2612A respectively. Any predecoder circuitry placed outside of this region creates a spillover area (x- and y-spill areas 2623 and 2621 respectively are illustrated) that is equal to the width and height of the memory multiplied by the spill-over distance as shown. The penalty areas (2624 and 2626) created by such spill-over may be relatively significant, especially in high area efficiency memories.

Figure 26B:
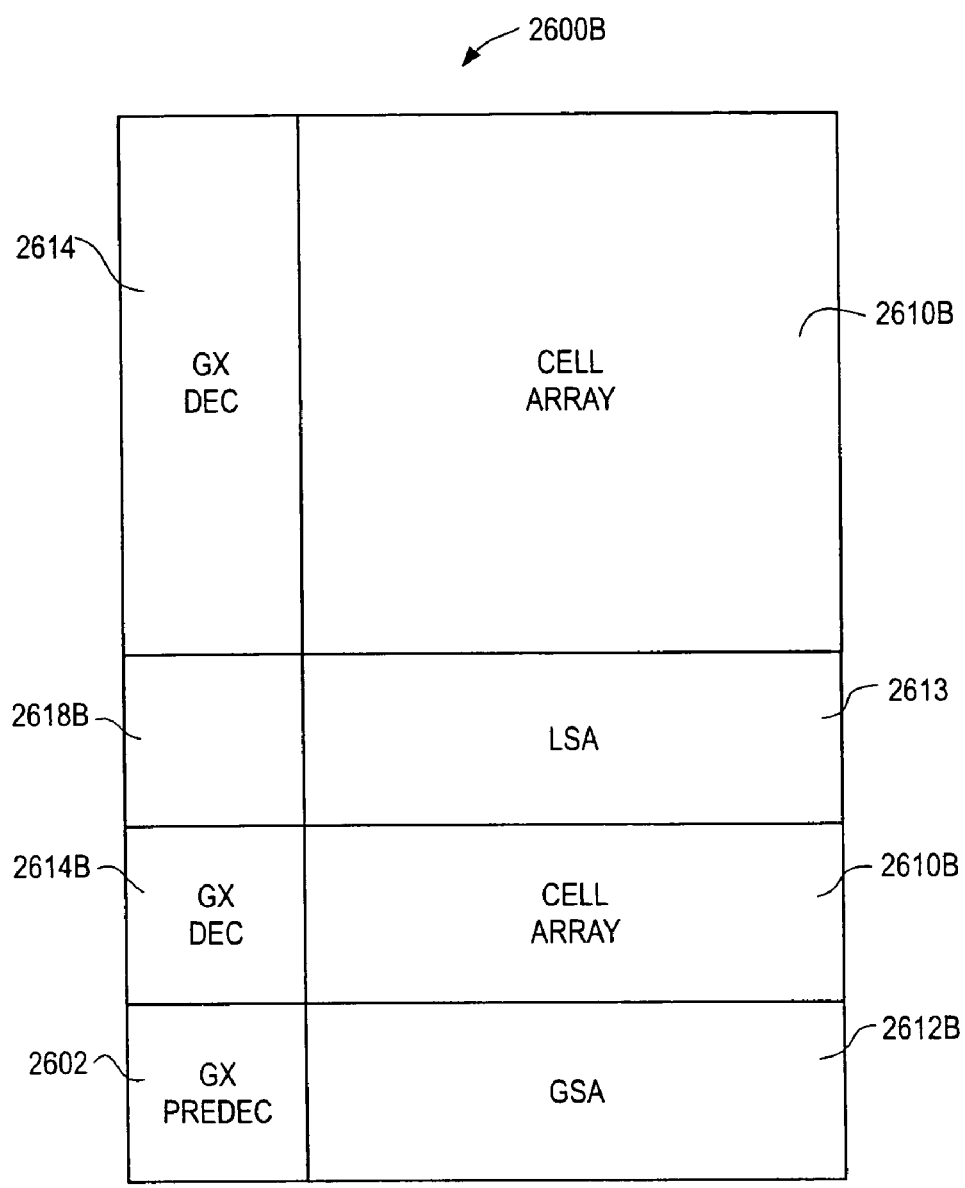
FIG. 26B illustrates a high-level overview of a memory module with global and local predecoders.

It is contemplated that predecoding may be distributed in at least the horizontal direction of the partitioning hierarchical memory architecture. FIG. 26B illustrates a high-level overview of a hierarchical memory module 2600B having such distributed predecoding. FIG. 26B further illustrates the memory module 2600B comprising one or more cell arrays 2610B, the global sense amp 2612B and one or more global decoders 2614B similar to module 2600A, in addition to one or more local sense amplifiers 2613. It is contemplated that, in one embodiment, bank decoders may be included in the global controller circuit block, which are included in every global sense amplifier (GSA 2612B for example).

However, in this embodiment, the memory module does not include a predecoder area 2618A, but instead utilizes a global predecoder 2620 and one or more local predecoders 2618B located at the intersection of, or in the region defined by, the one or more LSAs 2613 and the global decoders 2614B. As the memory scales in both the vertical and horizontal directions, the local predecoders 2618B may be added or subtracted as required. Having a single general purpose predecoder adapted to handle all memory partitions would take up too much space and add too much area overhead to the memory architecture. However, custom tailoring a single global predecoder to fit the needs of each differently partitioned memory would be impractical from a design automation point of view. One embodiment of this invention comprises separating the local predecoder capacity from the global predecoder as provided previously, which has modest effect on power dissipation. In one embodiment of the module architecture of the present invention this may comprise two or more sets of predecoders, a global predecoder and two sets of local predecoders for example. While only two sets of local predecoders are discussed, more than two (or less than two) are contemplated. In this embodiment, the block select information (i.e., the block select address inputs) are included in one set of the local predecoders, so that only the local predecoders for a selected block fire.

The second set (i.e., other local predecoder) does not include the block select information (i.e., all of the second set local predecoders fire in all of the blocks). The absence of block addresses in the second set decreases the local predecoder area so that more predecoders may be accommodated. The result is that a larger number of rows per subblock may be supported, significantly increasing the memory area efficiency. The greater the change in the number of rows per subblock, the greater the flexibility in trading off area, speed performance and power dissipation.

Figure 27:
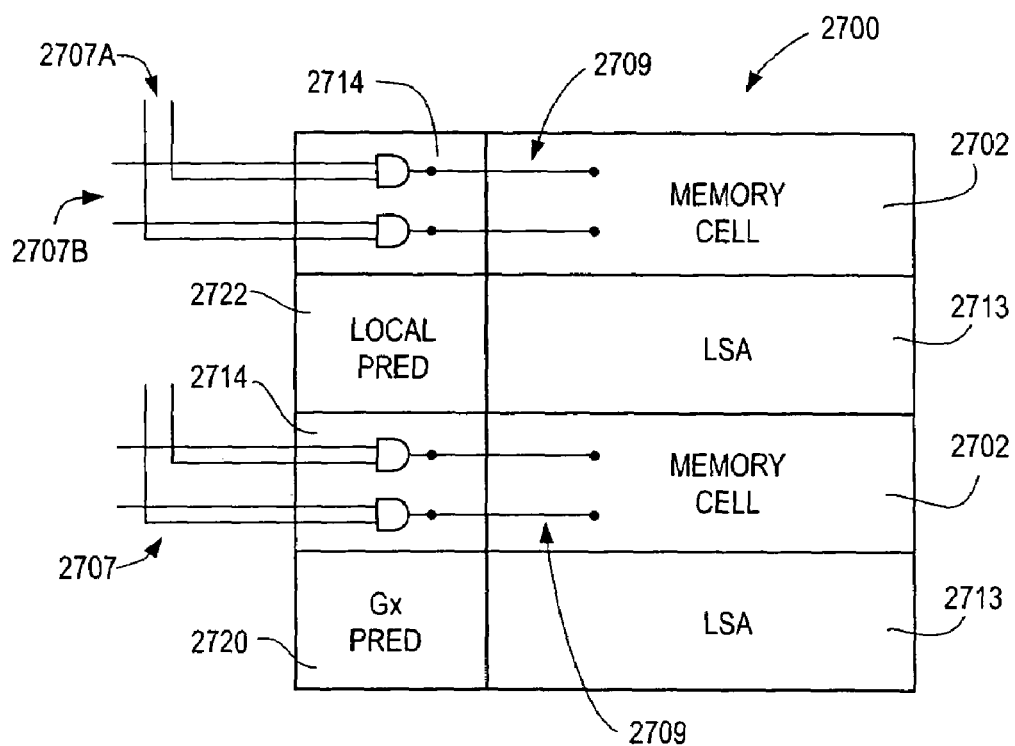
FIG. 27 illustrates one embodiment of a block diagram of a memory module using distributed local predecoding in accordance with the present invention.

FIG. 27 illustrates a block diagram of one embodiment of a memory module or architecture 2700 using global and distributed local predecoding in accordance with one embodiment of the present invention. In this embodiment, the memory module or architecture comprises one or more memory cells 2702, one or more local sense amplifiers 2713, a global predecoder 2720 and a local predecoder 2722. Again different arrangements other than those illustrated are contemplated.

Again, one or more global x-decoders 2714 are illustrated coupled to the one or memory cells 2702 via one or more global wordlines 2709. While only two global x-decoders 2714 are illustrated, with one global wordline 2709 coupled thereto, other arrangements are contemplated. In the illustrated embodiment, each of the global x-decoders 2714 has global predecoded lines 2707, comprising a first and second input set 2707A and 2707B respectively, coupled thereto and communicating therewith. In one embodiment, the first and second input sets 2707A and 2707B couple the global predecoder 2720 to the global x-decoders.

Figure 28:
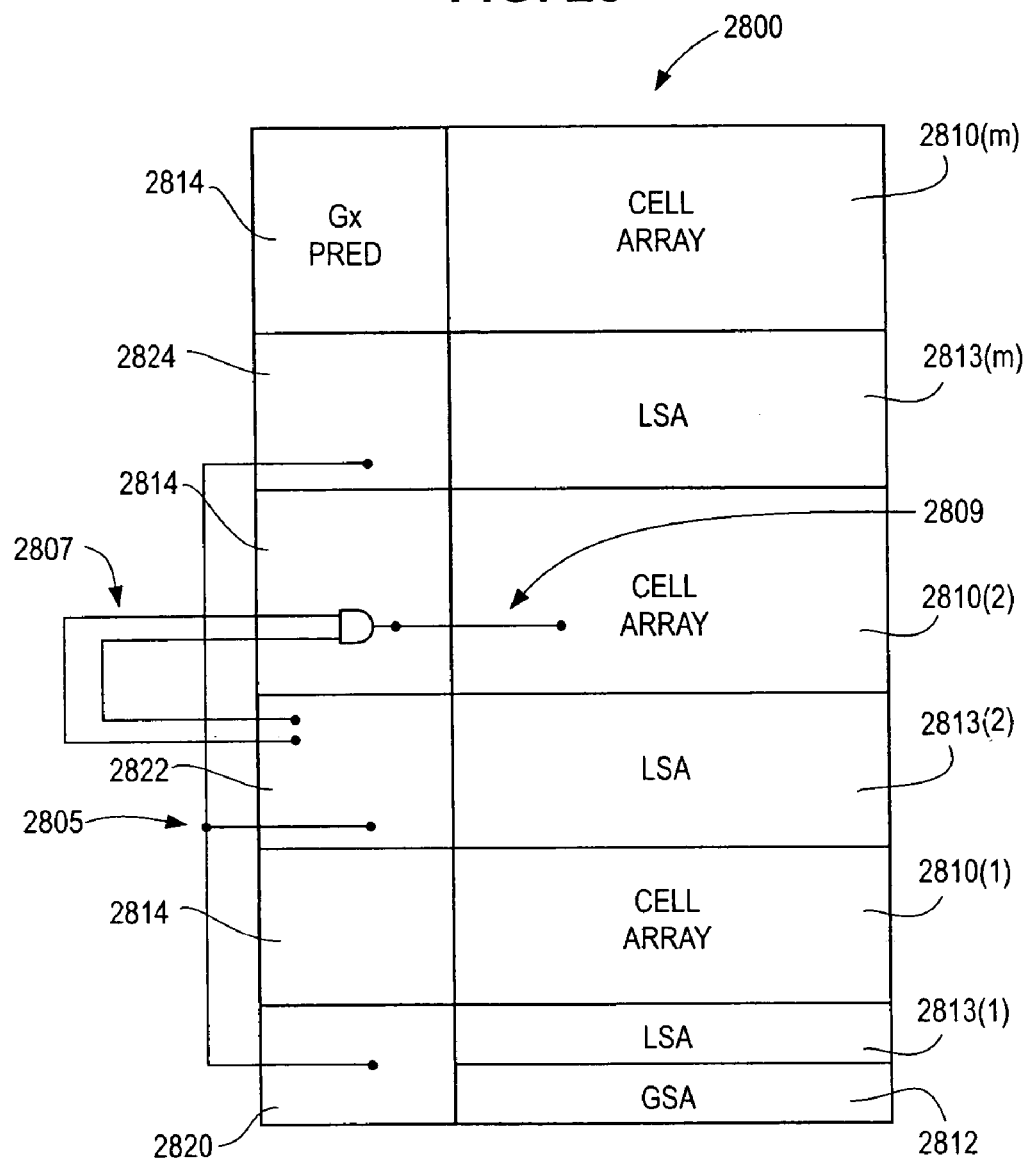
FIG. 28 illustrates one embodiment of a layout of a memory module with global and distributed, modular local predecoders in accordance with the present invention.

One embodiment of the present invention relates to a hierarchical modular global predecoder. The global predecoder comprises a subset of predecoding circuits (alternatively referred to as "local predecoders"). In this embodiment illustrated in FIG. 28, a memory module or architecture 2800 comprising one or more memory cell arrays 2810 (cell arrays 1-m are illustrated). The memory module 2800 further comprises a global predecoder 2820 placed at the intersection of the one or more global x-decoders 2814 and the global sense amplifier 2812. The global predecoder 2820, in one embodiment, includes the global predecoder circuitry, which forms part of a predecoding tree that doesn't vary much (i.e., varies slightly) from memory to memory.

In this embodiment, the predecoder distribution is optimized so that the allotted area for the memory module is mostly filled. The local predecoders are distributed into each subblock at the intersection of the global x-decoders 2814 and the local sense amplifiers 2813 (local sense amplifiers 1-m are illustrated). A block select predecoder is also included in this local predecoders 2822 and 2824. The block select is part of the decoder having an address inputs to the local predecoders. The distributed predecoding scheme is self-scaling. As the number of subblocks increase, the needed extra predecoders are added. Bank decoding is similarly distributed across the global controller block in a similar fashion to local predecoding. In one embodiment, the global predecodier ships out or transmits address (i.e., bank) signals to the global controller, which decodes such bank addresses to determine if a particular bank is selected.

In the illustrated embodiment, the buffered address lines 2805 are coupled to or communicate with the global predecoders 2820, and are the inputs to the local predecoders 2822 as illustrated. The local predecoder outputs 2807 form the input sets of predecoded lines coupled to or communicating with the global x-decoders. While only, one set of lines 2807 are illustrated, mores sets (one set coupled to each local predecoder 2822 for example) are contemplated. The global predecoders 2820 ships out or transmits one or more signals on one set of the global predecoded lines and address inputs for each of the local predecoders 2822.

Block Redundancy

Incorporating redundancy into memory structures to achieve reasonable higher yields in large memories is known. There are generally two main approaches to implementing such redundancy. First, it is known to replace the entire failing rows or columns. This approach is used when the partitioned memory subblocks are large, and where inserting extra rows and columns does not adversely effect area overhead.

However, when the partitioned memory subblocks are very small, the added rows and columns may make the entire row/column replacement approach less area effective and therefore less attractive. In such instances, it may be more effective to replace the entire block rather than replace specific rows or columns in the block. Known schemes for replacing blocks is generally accomplished using top level address mapping. However, top level address mapping may incur access time penalties.

The present invention relates to replacing small blocks in a hierarchically partitioned memory by either shifting the predecoded lines or using a modified shifting predecoder circuit in the local predecoder block. Such block redundancy scheme, in accordance with the present invention, does not incur excessive access time or area overhead penalties, making it attractive where the memory subblock size is small.

Figure 29:
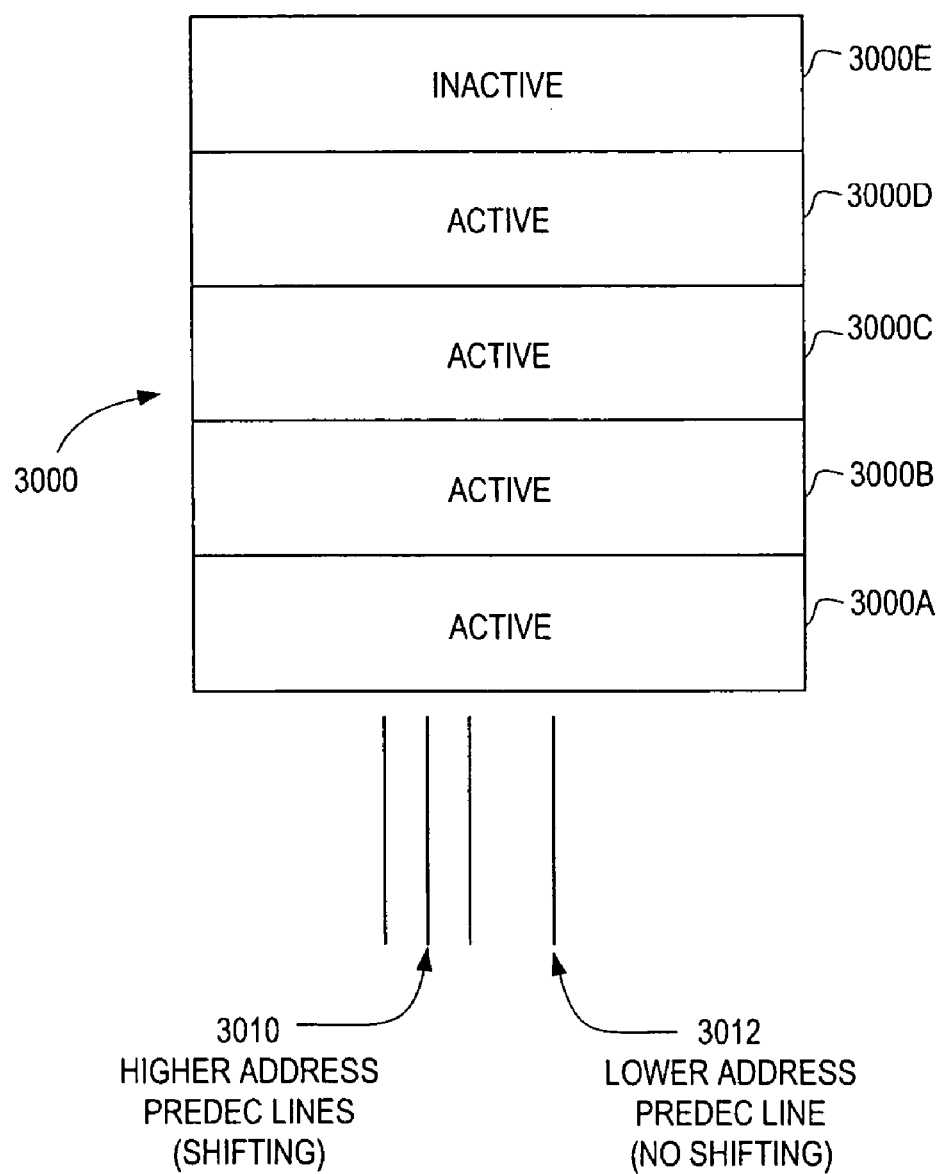
FIG. 29 illustrates a block diagram of a local predecoder block and the lower and higher address predecoded lines associated with such blocks in accordance with one embodiment of the present invention.

FIG. 29 illustrates one embodiment of a block diagram of a local predecoder block 3000, comprising four local predecoders, 3000A, 3000B, 3000C, 3000D and one extra, inactive or redundant predecoder 3000E. It is contemplated that, while four local predecoders and one extra predecoder are illustrated, more or less predecoders (for example five local predecoders and two extra predecoders, six local predecoders and one extra decoder, etc.) are contemplated. A plurality of predecoded lines are illustrated, which in one embodiment are paired together as inputs to one or more global x-decoders, forming the mapping from the row address inputs to the physical rows. In this embodiment, there are as many groups of predecoded lines as there are global inputs to the global decoder. For example, in one embodiment, there are two or three groups of precoded lines, although any number of predecoded line groups is contemplated.

In the illustrated embodiment, two predecoded line groups are illustrated, comprising higher address predecoded line group 3010 and lower address predecoded line group 3012. The lower address predecoded line group 3012 acts similar to the least significant bit of a counter. The least significant predecoded line from a higher address predecoded line group 3010 is paired with at least one predecoded line from a lower address predecoded line group 3012. More specifically, the least significant predecoded line from the higher address predecoded line group 3010 is paired with each and every predecoded line from a lower address precoded line group 3012. This means that the predecoded lines from the higher address predecoded line group map to a contiguous number of rows in the memory cells. In one embodiment, the predecoded lines from the higher address predecoded line group map to as many rows as the number of predecoded lines in the lower address predecoded line group.

In one embodiment of the present invention, each block is selected by at least one line (or by predecoding a group lines) in the higher address predecoded line group. A higher address predecoder line shifts only if the shift pointer points to the particular predecoder line or the previous line has shifted.

Figure 30:
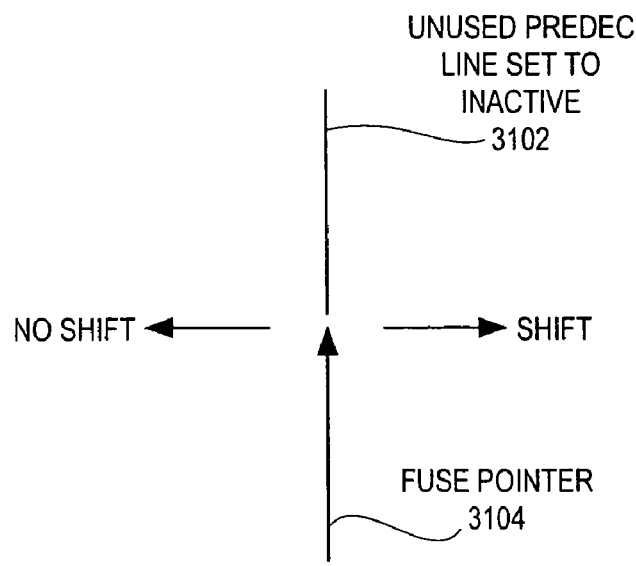
FIG. 30 illustrates an unused predecoded line set to inactive in accordance with one embodiment of the present invention.

FIG. 30 illustrates an unused predecoded line 3102 (similar to the predecoded lines in groups 3010 and 3012 provided previously) set to inactive in accordance with one embodiment of the present invention. This embodiment includes an associated fuse pointer 3104. As illustrated, the fuse pointer 3104 is adapted to move or shift in only one direction (the right for example), such that the predecoded line 3102 is inactive if the fuse pointer is not shifted. Please note that while the fuse pointer as illustrated is adapted to shift in only one direction, other embodiments are contemplated, including having the fuse pointer shift in two or more directions, shift up and down, etc.

Figure 31A:
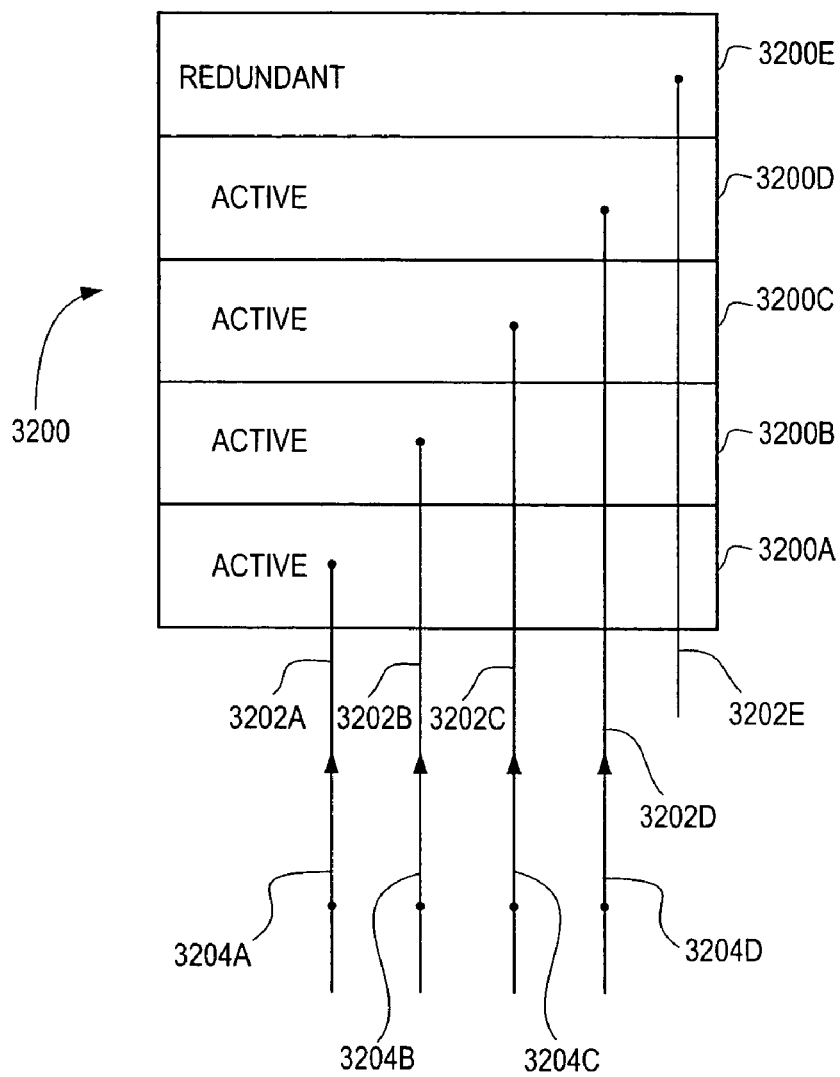
FIGS. 31A & 31B illustrate block diagrams of redundant local predecoder blocks, illustrating shifting predecoded lines in accordance with one embodiment of the present invention.
Figure 31B:
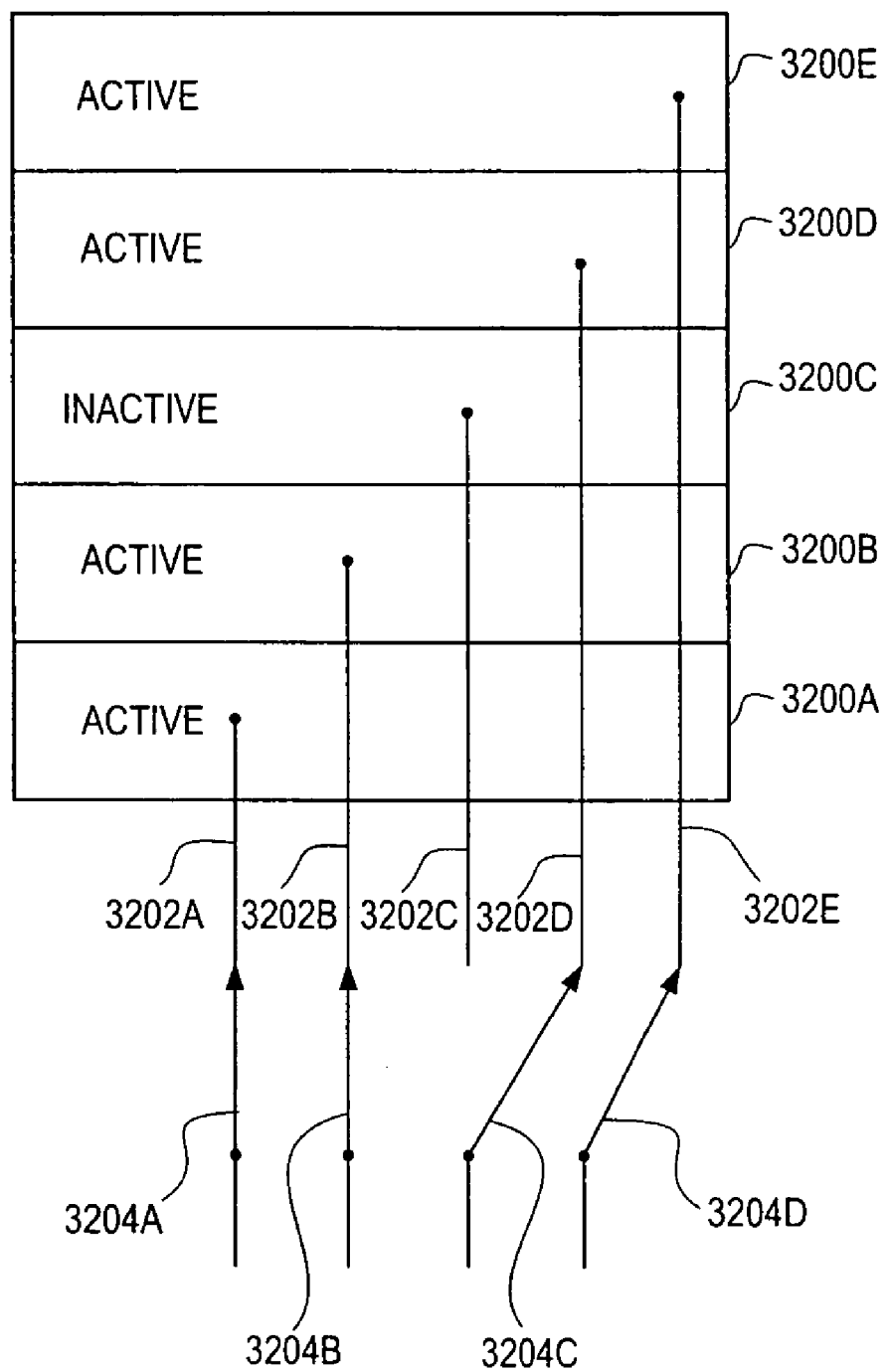

FIGS. 31A & 31B illustrate one embodiment of a local predecoder block 3200 similar to the predecoder 3000 in FIG. 29. In this embodiment, predecoder block 3200 comprises four local (active) predecoders 3200A, 3200B, 3200C, 3200D and one extra or redundant predecoder 3200E. A plurality of predecoded lines are illustrated, which in this embodiment, are again paired together as inputs to one or more global decoders, forming the mapping from the row address inputs to the physical rows.

In this embodiment, the illustrated predecoded lines comprise a plurality of predecoded lines 3202A, 3202B, 3202C and 3202D (similar to the unused predecoded line 3102 of FIG. 30), which are set too inactive (i.e., not shifted). In this embodiment, predecoded lines 3202A, 3202B, 3202C and 3202D communicate with or are coupled to local (active) predecoders 3200A, 3200B, 3200C and 3200D respectively. Predecoded line 3202E is coupled to the extra or redundant predecoder 3200E. Furthermore, as illustrated, a plurality of fuse pointers 3204A, 3204B, 3204C and 3204D are associated with predecoded lines 3202A, 3202B, 3202C and 3202D respectively, where each fuse pointer is adapted to shift in only one direction. While only four predecoded lines, four fuse pointers and five predecoders are illustrated, any number and arrangement of lines, pointers and predecoders are contemplated.

By employing redundancy-shifting techniques to the higher predecoded line group, the rows are shifted in and out of the accessible part of the address space. Enabling shifting the rows provides a repair mechanism where a defective bit may be shifted out to the unused part of the address space. FIG. 31B illustrates a defective predecoder (predecoder 3200C for example) that is shifted out, such that predecoder becomes inactive. In this embodiment, fuse pointer 3204C shifts from predecoder line 3202C to predecoder line 3202D. Fuse shifter 3204D shifts from predecoder line 3202D to predecoder line 3202E. In this manner, predecoder 3200C is shifted out (i.e., becomes inactive) and predecoder 3202E is shifted in (becomes active) in a domino fashion.

Figure 32:
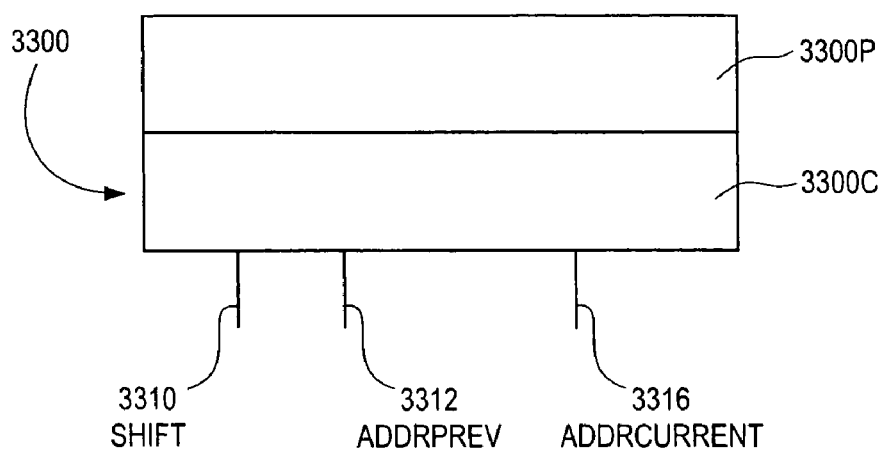
FIG. 32 illustrates a block diagram of a local predecoder block comprising two predecoders in accordance with one embodiment of the present invention.

In another embodiment of the present invention, the predecoded line shifting technique provided previously may be applied to the address lines generating block select signals in a hierarchically partitioned memory, as in DSPM dual port memory architecture for example. FIG. 32 illustrates a local predecoder block 3300 having two predecoders, 3300C and 3300P, and a shifting predecoder circuit (not shown) similar to that illustrated in FIG. 34. Additionally, the predecoder 3300 includes a plurality of lines including shift line 3310, an addrprev line 3312 and addcurrent line 3316. One of the precoders (predecoder 3300C for example) is adapted to fire for "current" address mapping and the other precoder (predecoder 3300P for example) is adapted to fire for "previous" address mapping, that is predecoder 3300P is adapted to fire for an address combination that activates the previous block or predecoder. The fuse shift signal activates the current predecoder 3300C when shifting is not present for the predecoder block, or the "previous" predecoder 3300P when shifting is present (i.e., when a predecoder is shifted out.

More specifically, if there is no signal on line 3310 (i.e., shift line 3310=0) there is no shifting. Thus addcurrent line 3316 is active and current predecoder 3300C is used. If there is a defective bit, (current predecoder 3300C for example), this defective predecoder is shifted out. Shift line 3310 is now active (i.e., shift=1) and the previous predecoder 3300P is activated using the addrprev line 3312 (i.e., the addresses from the previous predecoder or block). Again, in this embodiment, the red coders are shifted in a domino fashion.

Figure 33A:
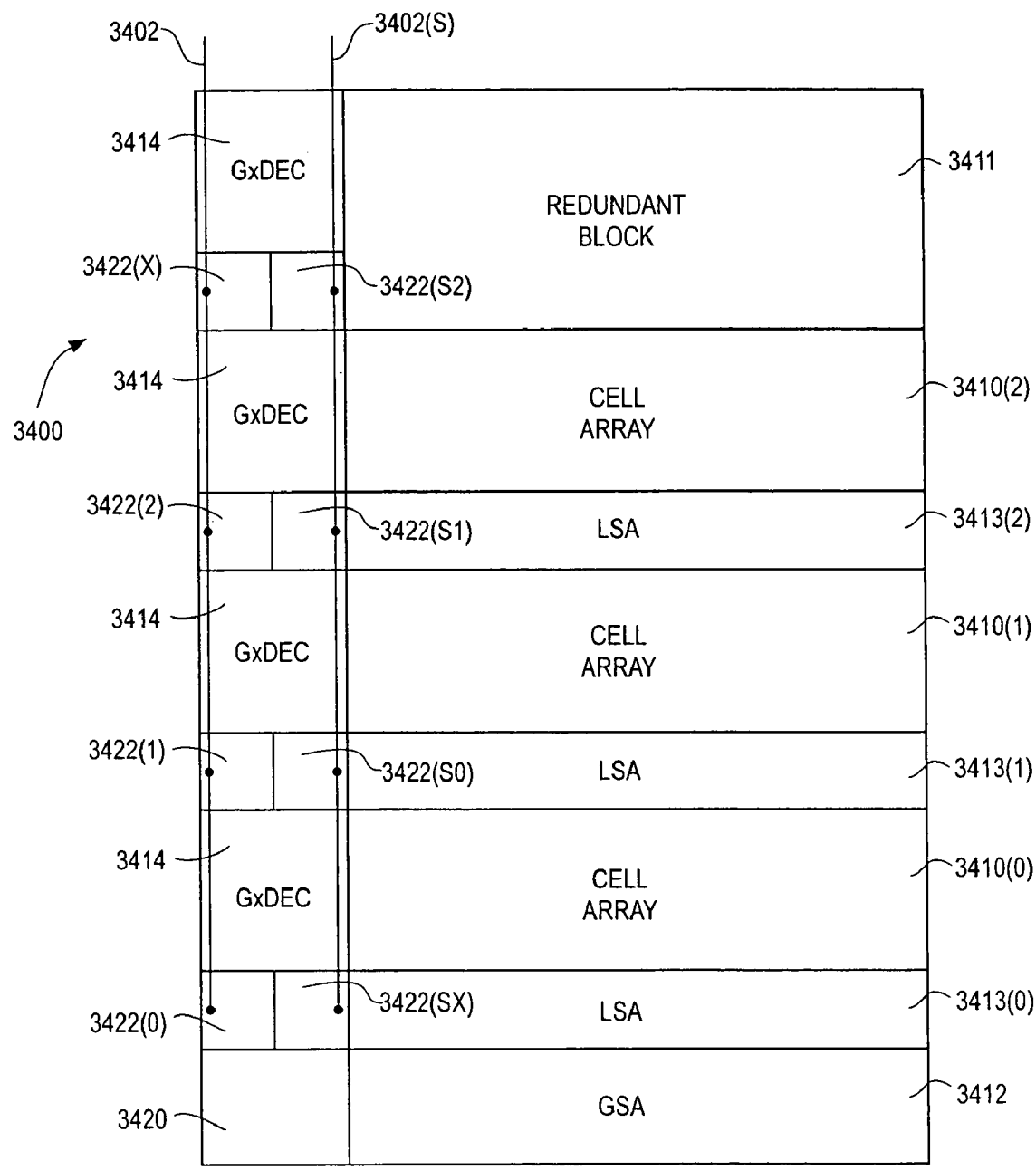
Figure 33C:
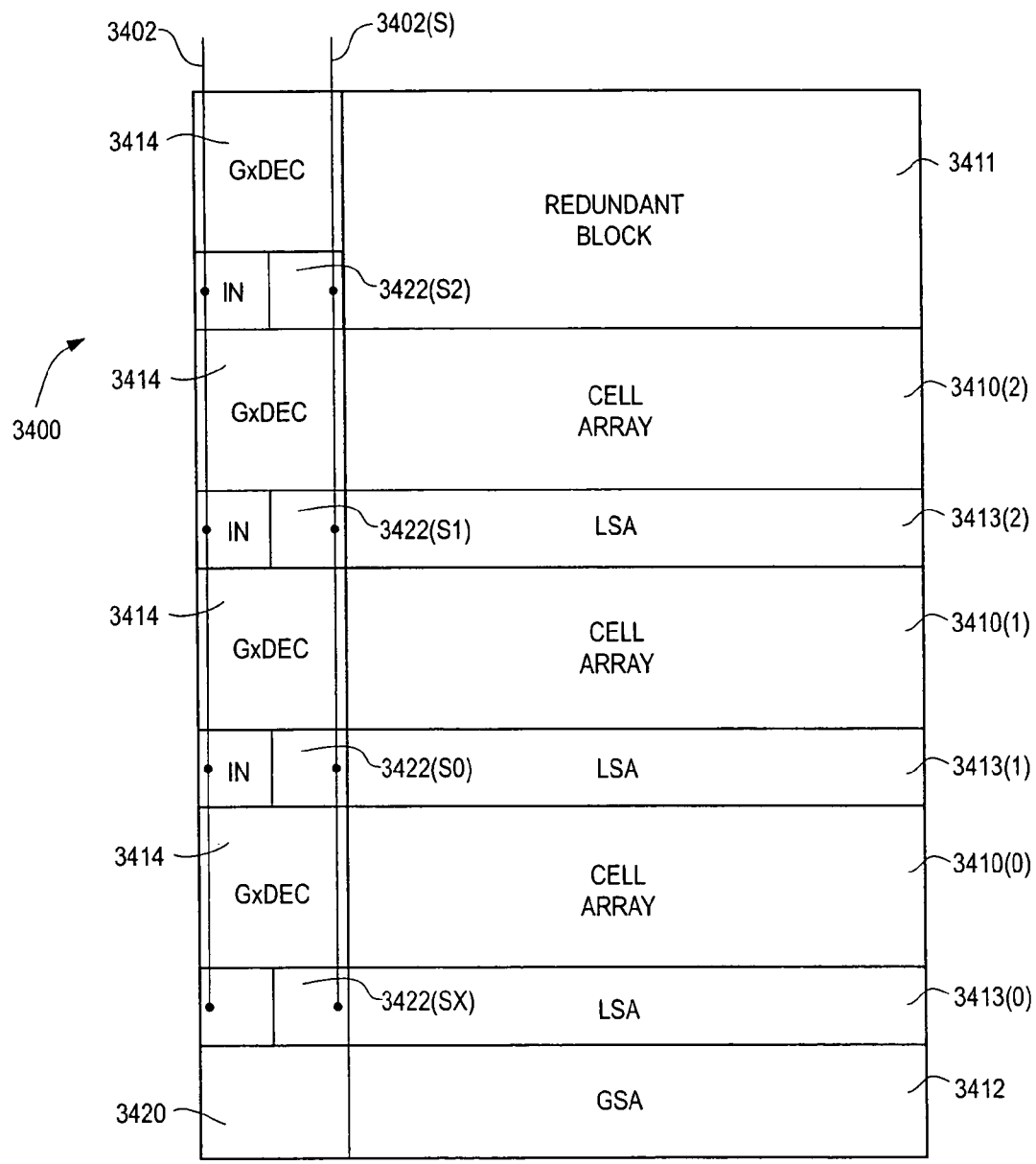

FIGS. 33A, 33B & 33C illustrate one embodiment of hierarchical memory architecture comprising a global predecoder 3420, a global sense amp 3412, a plurality of cell arrays (cell arrays 3410(0), 3410(1) and 3410(2) for example), and a plurality of LSA's (LSA's 3413(0), 3413(1) and 3413(2) for example).

In this embodiment, the global predecoder 3420 comprises a subset of predecoding circuits or predecoders. The global predecoder 3420 is placed at the intersection of the one or more global x-decoders 3414 and the GSA 3412. The global predecoder 3420, in one embodiment, includes the global predecoder circuitry, which forms part of a predecoding tree that doesn't vary much from memory to memory. In this embodiment, the predecoder distribution is optimized so that the allotted area for the memory module is mostly if not entirely filled.

The local predecoders, generally designated 3422 (comprising predecoders 3422(0), 3422(1), 3422(2), 3422(X), 3422(SX), 3422(S0), 3422(S1) and 3422(S2)) are distributed into each subblock at the intersection of the global x-decoder 3414 and the local sense amplifiers 3413 as illustrated. Predecoder line 3402 is illustrated coupled to predecoders 3422(0), 3422(1), 3422(2) and 3422(X), while predecoder line 3402(S) is illustrated coupled to predecoders 3422(SX), 3422(S0), 3422(S1) and 3422(S2). Predecoder line 3402 is active when there is no shifting, while predecoder line 3402(S) is active when shifted.

FIG. 33A further illustrates a redundant block 3411, which in this embodiment comprises a local decoder, a cell array and a local sense amplifier, where the redundant block communicates with at least one local predecoder. It is contemplated that, while only three cell arrays 3410, three LSAs 3413, three GxDEC's 3414, eight predecoders 3422 and one redundant block 3411 are illustrated, a different number or different combination of the cell arrays, LSAs, GxDECs, predecoders and redundant block are contemplated. Furthermore, this distributed predecoding scheme is self-scaling. As the number of subblocks increase, the needed predecoders are added. Bank decoding is similarly distributed across the global controller block.

In this embodiment, 3422(0), 3422(1) and 3422(2) (alternatively referred to as the "current" predecoders) represent the predecoders adapted to be fired or used for "current" address mapping, while predecoders 3422(S0), 3422(S1) and 3422(S2) (alternatively referred to as the "previous" predecoders) represent the predecoders adapted to be fired or used for "previous" address mapping. If there is a fault in any one of the predecoders, LSAs or cell arrays, the associated shift line activates such that predecoders 3422(0), 3422(1) and 3422(2) become inactive and predecoders 3422(S0), 3422(S1) and 3422(S2) become active. FIG. 33B illustrates no shifting (i.e., no fault), when predecoder line 3402, connected to predecoders 3422(0), 3422(1) and 3422 (2), is active (the inactive predecoders are designated "IN" in FIG. 33B). FIG. 33C illustrates a fault in the predecoders, LSAs or cell arrays (or some combination), when predecoder line 3402(S), connected to predecoders 3422(S0), 3422(S1) and 3422(S2), is active (Again the inactive predecoders are designated IN).

Figure 34:
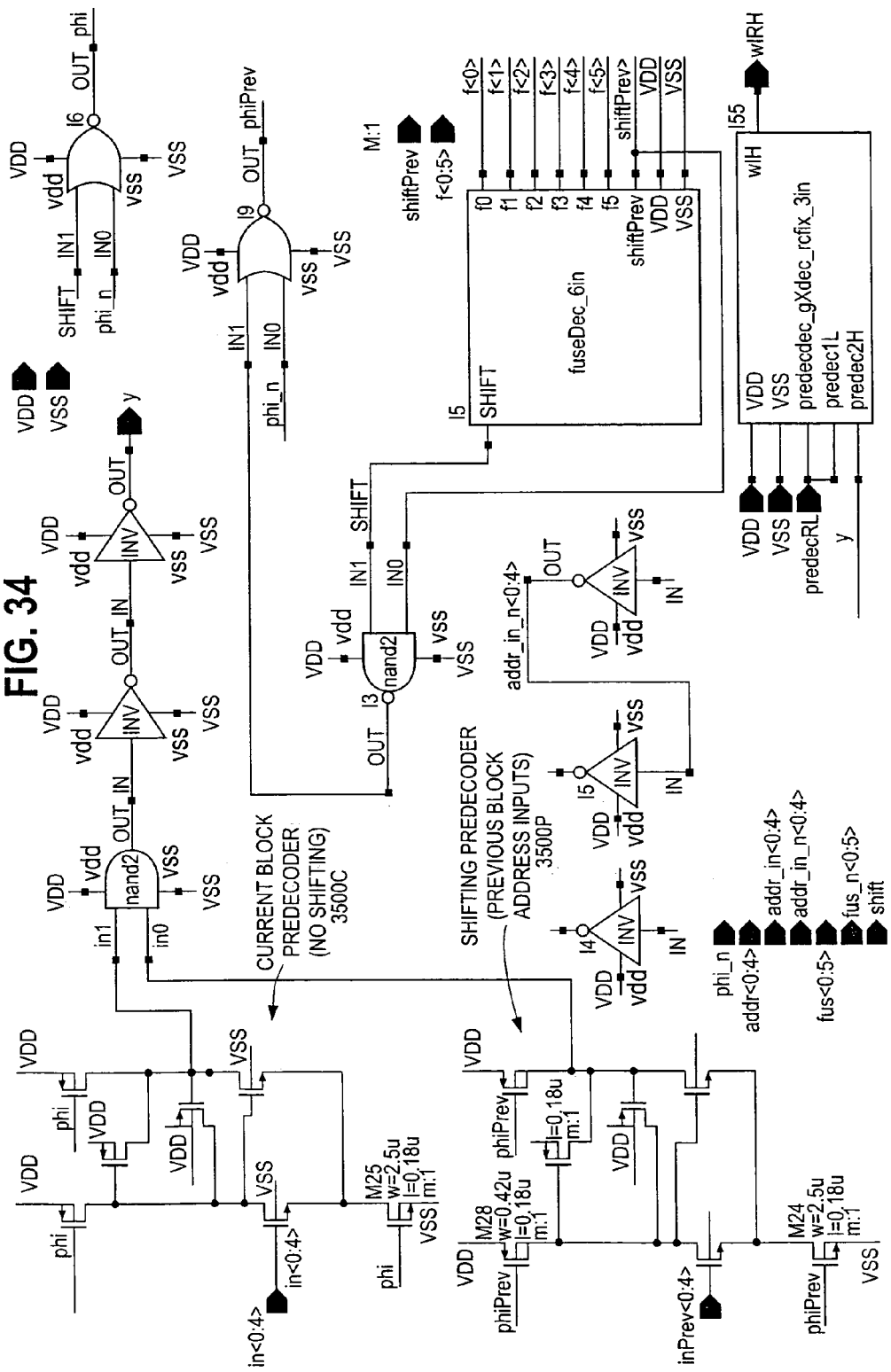
FIG. 34 illustrates a circuit diagram of a local predecoder block similar to that illustrated in FIG. 32 including a shifter predecoder circuit in accordance with one embodiment of the present invention.

FIG. 34 illustrates a circuit diagram of a local predecoder block similar to that discussed with respect to the embodiment illustrated in FIG. 32. However, it is contemplated that such shift circuit may be used with any of the embodiments provided previously. In the illustrated embodiment, the local predecoder block includes a shifting predecoder circuit for the current block predecoder (no shifting) 3500C and the shifting predecoder (previous block address inputs) 3500P in accordance with one embodiment of the present invention.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. A method of providing redundancy in a memory structure, comprising:
shifting out at least one first predecoder of a pluarality of first predecoders; and shifting in a second predecoder.

2. The method of claim 1, comprising shifting predecoded lines coupled to at least one of said first and second predecoders.

3. The method of claim 1, comprising using shifting circuitry coupled to at least one of said first and second predecoders.

4. The method of claim 1 comprising at least one higher address predecoded line coupled to at least said second predecoder.

5. The method of claim 4 comprising at least one lower address predecoded line coupled to at least said active predecoder and paired with at least one higher address predecoded line.

6. A method of providing redundancy in a hierarchical memory structure, comprising:
identifying at least one first predecoder of a plurality of first predecoders;
shifting out said identified at least one first predecoder; and
shifting in at least one second predecoder.

7. The method of claim 6 comprising shifting predecoded lines coupled to at least one of said first and second predecoders.

8. The method of claim 6 comprising using shifting circuitry coupled to at least one of said first and second predecoders.

9. The method of claim 6 comprising at least one higher address predecoded line coupled to at least one of said first and second predecoders.

10. The method of claim 9 comprising at least one lower address predecoded line coupled to at least one of said first and second predecoders and paired with said at least one higher address predecoded line.

11. The method of claim 6 comprising at least one of said first predecoders adapted to fire for current address mapping.

12. The method of claim 6 comprising said at least one second predecoder adapted to fire for previous address mapping.

13. The method of claim 6 comprising shifting in said second predecoder using shift circuitry.

14. A method of providing redundancy in a hierarchical memory structure, comprising:
identifying at least one predecoder as a predecoder for shifting out; and
shifting out said identified at least one predecoder.

15. The method of claim 14 comprising shifting in at least one other predecoder.

16. The method of claim 15 comprising shifting predecoded lines coupled to at least one of said at least one predecoder and said at least one other predecoder.

17. The method of claim 15 comprising using shifting circuitry coupled to at least one of said at least one predecoder and said at least one other predecoder.

18. The method of claim 15 comprising at least one higher address predecoded line coupled to at least one of said at least one predecoder and said at least one other predecoder.

19. The method of claim 18 comprising at least one lower address predecoded line coupled to at least one of said at least one predecoder and said at least one other predecoder and paired with said at least one higher address predecoded line.

20. The method of claim 14 comprising said at least one predecoder adapted to fire for current address mapping.

21. The method of claim 14 comprising said at least one predecoder adapted to fire for previous address mapping.

22. The method of claim 15 comprising shifting in said at least one other predecoder using shift circuitry.

23. A method of providing redundancy in a memory structure, comprising:
identifying at least one predecoder as a predecoder for shifting out; and
shifting in at least one other predecoder.

24. The method of claim 23, comprising shifting predecoded lines coupled to at least one of said at least one predecoder and said at least one other predecoder.

25. The method of claim 23, comprising using shift circuitry coupled to at least one of said at least one predecoder and said at least one other predecoder.

26. The method of claim 23 comprising at least one higher address predecoded line coupled to at least one of said at least one predecoder and said at least one other predecoder.

27. The method of claim 26 comprising at least one lower address predecoded line coupled to at least one of said at least one predecoder and said at least one other predecoder and paired with said at least one higher address predecoded line.

28. The method of claim 23 comprising said at least one predecoder adapted to fire for current address mapping.

29. The method of claim 23 comprising said at least one predecoder adapted to fire for previous address mapping.

30. The method of claim 23 comprising shifting in said at least one other predecoder using shift circuitry.

* * * * *